(12) United States Patent
Matsumoto et al.

(10) Patent No.: US 7,253,436 B2
(45) Date of Patent: Aug. 7, 2007

(54) RESISTANCE DEFECT ASSESSMENT DEVICE, RESISTANCE DEFECT ASSESSMENT METHOD, AND METHOD FOR MANUFACTURING RESISTANCE DEFECT ASSESSMENT DEVICE

(75) Inventors: Michikazu Matsumoto, Kyoto (JP);
Yasutoshi Okuno, Kyoto (JP);
Katsuyoshi Joukyu, Toyama (JP);
Tetsuya Matsutani, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 438 days.

(21) Appl. No.: 10/895,833

(22) Filed: Jul. 22, 2004

(65) Prior Publication Data
US 2005/0017746 A1    Jan. 27, 2005

(30) Foreign Application Priority Data
Jul. 25, 2003 (JP) ............................ 2003-279976
Sep. 9, 2003 (JP) ............................ 2003-316363

(51) Int. Cl.
*H01L 23/58* (2006.01)
(52) U.S. Cl. .......... 257/48; 257/E21.521; 257/E21.524
(58) Field of Classification Search .................. 257/48
See application file for complete search history.

(56) References Cited

U.S. PATENT DOCUMENTS 5,051,690 A * 9/1991 Maly et al. ................. 324/537
7,024,642 B2 * 4/2006 Hess et al. ..................... 716/4

2005/0074908 A1 * 4/2005 Ciplickas et al. ............. 438/14

FOREIGN PATENT DOCUMENTS

| JP | 56-083955 | 7/1981 |
| JP | 2-051245 | 2/1990 |
| JP | 4-137645 | 5/1992 |
| JP | 5-055226 | 3/1993 |
| JP | 2002-110753 A | 4/2002 |
| JP | 2002-176083 A | 6/2002 |
| JP | 2003-197752 A | 7/2003 |

OTHER PUBLICATIONS

Charles Weber, "Standard Defect Monitor", 1988 IEEE Proceedings on Microelectronic Test Structures, vol. 1, No. 1, Feb. 1988, pp. 114-119.
Andrew Grenville, et al., "Electrical Critical Dimension Metrology for 100-nm Linewidths and Below", in Optical Microlithography XIII, Proceedings of SPIE, vol. 4000, 2000, pp. 452-459.
Takeshi Hamamoto, et al., "Measurement of Contact Resistance Distribution Using a 4k-Contacts Array", IEEE Transactions on Semiconductor Manufacturing, vol. 9, No. 1, Feb. 1996, pp. 9-14.

* cited by examiner

*Primary Examiner*—Evan Pert
(74) *Attorney, Agent, or Firm*—McDermott Will & Emery LLP

(57) ABSTRACT

A resistance defect assessment device provided on a wafer for assessing a resistance variation defect in a component of an integrated circuit device, the resistance defect assessment device including test patterns capable of measuring a resistance variation component to be the resistance variation defect in each chip area or each shot area of the wafer, wherein the number of test patterns included in one chip area or one shot area is set so that it is possible to estimate the yield of the integrated circuit device.

21 Claims, 25 Drawing Sheets
(3 of 25 Drawing Sheet(s) Filed in Color)

FIG. 2A
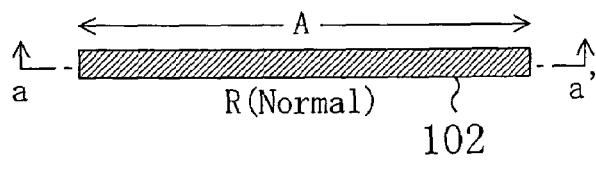
FIG. 2B
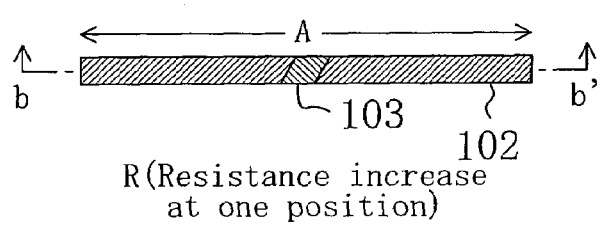
FIG. 2C
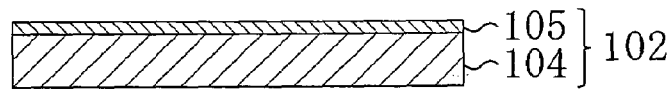
FIG. 2D
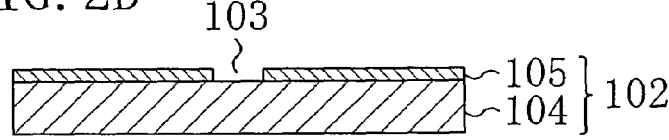
FIG. 2E
| Length of test pattern ($\mu$m) | Resistance value RA of normal gate wiring (k$\Omega$) | Resistance value RB of gate wiring with defect at one position (k$\Omega$) |
|---|---|---|
| 50 | 3 | 5 |
| 100 | 6 | 8 |
| 280 | 16 | 18 |
| 500 | 29 | 31 |
| 1000 | 57 | 59 |
| 1750 | 100 | 102 |
| 5000 | 286 | 288 |
| 10000 | 571 | 573 |
| 50000 | 2857 | 2859 |
| 100000 | 5714 | 5716 |
| 500000 | 28571 | 28573 |
| 1000000 | 57143 | 57145 |
FIG. 2F
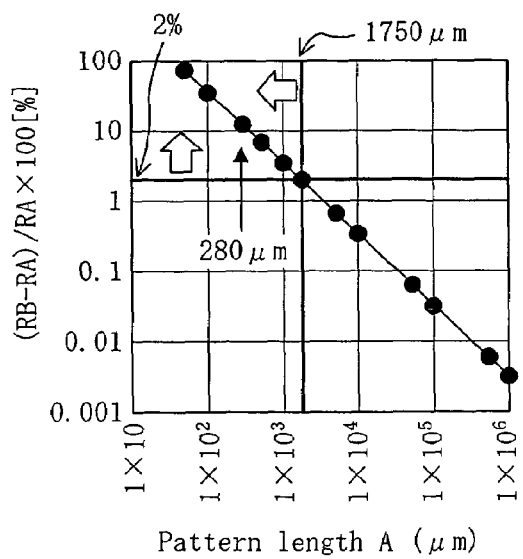

All-pattern yield
$$Y = \text{EXP}(-\lambda \times N)$$

$\lambda$ : Defect occurrence rate of resistance defect test pattern (ppm/280 $\mu$m)

N: Number of resistance defect test patterns = L/A

L: Total line length

A: Length of resistance defect test pattern

[Distribution of electrically-converted dimension (ECD) across wafer surface/shot area]

$\begin{bmatrix} 3\sigma = 5.89\% \\ (\text{Max}-\text{Min})/2\text{Ave} = 4.45\% \end{bmatrix}$ $\begin{bmatrix} 3\sigma = 6.10\% \\ (\text{Max}-\text{Min})/2\text{Ave} = 4.88\% \end{bmatrix}$

[Actual data]

[With dimension adjustment]

[With sheet resistance adjustment]

[With both adjustments]

[Distribution of unadjusted resistance value RR of resistance defect test pattern]

(Notch)

[Distribution of dimension-adjusted resistance value RR' (1) of resistance defect test pattern]

Soft-open defect (Notch)

[Distribution of sheet resistance-adjusted resistance value RR' (2) of resistance defect test pattern]

(Notch)

[Distribution of resistance value RR' (3) of resistance defect test pattern after both adjustments]

(Notch)

[Contact chain resistor pattern including n contacts]

$rc = Rr / m$    $m$ : Contact count $$\text{Area} = \pi d^2 = \rho c / rc \qquad d = \sqrt{\frac{\rho c}{\pi \times rc}}$$

RESISTANCE DEFECT ASSESSMENT DEVICE, RESISTANCE DEFECT ASSESSMENT METHOD, AND METHOD FOR MANUFACTURING RESISTANCE DEFECT ASSESSMENT DEVICE

BACKGROUND OF THE INVENTION

1. Field of the Invention

The present invention relates to a resistance defect assessment device, a resistance defect assessment method and a method for manufacturing a resistance defect assessment device, and more particularly to a monitoring device for detecting a resistance increase defect in a resistive element or a contact provided in a semiconductor integrated circuit device during the manufacture thereof, a method for assessing a resistance increase defect using such a monitoring device, and a method for manufacturing such a monitoring device.

2. Description of the Background Art

In recent years, the feature size of a semiconductor integrated circuit device has been reduced, and the degree of integration and the processing speed thereof have been increased. Moreover, the size (diameter) of a wafer used for manufacturing the same has been increased.

As the feature size of a semiconductor integrated circuit device is decreased and the degree of integration thereof is increased, the production yield thereof is decreased more significantly by a line-break defect or an inter-line shorting defect in a gate electrode wiring, a metal wiring, an impurity layer to be a source region and a drain region (hereinafter referred to as a "source/drain impurity layer"), a contact connecting a lower wiring layer with an upper wiring layer, or the like. Moreover, due to the increase in the degree of integration and the processing speed thereof, characteristics variations among transistors or resistive elements (e.g., gate electrode wirings, metal wirings or a source/drain impurity layer) provided therein also present a significant cause of a decrease in the production yield. Thus, in order to improve the production yield of a semiconductor integrated circuit device while realizing a high processing speed thereof, it may be necessary to suppress, particularly, the variations among the resistors (resistive elements), including the variations in the transistor characteristics.

Conventionally, complete line-break defects and inter-line shorting defects have been addressed as the primary defects in the gate electrode wiring of a transistor, the metal wiring on a transistor, etc. Moreover, the amount of line-break defect or shorting defect (the number of defects) has been measured in order to estimate the yield of a semiconductor integrated circuit device.

In a conventional method for assessing line-break defects and shorting defects, long wirings whose length is on the order of 10 cm to 1 m are routed to form a comb/serp pattern so as to assess the yield of the object layer (wiring layer) (see, for example, Charles Weber, "Standard Defect Monitor", 1988 IEEE Proceedings on Microelectronic Test Structures, Vol. 1, No. 1, February 1988, pp. 114-119 (hereinafter referred to as "Reference 1")).

FIG. 25 shows an example of a conventional comb/serp line pattern. Referring to FIG. 25, in the yield assessment method of Reference 1, the resistance between the comb pads is measured to detect a line-break defect, and the leak current between a comb pad and the serp pad is measured to detect a shorting defect. Particularly for the line-break defect, a very long line is virtually routed so as to allow for the yield assessment. Therefore, it only detects a complete line-break defect but does not detect a resistance increase (resistance variation) occurring in a portion of (at a certain point along) the line.

In another method proposed in the art for assessing a resistor variation, the dimension of the formed pattern is electrically measured so as to assess the influence of a dimensional variation in the gate electrode wiring, or the like (see, for example, Andrew Grenville, et al., "Electrical Critical Dimension Metrology for 100-nm Linewidths and Below", In Optical Microlithography XIII, Proceedings of SPIE, Vol. 4000, 2000, pp. 452-459 (hereinafter referred to as "Reference 2")). Such a dimensional variation leads to a resistor variation or a transistor characteristics variation, thus decreasing the yield. Therefore, assessment of the influence of a dimensional variation is also important.

A defect may occur even in a case where a gate electrode wiring, a metal wiring, a contact connecting an impurity layer with a wiring layer, or the like, is not completely broken, i.e., where a portion of such a component has an increased resistance (the resistance of the component is higher at a certain position than at other positions) even though the electrical connection thereof is maintained within the component. Such a defect may also cause a decrease in the yield or the reliability. The term "resistance increase defect (resistance variation defect)" or "soft-open defect" as used herein refers to such a defect where a component (a resistive element, a contact, etc.) has a locally-increased resistance (thereby also increasing the overall resistance of the resistive element) even though the component is not completely broken and the electrical connection therein is maintained. The term "line-break defect" or "hard-open defect" as used herein refers to a defect where a resistive element or a contact is completely broken.

Along with the recent reduction in the feature size of a semiconductor integrated circuit device and the increase in the degree of integration and the processing speed thereof, the delay time margin has been decreased, whereby even a resistance increase defect occurring at one position along a resistive element such as a line can cause a decrease in the yield and the reliability.

In the formation of a gate electrode wiring, for example, a silicide layer is typically formed on a polysilicon electrode using a salicide process. Even if the silicide layer on the polysilicon electrode is broken, the overall electrical connection of the gate electrode wiring is maintained by the lower polysilicon electrode. However, a resistance increase defect occurs at the position where the silicide layer is broken, thus causing a decrease in the yield and the reliability.

Similarly, a local resistance increase defect (soft-open defect) may occur at a certain position along a lower metal wiring, or in a contact connecting a source/drain impurity layer of a transistor, or the like, with an upper wiring layer. Thus, a variation (i.e., an increase) in the contact resistance, which is one form of a resistor variation, is a significant cause of a decrease in the yield and the reliability.

Recently, a semiconductor integrated circuit device uses a very large number of contacts therein. For example, in a 0.13 µm-rule chip having an area of about 40 mm$^2$, the number of contacts used for the transistor-wiring layer connection is as large as about 20,000,000. Therefore, in a contact yield assessment using a monitoring device (assessment device), the assessment needs to be done for about 10,000,000 contacts.

Conventionally, the contact yield assessment has been done to detect complete line-break defects (hard-open defects). Specifically, for such a yield assessment, a large contact chain resistor pattern (including about 100,000 contacts) is provided to assess line-break defects (hard-open defects) in the contact chain.

FIG. 26A and FIG. 26B illustrate an example of a conventional contact chain resistor pattern, wherein FIG. 26A is a plan view and FIG. 26B is a cross-sectional view taken along line a-a' of FIG. 26A.

Referring to FIG. 26A and FIG. 26B, a plurality of lower-layer wirings 3 formed from a polysilicon layer or an amorphous silicon layer are provided on a silicon substrate 1 with an insulating film 2 therebetween. An interlayer insulating film 4 is formed over the insulating film 2 and the lower-layer wirings 3, and a plurality of contact electrodes (contact holes) 5 connected to the lower-layer wirings 3 are formed in the interlayer insulating film 4. Moreover, a plurality of upper-layer metal wirings 6 are formed on the interlayer insulating film 4 so as to be connected to the contact electrodes 5. The lower-layer wirings 3 and the upper-layer metal wirings 6 are connected to each other via the contact electrodes 5 therebetween, thus forming a contact chain resistor pattern as illustrated in FIG. 26A. Note that the silicon substrate 1, the insulating film 2 and the interlayer insulating film 4 are not shown in FIG. 26A for the sake of simplicity. Alternatively, instead of providing the insulating film 2 and the lower-layer wiring 3, a transistor source/drain impurity layer may be formed on the surface of the silicon substrate 1 with contact electrodes being formed so as to connect the source/drain impurity layer with the upper-layer wirings.

The contact chain resistor pattern illustrated in FIG. 26A and FIG. 26B includes about 100,000 contacts. If a contact defect to be assessed is a complete line break (hard-open defect), it can be detected by detecting the contact chain resistance being infinitely high.

However, if only one contact becomes defective with the resistance thereof being increased to 10 times the normal value thereof, for example, the resulting variation in the overall resistance of the entire contact chain resistor pattern will be only about 1/10000 of the resistance increase defect. Therefore, it is difficult with an ordinary measurement method to detect such a resistance increase defect occurring in a single contact in the contact chain.

To address the problem, it has been proposed in the art to measure the resistance of each individual contact by providing a cross-contact array of 256 rows by 16 columns (a total of 4096 contacts) and using an 8-bit binary counter and a 256-bit decoder (see, for example, Takeshi Hamamoto, et al., "Measurement of Contact Resistance Distribution Using a 4k-Contacts Array", IEEE Transactions on Semiconductor Manufacturing, Vol. 9, No. 1, February 1996, pp. 9-14 (hereinafter referred to as "Reference 3")). With this method, it is possible to detect a resistance abnormality of a small resistance variation and thus to assess the yield.

However, the assessment of the resistance increase defects (soft-open defects) as described above is more difficult than the assessment of complete line-break defects (hard-open defects). For example, a line-break defect results in a very high or infinitely high electrical resistance, whereby it is possible to perform the defect assessment and the defect density assessment by virtually routing a very long line as described in Reference 1. However, it is difficult to detect resistance increase defects (soft-open defects) even by performing the defect assessment by virtually routing a very long line. This is because a resistance increase at the position of a soft-open defect will be inconspicuous in the overall resistance of the long line, whereby it is not possible to detect the resistance increase.

The methods described in Reference 2 and Reference 3 are disadvantageous in that they result in a very long process TAT (turn-around time) for providing the contact array, or the like. With these conventional techniques, the process TAT for providing the assessment device will be as long as that for making a semiconductor integrated circuit device, whereby the feedback of the assessment results for improving the process will take a very long time.

SUMMARY OF THE INVENTION

It is therefore an object of the present invention to provide a resistance defect assessment device (monitoring device) capable of easily detecting a resistance increase defect (soft-open defect) locally occurring at one position along a gate electrode wiring, a metal wiring, or the like, or in at least one of a large number of contacts connecting an impurity layer, etc., with a wiring layer. It is also an object of the present invention to provide a soft-open defect assessment method using such a monitoring device, and a method for manufacturing such a monitoring device.

To achieve the objects set forth above, the present inventors arrived at a method in which the length of a resistance defect test pattern and the contact count of (i.e., the number of contacts in) a contact chain resistor pattern are reduced to a degree such that it is possible to detect a resistance variation component (resistance increase component) occurring at one position along a resistive element or in a single contact, thus allowing for the detection of a soft-open defect in the resistive element or the contact, and in which the resistance measurement and the yield assessment are performed by forming, on a wafer, a large number of resistance defect test patterns or contact chain resistor patterns so that it is possible to assess the yield of an integrated circuit device.

Specifically, a first resistance defect assessment device of the present invention is a resistance defect assessment device provided on a wafer for assessing a resistance variation defect in a component of an integrated circuit device, the resistance defect assessment device including a number of test patterns capable of measuring a resistance variation component to be the resistance variation defect in each chip area or each shot area of the wafer, wherein the number of test patterns included in one chip area or one shot area is set so that it is possible to estimate a yield of the integrated circuit device.

A second resistance defect assessment device of the present invention is a resistance defect assessment device provided on a wafer for assessing a resistance variation defect in a resistive element provided in a semiconductor integrated circuit device, the resistance defect assessment device including a resistance defect test pattern having such a length that a resistance variation component to be the resistance variation defect can be measured in each chip area or each shot area of the wafer, wherein the number of resistance defect test patterns included in one chip area or one shot area is in a range from B/A×1/100 to B/A×10, where A is the length of the resistance defect test pattern, and B is a total length of the resistive elements provided in the semiconductor integrated circuit device.

A third resistance defect assessment device of the present invention is a resistance defect assessment device provided on a wafer for assessing a resistance variation defect in a resistive element provided in a semiconductor integrated circuit device, the resistance defect assessment device including, in each of a plurality of blocks into which each chip area or each shot area of the wafer is divided, a resistance defect test pattern having such a length that a resistance variation component to be the resistance variation defect can be measured and a calibration pattern used for calibrating at least one of a dimension, a thickness and a resistivity of the resistance defect test pattern, which dictate a resistance value of the resistance defect test pattern, wherein the blocks are regularly arranged in the wafer surface and in each chip area or each shot area. Note that it is preferred that the calibration pattern in each block is provided in the vicinity of the resistance defect test pattern, e.g., within 500 μm of the resistance defect test pattern.

In the third resistance defect assessment device, it is preferred that the number of resistance defect test patterns included in one chip area or one shot area is in a range from B/A×1/100 to B/A×10, where A is the length of the resistance defect test pattern, and B is a total length of the resistive elements provided in the semiconductor integrated circuit device.

In the third resistance defect assessment device, it is preferred that probing pads are provided separately for the resistance defect test pattern and for the calibration pattern.

In the second or third resistance defect assessment device, it is preferred that the length A of the resistance defect test pattern is set so that a resistance variation component, which is a difference between a first resistance value of a resistance defect test pattern where there is a resistance variation defect at at least one position and a second resistance value of another resistance defect test pattern where there is no resistance variation defect, is 2% or more with respect to the second resistance value.

Note that in the second or third resistance defect assessment device, it is preferred that the magnitude (proportion) of the resistance variation component is a factor of 1 (100%) or less. Since a test pattern is typically assessed to be good if the resistance variation thereof is within ±10% of the target value, it is only required that a resistance variation component that is 100% or less can be detected. If a complete line break occurs, the magnitude of the resistance variation component to be detected is infinite (∞%), whereby the resistance defect assessment can be performed by using a comb/serp line pattern, which is a conventional long line pattern. Therefore, in order to distinguish the resistance defect assessment of the present invention from that performed by using such a conventional long line pattern, the magnitude (proportion) of the resistance variation component may be a factor of 100 (10000%) or less in the second or third resistance defect assessment device.

In the second or third resistance defect assessment device, the resistive element may be a MOS transistor assembly, a bipolar transistor assembly, a pn-junction diode, a gate electrode wiring or a source/drain impurity layer of a MOS transistor, a metal wiring, a contact connecting an impurity layer with a wiring layer, or a via connecting wiring layers with each other.

A fourth resistance defect assessment device of the present invention is a resistance defect assessment device provided on a wafer for assessing a resistance variation defect in a resistive element made of a silicon-containing layer and a silicide layer formed on the silicon-containing layer, the resistive element being at least one of a gate electrode wiring and a source/drain impurity layer of a MOS transistor provided in a semiconductor integrated circuit device, the resistance defect assessment device including, in each of a plurality of blocks into which each chip area or each shot area of the wafer is divided, a resistance defect test pattern having such a length that a resistance variation component to be the resistance variation defect due to a line break in the silicide layer can be measured and being made of the silicon-containing layer and the silicide layer having the same width as that of the resistive element, and a first calibration pattern having the same length as that of the resistance defect test pattern and being made of the silicon-containing layer having the same width as that of the resistive element, wherein the blocks are regularly arranged in the wafer surface and in each chip area or each shot area.

A fifth resistance defect assessment device of the present invention is a resistance defect assessment device provided on a wafer for assessing a resistance variation defect in a resistive element made of a silicon-containing layer and a silicide layer formed on the silicon-containing layer, the resistive element being at least one of a gate electrode wiring and a source/drain impurity layer of a MOS transistor provided in a semiconductor integrated circuit device, the resistance defect assessment device including, in each of a plurality of blocks into which each chip area or each shot area of the wafer is divided, a resistance defect test pattern having such a length that a resistance variation component to be the resistance variation defect due to a line break in the silicide layer can be measured and being made of the silicon-containing layer and the silicide layer having the same width as that of the resistive element, and a second calibration pattern having the same length as that of the resistance defect test pattern and being made of the silicon-containing layer having a width at least five times as large as that of the resistive element, wherein the blocks are regularly arranged in the wafer surface and in each chip area or each shot area.

A sixth resistance defect assessment device of the present invention is a resistance defect assessment device provided on a wafer for assessing a resistance variation defect in a resistive element made of a silicon-containing layer and a silicide layer formed on the silicon-containing layer, the resistive element being at least one of a gate electrode wiring and a source/drain impurity layer of a MOS transistor provided in a semiconductor integrated circuit device, the resistance defect assessment device including, in each of a plurality of blocks into which each chip area or each shot area of the wafer is divided, a resistance defect test pattern having such a length that a resistance variation component to be the resistance variation defect due to a line break in the silicide layer can be measured and being made of the silicon-containing layer and the silicide layer having the same width as that of the resistive element, and a third calibration pattern having the same length as that of the resistance defect test pattern and being made of the silicon-containing layer and the silicide layer having a width at least five times as large as that of the resistive element, wherein the blocks are regularly arranged in the wafer surface and in each chip area or each shot area.

A seventh resistance defect assessment device of the present invention is a resistance defect assessment device provided on a wafer for assessing a resistance variation defect in a resistive element made of a silicon-containing layer and a silicide layer formed on the silicon-containing layer, the resistive element being at least one of a gate electrode wiring and a source/drain impurity layer of a MOS transistor provided in a semiconductor integrated circuit device, the resistance defect assessment device including, in each of a plurality of blocks into which each chip area or each shot area of the wafer is divided, a resistance defect test pattern having such a length that a resistance variation component to be the resistance variation defect due to a line break in the silicide layer can be measured and being made of the silicon-containing layer and the silicide layer having the same width as that of the resistive element, a first calibration pattern having the same length as that of the resistance defect test pattern and being made of the silicon-containing layer having the same width as that of the resistive element, and a second calibration pattern having the same length as that of the resistance defect test pattern and being made of the silicon-containing layer having a width at least five times as large as that of the resistive element, wherein the blocks are regularly arranged in the wafer surface and in each chip area or each shot area.

The seventh resistance defect assessment device may further include, in each block, a plurality of additional resistance defect test patterns having the same length as that of the resistance defect test pattern and being made of the silicon-containing layer and the silicide layer having two or more widths different from that of the resistance defect test pattern, and a plurality of additional first calibration patterns having the same length as that of the first calibration pattern and being made of the silicon-containing layer having two or more widths different from that of the first calibration pattern.

The seventh resistance defect assessment device may further include, in each block, a third calibration pattern having the same length as that of the resistance defect test pattern and being made of the silicon-containing layer and the silicide layer having a width at least five times as large as that of the resistive element.

An eighth resistance defect assessment device of the present invention is a resistance defect assessment device provided on a wafer for assessing a resistance variation defect in a resistive element made of a silicon-containing layer and a silicide layer formed on the silicon-containing layer, the resistive element being at least one of a gate electrode wiring and a source/drain impurity layer of a MOS transistor provided in a semiconductor integrated circuit device, the resistance defect assessment device including, in each of a plurality of blocks into which each chip area or each shot area of the wafer is divided, a resistance defect test pattern having such a length that a resistance variation component to be the resistance variation defect due to a line break in the silicide layer can be measured and being made of the silicon-containing layer and the silicide layer having the same width as that of the resistive element, a first calibration pattern having the same length as that of the resistance defect test pattern and being made of the silicon-containing layer having the same width as that of the resistive element, and a third calibration pattern having the same length as that of the resistance defect test pattern and being made of the silicon-containing layer and the silicide layer having a width at least five times as large as that of the resistive element, wherein the blocks are regularly arranged in the wafer surface and in each chip area or each shot area.

In any of the fourth to eighth resistance defect assessment devices, it is preferred that the length A of the resistance defect test pattern is set so that a resistance variation component, which is a difference between a first resistance value of a resistance defect test pattern where there is a resistance variation defect at at least one position and a second resistance value of another resistance defect test pattern where there is no resistance variation defect, is 2% or more with respect to the second resistance value; and the number of resistance defect test patterns included in one chip area or one shot area is in a range from B/A×1/10 to B/A×10, where B is a total length of the resistive elements provided in the semiconductor integrated circuit device.

Note that in any of the fourth to eighth resistance defect assessment devices, it is preferred that the magnitude (pro-portion) of the resistance variation component is a factor of 1 (100%) or less. Since a test pattern is typically assessed to be good if the resistance variation thereof is within ±10% of the target value, it is only required that a resistance variation component that is 100% or less can be detected. If a complete line break occurs, the magnitude of the resistance variation component to be detected is infinite (∞%), whereby the resistance defect assessment can be performed by using a comb/serp line pattern, which is a conventional long line pattern. Therefore, in order to distinguish the resistance defect assessment of the present invention from that performed by using such a conventional long line pattern, the magnitude (proportion) of the resistance variation component may be a factor of 100 (10000%) or less in any of the fourth to eighth resistance defect assessment devices.

In the fourth to eighth resistance defect assessment devices, it is preferred that the calibration pattern in each block is provided in the vicinity of the resistance defect test pattern, e.g., within 500 μm of the resistance defect test pattern.

A first resistance defect assessment method of the present invention is a resistance defect assessment method for assessing a resistance variation defect in a resistive element being at least one of a gate electrode wiring and a source/drain impurity layer of a MOS transistor provided in a semiconductor integrated circuit device and being made of a silicon-containing layer and a silicide layer formed on the silicon-containing layer, the method including: a first step of using the seventh resistance defect assessment device of the present invention to measure a resistance value of each of the resistance defect test pattern, the first calibration pattern and the second calibration pattern in each block at a plurality of positions in the wafer surface and in each chip area or each shot area; a second step of calculating an electrically-converted dimension (ECD) of the resistance defect test pattern in each block by the following expression:

$$ECD = DR \times R2/R1$$

where DR is a design value of a width of the second calibration pattern, R1 is the resistance value of the first calibration pattern measured in the first step, and R2 is the resistance value of the second calibration pattern measured in the first step; a third step of either plotting the electrically-converted dimension (ECD) calculated in the second step and the resistance value R of the resistance defect test pattern measured in the first step along an X axis and a Y axis, respectively, to obtain a graph, or calculating a sheet resistance value Rs of the resistance defect test pattern in each block by the following expression:

$$Rs = R \times ECD/A$$

where A is a length of the resistance defect test pattern, and plotting the calculated sheet resistance value Rs and the electrically-converted dimension (ECD) calculated in the second step along a Y axis and an X axis, respectively, to obtain a graph; and a fourth step of detecting a resistance variation defect in the resistance defect test pattern by extracting each point where the resistance value R or the sheet resistance value Rs of the resistance defect test pattern is increased discretely based on the graph obtained in the third step.

In the first resistance defect assessment method, the resistance defect assessment device may further include, in each block, a plurality of additional resistance defect test patterns having the same length as that of the resistance defect test pattern and being made of the silicon-containing layer and the silicide layer having two or more widths different from that of the resistance defect test pattern, and a plurality of additional first calibration patterns having the same length as that of the first calibration pattern and being made of the silicon-containing layer having two or more widths different from that of the first calibration pattern; and the first step may include a step of measuring a resistance value of each of the additional resistance defect test patterns and the additional first calibration patterns in each block at a plurality of positions in the wafer surface and in each chip area or each shot area.

A second resistance defect assessment method of the present invention is a resistance defect assessment method for assessing a resistance variation defect in a resistive element being at least one of a gate electrode wiring and a source/drain impurity layer of a MOS transistor provided in a semiconductor integrated circuit device and being made of a silicon-containing layer and a silicide layer formed on the silicon-containing layer, the method including: a first step of using the fourth resistance defect assessment device of the present invention to measure a resistance value of each of the resistance defect test pattern and the first calibration pattern in each block at a plurality of positions in the wafer surface and in each chip area or each shot area; a second step of calculating an adjusted value $RR'(1)$ of the resistance value of the resistance defect test pattern by the following expression:

$$RR'(1) = RR \times r1(\text{Ave})/r1$$

where RR is the resistance value of the resistance defect test pattern in each block measured in the first step, r1 is the resistance value of the first calibration pattern in each block measured in the first step, r1(Ave) is an average resistance value of all the first calibration patterns in the wafer surface measured in the first step; a third step of obtaining a distribution map of the adjusted value $RR'(1)$ calculated in the second step in the wafer surface or in each chip area or each shot area; and a fourth step of detecting a resistance variation defect in the resistance defect test pattern by extracting each point where the adjusted value $RR'(1)$ is increased discretely based on the distribution map obtained in the third step.

A third resistance defect assessment method of the present invention is a resistance defect assessment method for assessing a resistance variation defect in a resistive element being at least one of a gate electrode wiring and a source/drain impurity layer of a MOS transistor provided in a semiconductor integrated circuit device and being made of a silicon-containing layer and a silicide layer formed on the silicon-containing layer, the method including: a first step of using the sixth resistance defect assessment device of the present invention to measure a resistance value of each of the resistance defect test pattern and the third calibration pattern in each block at a plurality of positions in the wafer surface and in each chip area or each shot area; a second step of calculating an adjusted value $RR'(2)$ of the resistance value of the resistance defect test pattern by the following expression:

$$RR'(2) = RR \times r3(\text{Ave})/r3$$

where RR is the resistance value of the resistance defect test pattern in each block measured in the first step, r3 is the resistance value of the third calibration pattern in each block measured in the first step, r3(Ave) is an average resistance value of all the third calibration patterns in the wafer surface measured in the first step; a third step of obtaining a distribution map of the adjusted value $RR'(2)$ calculated in the second step in the wafer surface or in each chip area or each shot area; and a fourth step of detecting a resistance variation defect in the resistance defect test pattern by extracting each point where the adjusted value $RR'(2)$ is increased discretely based on the distribution map obtained in the third step.

A fourth resistance defect assessment method of the present invention is a resistance defect assessment method for assessing a resistance variation defect in a resistive element being at least one of a gate electrode wiring and a source/drain impurity layer of a MOS transistor provided in a semiconductor integrated circuit device and being made of a silicon-containing layer and a silicide layer formed on the silicon-containing layer, the method including: a first step of using the eighth resistance defect assessment device of the present invention to measure a resistance value of each of the resistance defect test pattern, the first calibration pattern and the third calibration pattern in each block at a plurality of positions in the wafer surface and in each chip area or each shot area; a second step of calculating an adjusted value $RR'(1)$, an adjusted value $RR'(2)$ and an adjusted value $RR'(3)$ of the resistance value of the resistance defect test pattern by the following expression:

$$RR'(1) = RR \times r1(\text{Ave})/r1$$

$$RR'(2) = RR \times r3(\text{Ave})/r3$$

$$RR'(3) = RR \times r1(\text{Ave}) \times r3(\text{Ave})/(r1 \times r3)$$

where RR is the resistance value of the resistance defect test pattern in each block measured in the first step, r1 is the resistance value of the first calibration pattern in each block measured in the first step, r3 is the resistance value of the third calibration pattern in each block measured in the first step, r1(Ave) is an average resistance value of all the first calibration patterns in the wafer surface measured in the first step, and r3(Ave) is an average resistance value of all the third calibration patterns in the wafer surface measured in the first step; a third step of obtaining a distribution map of each of the adjusted value $RR'(1)$, the adjusted value $RR'(2)$ and the adjusted value $RR'(3)$ calculated in the second step in the wafer surface or in each chip area or each shot area; and a fourth step of detecting a resistance variation defect in the resistance defect test pattern by extracting points where the adjusted value $RR'(1)$, the adjusted value $RR'(2)$ and the adjusted value $RR'(3)$ are increased discretely based on the distribution maps obtained in the third step.

In the second or fourth resistance defect assessment method, an average resistance value r1shot(Ave) of all the first calibration patterns in one chip area or one shot area measured in the first step or an average resistance value r1block(Ave) of all the first calibration patterns in one block measured in the first step may be used in the second step instead of the average value r1(Ave).

In the third or fourth resistance defect assessment method, an average resistance value r3shot(Ave) of all the third calibration patterns in one chip area or one shot area measured in the first step or an average resistance value r3block(Ave) of all the third calibration patterns in one block measured in the first step may be used in the second step instead of the average value r3(Ave).

A first method for manufacturing a resistance defect assessment device of the present invention is a method for manufacturing one of the third to eighth resistance defect assessment devices, wherein the resistive element to be assessed is a gate electrode wiring of a MOS transistor provided in the semiconductor integrated circuit device, the method including the steps of: forming a first insulating film on a substrate made of the wafer; depositing a silicon-containing layer on the first insulating film; etching the silicon-containing layer using a first mask pattern to pattern the silicon-containing layer into the resistance defect test pattern and the calibration pattern; forming a side wall on each side of the patterned silicon-containing layer, and then depositing a silicification-preventing second insulating film thereon; etching the second insulating film using a second mask pattern to obtain a silicified region where the second insulating film is removed and a non-silicified region where the second insulating film is left unremoved; and forming a silicide layer in an upper portion of the silicon-containing layer in the silicified region by using a salicide process, thereby obtaining the gate electrode wiring.

A second method for manufacturing a resistance defect assessment device of the present invention is a method for manufacturing one of the third to eighth resistance defect assessment devices, wherein the resistive element to be assessed is a source/drain impurity layer of a MOS transistor provided in the semiconductor integrated circuit device, the method including the steps of: forming a first insulating film on a semiconductor substrate made of the wafer; etching the first insulating film using a first mask pattern to pattern the first insulating film into the resistance defect test pattern and the calibration pattern; etching the semiconductor substrate using the patterned first insulating film as a mask to form a trench; forming a second insulating film to fill the trench; flattening a surface of the second insulating film by CMP, and then removing the first insulating film to form a trench isolation; introducing an impurity into an exposed surface portion of the semiconductor substrate where the trench isolation is not formed to form an impurity layer, and then depositing a silicification-preventing third insulating film on the semiconductor substrate; etching the third insulating film using a second mask pattern to obtain a silicified region where the third insulating film is removed and a non-silicified region where the third insulating film is left unremoved; and forming a silicide layer in an upper portion of the impurity layer in the silicified region by using a salicide process, thereby obtaining the source/drain impurity layer.

A contact defect assessment device of the present invention is a contact defect assessment device provided on a wafer for assessing a resistance variation defect in a contact provided in a semiconductor integrated circuit device, the contact defect assessment device including a contact chain resistor pattern having such a number of contacts that a resistance variation component to be the resistance variation defect can be measured in each chip area or each shot area of the wafer, wherein the number of contact chain resistor patterns included in one chip area or one shot area is in a range from $N/n \times 1/10$ to $N/n \times 10$, where n is the number of contacts in one contact chain resistor pattern, and N is the total number of contacts provided in the semiconductor integrated circuit device.

In the contact defect assessment device of the present invention, it is preferred that the contact chain resistor pattern is provided in each of a plurality of blocks into which each chip area or each shot area of the wafer is divided; a plurality of first calibration patterns are provided in the vicinity of the contact chain resistor pattern in each block for calibrating a resistance value of a base pattern, which dictates a resistance value of the contact chain resistor pattern, the plurality of first calibration patterns having different inter-contact pattern lengths L1, L2 and L3, L1 being substantially equal to an inter-contact pattern length L of a pattern to be assessed, L2 being greater than L1, and L3 being greater than L2; and the blocks are regularly arranged in the wafer surface and in each chip area or each shot area.

In the contact defect assessment device of the present invention, it is preferred that the contact chain resistor pattern is provided in each of a plurality of blocks into which each chip area or each shot area of the wafer is divided; a plurality of second calibration patterns are provided in the vicinity of the contact chain resistor pattern in each block, the plurality of second calibration patterns having different contact diameters d1, d2 and d3, d1 being smaller than a contact diameter d of a pattern to be assessed, d2 being substantially equal to d, and d3 being larger than d3; and the blocks are regularly arranged in the wafer surface and in each chip area or each shot area.

Note that in the contact defect assessment device of the present invention, it is preferred that the calibration pattern in each block is provided in the vicinity of the contact chain resistor pattern, e.g., within 500 μm of the contact chain resistor pattern.

In the contact defect assessment device of the present invention, it is preferred that the contact count n of the contact chain resistor pattern is set so that a resistance variation component, which is a difference between a first resistance value of a contact chain resistor pattern where there is a resistance variation defect at at least one position and a second resistance value of another contact chain resistor pattern where there is no resistance variation defect, is 1% or more with respect to the first resistance value.

Note that in the contact defect assessment device of the present invention, it is preferred that the magnitude (proportion) of the resistance variation component is a factor of 1 (100%) or less. Since a test pattern is typically assessed to be good if the resistance variation thereof is within ±10% of the target value, it is only required that a resistance variation component that is 100% or less can be detected. If a complete line break occurs, the magnitude of the resistance variation component to be detected is infinite (∞%), whereby the resistance defect assessment can be performed by using a conventional large contact chain resistor pattern. Therefore, in order to distinguish the resistance defect assessment of the present invention from that performed by using such a conventional large contact chain resistor pattern, the magnitude (proportion) of the resistance variation component may be a factor of 100 (10000%) or less in the contact defect assessment device of the present invention.

In the contact defect assessment device of the present invention, the contact may be a contact electrode obtained by forming a refractory metal film or a metal film to fill a contact hole.

In the contact defect assessment device of the present invention, a base pattern of the contact may be a gate electrode wiring layer, a source/drain impurity layer or a lower metal wiring layer.

A first contact defect assessment method of the present invention is a contact defect assessment method for assessing a resistance variation defect in a contact provided in a semiconductor integrated circuit device, the method including: a first step of using the contact defect assessment device of the present invention including calibration patterns to measure a resistance value of each of the contact chain resistor pattern and the first calibration patterns in each block at a plurality of positions in the wafer surface and in each chip area or each shot area; a second step of plotting L1, L2 and L3 and r1, r2 and r3 along an X axis and a Y axis, respectively, r1, r2 and r3 being resistance values of the first calibration patterns whose inter-contact pattern lengths are L1, L2 and L3, respectively, measured in the first step to obtain a graph, and calculating a per-contact resistance value rc of the contact chain resistor pattern based on a value of a Y-intercept of the obtained graph; a third step of either plotting the per-contact resistance value rc calculated in the second step and a resistance value Rc of the contact chain resistor pattern in each block measured in the first step along an X axis and a Y axis, respectively, to obtain a graph, or calculating an electrically-converted contact diameter d in each block by the following expression:

$$d=(\rho c/(\pi \times rc))^{1/2}$$

where rc is the per-contact resistance value calculated in the second step and ρc is a per-unit-area contact resistance value, and plotting the calculated electrically-converted contact diameter d or an inverse thereof and the resistance value Rc of the contact chain resistor pattern along an X axis and a Y axis, respectively, to obtain a graph; and a fourth step of detecting a resistance variation defect in the contact chain resistor pattern by extracting each point where the resistance value Rc of the contact chain resistor pattern is increased discretely based on the graph obtained in the third step.

A second contact defect assessment method of the present invention is a contact defect assessment method for assessing a resistance variation defect in a contact provided in a semiconductor integrated circuit device, the method including: a first step of using the contact defect assessment device of the present invention including calibration patterns to measure a resistance value of each of the contact chain resistor pattern and the first calibration patterns in each block at a plurality of positions in the wafer surface and in each chip area or each shot area; a second step of plotting L1, L2 and L3 and r1, r2 and r3 along an X axis and a Y axis, respectively, r1, r2 and r3 being resistance values of the first calibration patterns whose inter-contact pattern lengths are L1, L2 and L3, respectively, measured in the first step to obtain a graph, and calculating a per-unit-length resistance value Ru of the base pattern of the contact chain resistor pattern in the block based on a value of a gradient of the obtained graph; a third step of calculating an adjusted value Rc' of the resistance value of the contact chain resistor pattern by the following expression:

$$Rc'=Rc \times Ru(Ave)/Ru$$

where Rc is the resistance value of the contact chain resistor pattern in each block measured in the first step, and Ru(Ave) is an average value of the per-unit-length resistance values Ru of the base patterns of all the contact chain resistor patterns in the wafer surface calculated in the second step; a fourth step of obtaining a distribution map of the adjusted value Rc' calculated in the third step in the wafer surface or in each chip area or each shot area; and a fifth step of detecting a resistance variation defect in the contact chain resistor pattern by extracting each point where the adjusted value Rc' is increased discretely based on the distribution map obtained in the fourth step.

In the second contact defect assessment method, an average value Rushot(Ave) of the per-unit-length resistance values Ru of the base patterns of all the contact chain resistor patterns in one chip area or one shot area calculated in the second step or an average value Rublock(Ave) of the per-unit-length resistance values Ru of the base patterns of all the contact chain resistor patterns in one block calculated in the second step may be used instead of the average value Ru(Ave) in the third step.

A first method for manufacturing a contact defect assessment device of the present invention is a method for manufacturing a contact defect assessment device of the present invention including calibration patterns. Specifically, the method includes the steps of: forming a base pattern for each of the contact chain resistor pattern and the calibration patterns on a substrate made of a wafer; forming an insulating film on the substrate, on which the base patterns have been formed; forming a plurality of holes in the insulating film so as to reach the base patterns; forming a conductive film to fill the holes to obtain a plurality of contacts; and forming upper-layer wirings over the contacts and the insulating film.

A second method for manufacturing a contact defect assessment device of the present invention is a method for manufacturing a contact defect assessment device of the present invention including calibration patterns. Specifically, the method includes the steps of: forming an insulating film on a substrate made of a wafer; forming a first conductive film on the insulating film, etching the first conductive film using a first mask pattern to form a base pattern for each of the contact chain resistor pattern and the calibration patterns; forming an interlayer insulating film on the substrate, on which the base patterns have been formed; etching the interlayer insulating film using a second mask pattern to form a plurality of holes reaching the base patterns; forming a second conductive film to fill the holes; removing portions of the second conductive film outside the holes by CMP while leaving other portions thereof within the holes to obtain a plurality of contacts; forming a third conductive film over the contacts and the interlayer insulating film; and etching the third conductive film using a third mask pattern to form upper-layer wirings.

According to the present invention, test patterns capable of measuring a resistance variation component to be a resistance variation defect in a component of an integrated circuit device are provided in each chip area or each shot area of a wafer to be an assessment device, and the number of test patterns included in one chip area or one shot area is set so that it is possible to estimate the yield of the integrated circuit device. Therefore, it is possible to accurately assess a resistance increase defect (soft-open defect) in a component of the integrated circuit device, and it is possible to measure the resistance of each test pattern in each chip area or each shot area to detect the number of soft-open defects based on the measurement results so as to assess the yield of the integrated circuit device. Thus, it is possible to assess the influence of the soft-open defect on the yield of the integrated circuit device to be produced.

Specifically, with the resistance defect assessment device of the present invention, the resistance defect assessment method using the assessment device and the method for manufacturing the assessment device, the resistance defect test pattern has such a length that a resistance variation component to be a resistance variation defect can be measured, whereby it is possible to accurately assess a resistance increase defect (soft-open defect) occurring in a portion of a resistive element. Moreover, since the number of resistance defect test patterns provided in each chip area or each shot area is such that it is possible to assess the yield of the resistive element, it is possible to measure the resistance of each resistance defect test pattern in each chip area or each shot area to detect the number of soft-open defects based on the measurement results so as to assess the yield of the resistive element. Therefore, it is possible to assess the influence of the soft-open defect on the yield of the semiconductor integrated circuit device to be produced.

When a line break occurs in a silicide layer formed by a salicide process on a polysilicon film or a source/drain impurity layer to be a gate electrode wiring in a MOS (metal oxide semiconductor) transistor, it will not result in a complete line break (hard-open defect) since a polysilicon film or an impurity layer doped with an impurity is present under the silicide layer. Since a polysilicon film or an impurity layer has a predetermined resistance value, a line break in a silicide layer causes a resistance increase defect (soft-open defect) in a portion of the gate electrode wiring or the source/drain impurity layer. Such a soft-open defect is accurately detected by the resistance defect assessment device of the present invention and the resistance defect assessment method using the assessment device, and a yield assessment taking soft-open defects into consideration can be done based on the detection result.

Similarly, with the contact defect assessment device of the present invention, the contact defect assessment method using the assessment device and the method for manufacturing the assessment device, the contact chain resistor pattern includes such a number of contacts that a resistance variation component to be a resistance variation defect can be measured, whereby it is possible to accurately assess a soft-open defect in some of the contacts, e.g., one of a large number of contacts. Moreover, the number of contact chain resistor patterns provided in each chip area or each shot area is such that it is possible to perform the yield assessment for all contacts provided in the integrated circuit device, whereby it is possible to measure the resistance of each contact chain resistor pattern in each chip area or each shot area to detect the number of soft-open defects based on the measurement results so as to assess the yield of the contact. Therefore, it is possible to assess the influence of the soft-open defect on the yield of the semiconductor integrated circuit device to be produced.

Moreover, with the method for manufacturing a resistance defect assessment device or a contact defect assessment device of the present invention, it is possible to manufacture a soft-open defect assessment device in a very short process TAT, whereby the assessment results can be quickly fed back, thereby providing a very significant advantage of shortening the amount of time required for improving the process.

In the resistance defect assessment device of the present invention, the number of resistance defect test patterns provided corresponds to the total length of all the resistive elements provided in the semiconductor integrated circuit device, and each resistance defect test pattern has such a length that a resistance variation component to be a soft-open defect can be measured. In the resistance defect assessment method of the present invention, the measurement/assessment is performed for each of the resistance defect test patterns, whereby there are a very large number of measurement points. For example, in embodiments of the present invention to be described below, the measurement is performed at 91800 positions on one wafer. It is believed that the number of resistance defect test patterns for which the measurement needs to be done will continue to increase in the future in order to meet the demand for being able to detect a very slight resistance variation in a resistive element under the current circumstances where the degree of integration of the semiconductor integrated circuit device, whose yield is to be assessed, keeps increasing. On the other hand, it is expected that the measurement/assessment time will be further shortened by the future advancements in the measurement technology. Therefore, it is believed that an increase in the number of measurement points will not excessively increase the measurement/assessment time. Thus, a resistance defect assessment method using the resistance defect assessment device of the present invention will remain to be a most simple and effective method in the future.

Similarly, in the contact defect assessment device of the present invention, the number of contact chain resistor patterns provided corresponds to the total number of contacts in the semiconductor integrated circuit device, and each contact chain resistor pattern includes such a number of contacts therein that a resistance variation component to be a soft-open defect can be measured. In the contact defect assessment method of the present invention, the measurement/assessment is performed for each of the contact chain resistor patterns, whereby there are a very large number of measurement points. It is believed that the number of resistance defect test patterns for which the measurement needs to be done will continue to increase in the future in order to meet the demand for being able to detect a very slight resistance variation in some of a very large number of contacts under the current circumstances where the degree of integration of the semiconductor integrated circuit device, whose yield is to be assessed, keeps increasing. On the other hand, it is expected that the measurement/assessment time will be further shortened by the future advancements in the measurement technology. Therefore, it is believed that an increase in the number of measurement points will not excessively increase the measurement/assessment time. Thus, a contact defect assessment method using the contact defect assessment device of the present invention will remain to be a most simple and effective method in the future.

Note that the advantages of the present invention have been described above with respect to a case where a line break occurs in a silicide layer on a polysilicon film to be a gate electrode wiring or on a silicon layer to be a source/drain impurity layer. However, the soft-open defect detection method of the present invention and the yield assessment method using the detection results therefrom will provide very significant advantages also when they are applied to the assessment of a soft-open defect in a metal wiring made of aluminum, copper, or the like, the assessment of a soft-open defect in a contact connecting an impurity layer of a transistor, etc., with a wiring layer, or the assessment of a soft-open defect in a via section connecting metal wirings with each other.

As described above, the present invention relates to a device for assessing a resistance defect or a contact defect, an assessment method using the assessment device, and a method for manufacturing the assessment device, and is useful in detecting a resistance increase defect (soft-open defect) in a resistive element or a contact provided in a integrated circuit device or in assessing, for example, the influence of a soft-open defect on the yield of an integrated circuit device.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 2A to FIG. 2F illustrate how the length of a resistance defect test pattern in the resistance defect monitoring device is determined according to the first embodiment of the present invention.

Figure 23A:
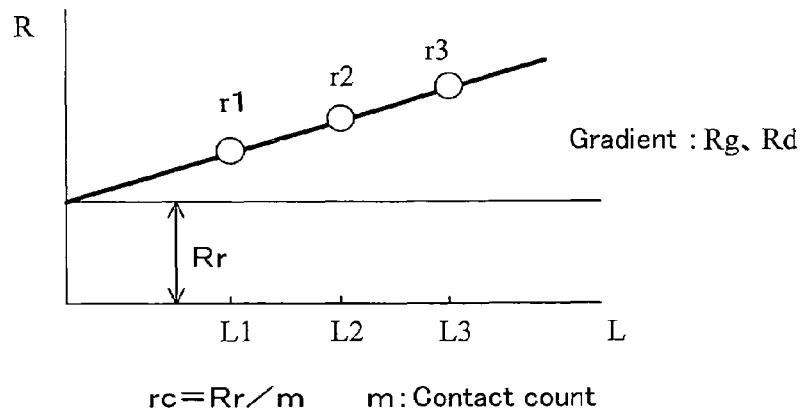
FIG. 23A illustrates an example of a graph obtained in the second step of a contact resistance defect monitoring method according to the fourteenth or fifteenth embodiment, FIG.
Figure 23B:
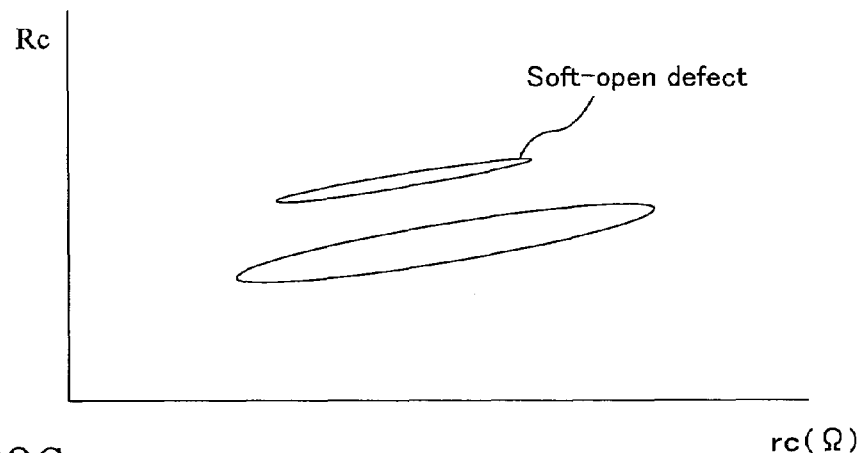
Figure 23C:
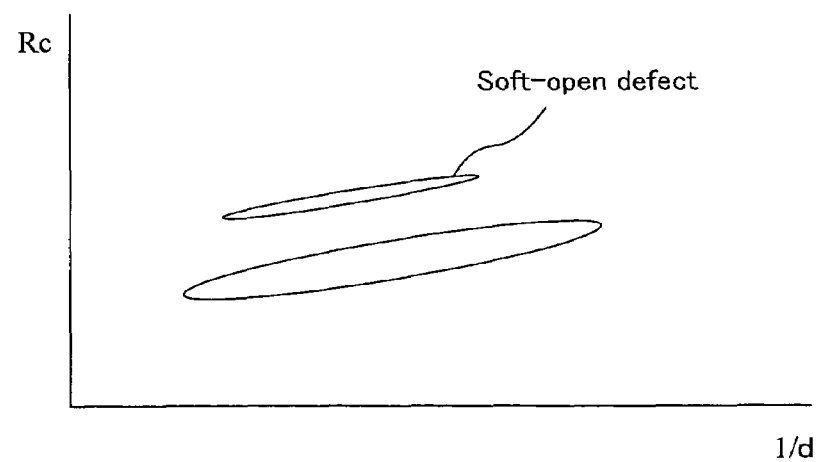

23B and FIG. 23C each illustrate an example of a graph obtained in the third step of the contact resistance defect monitoring method according to the fourteenth embodiment of the present invention.

FIG. 24A to FIG. 24E are cross-sectional views illustrating steps in a method for manufacturing a contact resistance defect monitoring device according to the sixteenth embodiment of the present invention.

Figure 25:
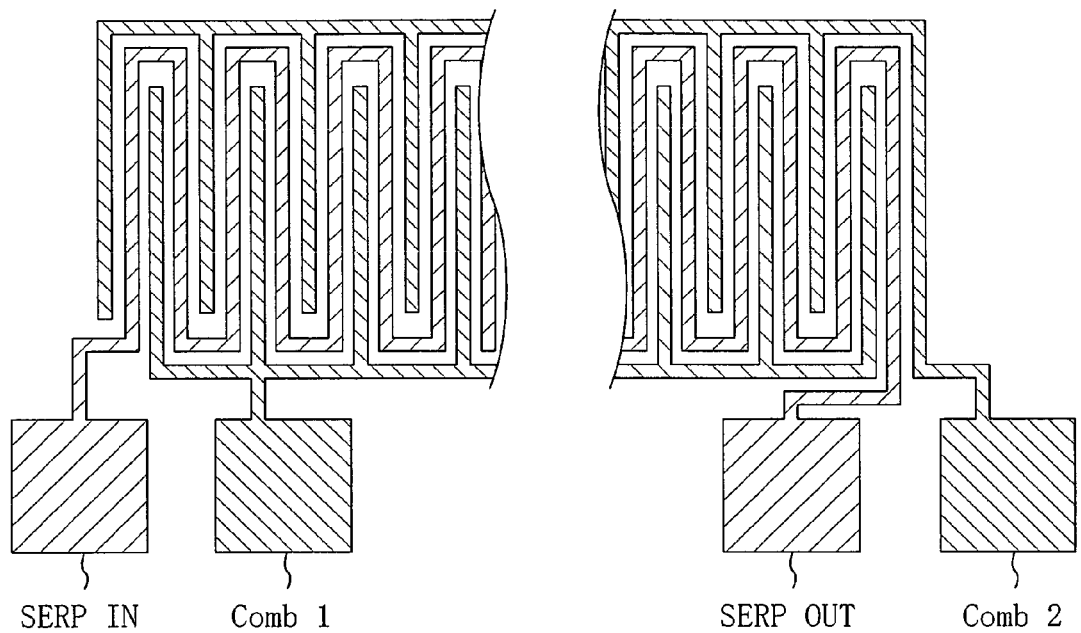

FIG. 25 illustrates an example of a conventional comb/serp line pattern.

Figure 26A:
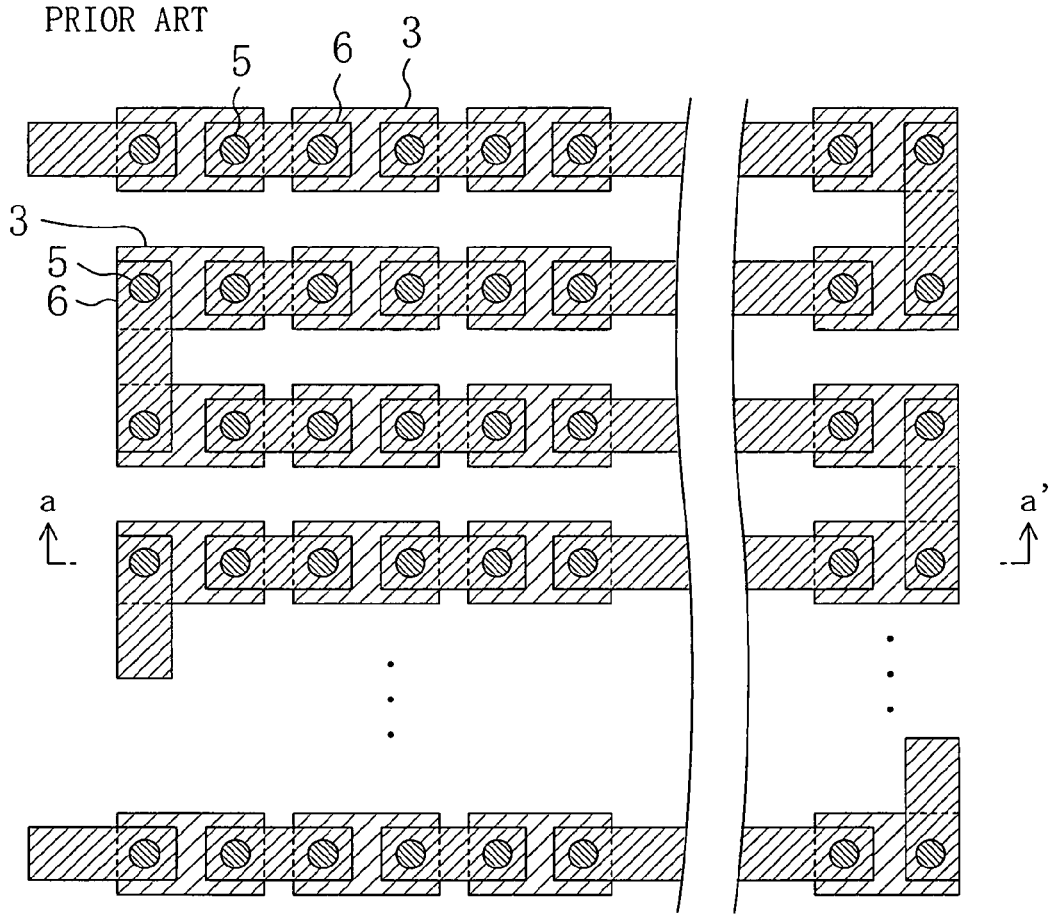
Figure 26B:
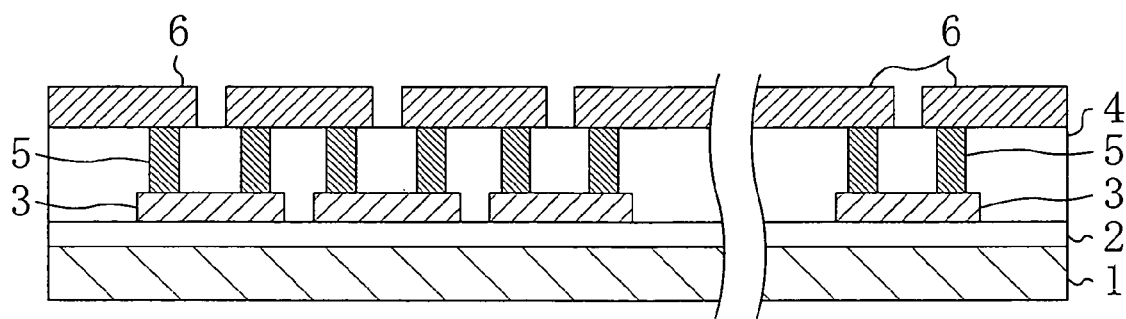

FIG. 26A is a plan view illustrating an example of a conventional contact chain resistor pattern, and FIG. 26B is a cross-sectional view taken along line a-a' of FIG. 26A.

DETAILED DESCRIPTION OF THE INVENTION

First Embodiment

A resistance defect assessment device (resistance defect monitoring device) according to the first embodiment of the present invention will now be described with reference to the drawings. Specifically, the device of the present embodiment is an assessment device provided on a wafer (test wafer) for assessing a resistance variation defect in a resistive element provided in a semiconductor integrated circuit device.

Figure 1A:
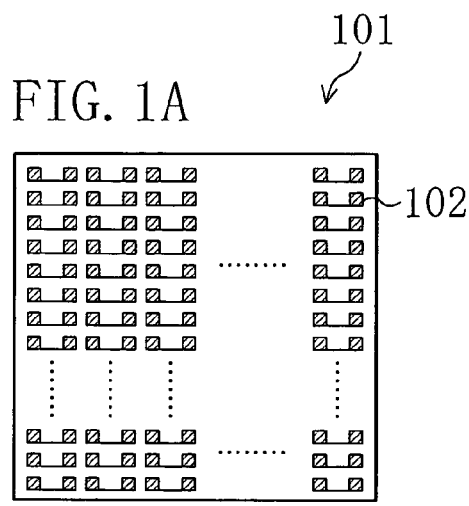
FIG. 1A is a plan view illustrating a one-chip area of a resistance defect monitoring device according to the first embodiment of the present invention.

FIG. 1A is a plan view illustrating a one-chip area (or a one-shot area to be described later) of a resistance defect monitoring device of the present embodiment. Referring to FIG. 1A, resistance defect test patterns 102, each being a resistor having such a size (length or width) that a resistance variation component to be a soft-open defect can be detected, are regularly arranged in a chip area 101 (hereinafter referred to simply as the "chip 101"). The number of resistance defect test patterns 102 in the chip 101 is such that it is possible to assess the yield of a semiconductor integrated circuit device. In other words, the length of the resistance defect test pattern 102 of the present embodiment is determined to be smaller than a predetermined length that is predicted by the resistance measurement precision as will be described later. The resistance defect test pattern 102 has substantially the same structure ("structure" as used in the first to tenth embodiments refers to the material composition, the thickness, etc., and does not include the width and the length unless otherwise indicated) as that of the resistive element provided in the semiconductor integrated circuit device. Specifically, in the present embodiment, 1800 resistors, each being a silicified gate electrode wiring having a length of 280 μm and a width of 0.1 μm, are provided within the chip 101 as the resistance defect test patterns 102.

Figure 1B:
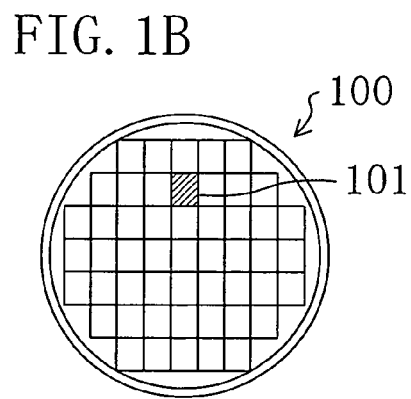
FIG. 1B illustrates the resistance defect monitoring devices of FIG. 1A being regularly arranged across the surface of a wafer, FIG. 1C and FIG. 1D each illustrate a resistance defect test pattern in the resistance defect monitoring device of FIG. 1A, FIG. 1E and FIG. 1F illustrate how the length of the resistance defect test pattern of FIG. 1C is determined.

FIG. 1B illustrates the resistance defect monitoring devices of the present embodiment illustrated in FIG. 1A (each provided within a one-chip area) being regularly arranged across the surface of a wafer 100. Referring to FIG. 1B, the chips 101 are provided at 51 positions on the principal plane of the wafer 100 in the present embodiment. Thus, each wafer includes 1800×51=91800 resistance defect test patterns 102.

Figure 1C:
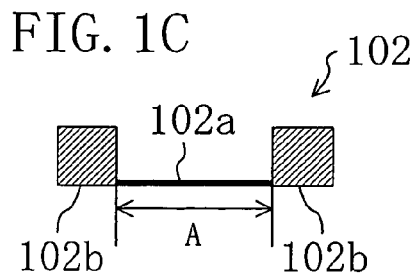
FIG. 1G illustrates the number of resistance defect test patterns needed to be provided within the chip illustrated in FIG. 1A.
Figure 1D:
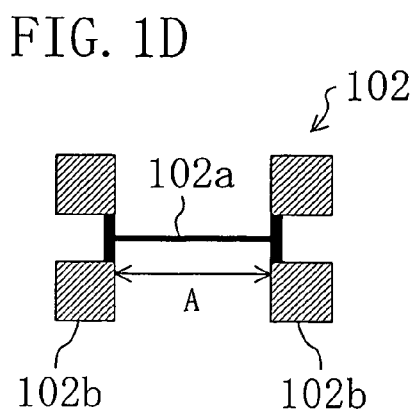

FIG. 1C and FIG. 1D each illustrate an example of the resistance defect test pattern 102. Referring to FIG. 1C, the resistance defect test pattern 102 may include, for example, a line portion 102a having a length of A and substantially being a resistor, and two terminals 102b connected to the opposite ends of the line portion 102a, one at each end. Referring to FIG. 1D, the resistance defect test pattern 102 may alternatively include, for example, a line portion 102a having a length A and substantially being a resistor, and four terminals 102b connected to the opposite ends of the line portion 102a, two at each end. In the following description, the length A of the line portion 102a substantially being a resistor will be taken as the length of the resistance defect test pattern 102 unless otherwise indicated.

In the present embodiment, the resistance defect test pattern 102 is a two-terminal resistor as illustrated in FIG. 1C. Note however that the resistance defect test pattern 102 may alternatively be a four-terminal resistor as illustrated in FIG. 1D, or any other appropriate resistor, including a contact resistor, a via resistor, etc. The resistance defect test pattern 102 may be a MOS transistor, or the like.

Figure 1E:
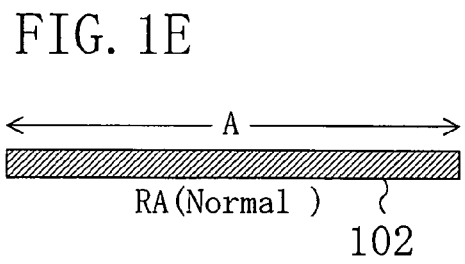
Figure 1F:
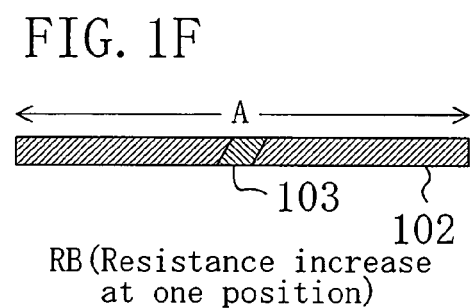

How the length A of the resistance defect test pattern 102 of FIG. 1C is determined will now be described with reference to FIG. 1E and FIG. 1F. The length A of the resistance defect test pattern 102 is determined so as to satisfy the following expression:

$$(RB-RA)/RA \times 100 \geq 2\%$$

where RA is the resistance value of the resistance defect test pattern 102 having the length A and including no resistance defect (i.e., a normal pattern) as illustrated in FIG. 1E, and RB is the resistance value of the resistance defect test pattern 102 having the length A and including at least one resistance defect 103 as illustrated ID FIG. 1F, Specifically, A=280 μm in the present embodiment. The reason for this will be described later with reference to FIG. 2A to FIG. 2F.

Figure 1G:
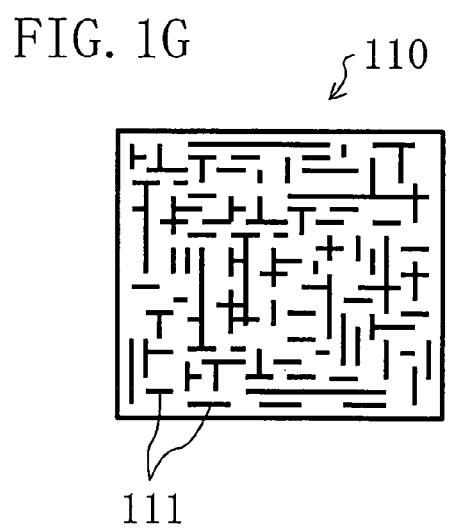

Then, the number of resistance defect test patterns 102 needed to be provided within the chip 101 illustrated in FIG. 1A will be described with reference to FIG. 1G. FIG. 1G is a schematic plan view illustrating a semiconductor integrated circuit device 110 including resistive elements 111 to be assessed. For example, the semiconductor integrated circuit device 110 is provided in each chip area or each shot area of a product wafer. In a case where the gate electrode wiring of a MOS transistor is selected as the resistive element 111 to be assessed, for example, the number of resistance defect test patterns 102 on the chip 101 needs to be set to a number that corresponds to the total length of all the gate electrode wiring patterns provided in the semiconductor integrated circuit device 110.

Note that it is assumed in the present embodiment that the gate electrode wiring used in the semiconductor integrated circuit device includes the entire line, including a portion thereof that substantially functions as the gate electrode of the MOS transistor and a portion thereof that functions as a line connecting transistors with each other. While the gate electrode wiring used in an actual semiconductor integrated circuit device includes a portion having a width of the minimum design rule and a portion having a larger width, only the gate electrode wirings having a width of the minimum design rule (which are used in most areas within the integrated circuit and which are where defects are most likely to occur) are assessed in the present embodiment, and the total length (total extent) thereof will be denoted as "B".

A feature of the present embodiment is that the number of resistance defect test patterns 102 needed to be inserted in the chip 101 is determined to be in the range from B/A×1/100 to B/A×10, where A is the length of the resistance defect test pattern 102, and B is the total extent of the resistive elements to be assessed in the integrated circuit device. Specifically, the number of resistance defect test patterns 102 provided within one chip 101 in the present embodiment is 1800, which is in this range. Note however that it is more preferred, for a yield assessment taking soft-open defects into consideration, that the number of resistance defect test patterns 102 needed to be inserted in the chip 101 is determined to be in the range from B/A×1/10 to B/A×10. The reason for this will be described later with reference to FIG. 3.

Now, referring to FIG. 2A to FIG. 2F, how the length A of the resistance defect test pattern 102 is determined in the present embodiment will be described in detail with respect to a case where a soft-open defect due to a line-break defect in the silicide layer on the gate electrode wiring is assessed.

FIG. 2A is a plan view illustrating a normal resistance defect test pattern in which the silicide layer is not broken, FIG. 2B is a plan view illustrating a resistance defect test pattern in which the silicide layer is broken at one position, FIG. 2C is a cross-sectional view taken along line a-a' of FIG. 2A, and FIG. 2D is a cross-sectional view taken along line b-b' of FIG. 2B.

Referring to FIG. 2B, the resistance defect test pattern 102 includes a lower polysilicon layer 104 and an upper silicide layer 105. Referring to FIG. 2C and FIG. 2D, even if the line-break defect 103 occurs in the silicide layer 105, the electrical connection is maintained by the lower polysilicon layer 104, whereby the resistance defect test pattern 102 as a whole is not broken, and it will only show a local resistance increase.

Whether or not the above-mentioned value of 280 μm is appropriate for the length A of the resistance defect test pattern 102 can be determined as follows. Note that the resistive element to be assessed is a gate electrode wiring having a width of 0.1 μm. A line break occurring in a silicide layer on a polysilicon electrode having a width of 0.1 μm causes a resistance increase r (measured value) of 2 kΩ. On the other hand, a normal gate electrode wiring (without a line break in the silicide layer) having a pattern length A of 280 μm and a width of 0.1 μm has a resistance value RA of 16 kΩ. Therefore, a gate electrode wiring having a pattern length A of 280 μm and a width of 0.1 μm in which there is a line break in the silicide layer will have a resistance value RB of 18 kΩ. Thus, the magnitude (proportion) of the resistance variation component is as follows.

(RB−RA)/RA×100=12.5%

Since it is greater than the above-mentioned threshold value (2%), it is indicated that setting the length A of the resistance defect test pattern to be 280 μm is appropriate.

FIG. 2E is a table showing the relationship between the length A of the resistance defect test pattern and the resistance value RA of a normal gate electrode wiring and the resistance value RB of a gate electrode wiring having a defect at one position. FIG. 2F is a graph showing the dependency of (RB−RA)/RA×100 on the length A of the resistance defect test pattern.

Referring to FIG. 2E and FIG. 2F, as the length A of the resistance defect test pattern increases, it becomes more difficult to detect a defect occurring at one position along the pattern based on the measured resistance value. The condition (RB−RA)/RA×100≧2%, which is used in the present embodiment as the range where the resistance variation component to be a defect can be measured, is satisfied if the length A of the resistance defect test pattern is 1750 μm or less. If A=1750 μm, then RA=100 Ω and RB=102 Ω as shown in FIG. 2E. Then, it is necessary to accurately detect 2%, which is the difference between these measured resistance values (more accurately, the proportion of the difference with respect to RA, i.e., the resistance variation component). Therefore, if the resistance measurement precision is about 2%, it is not possible to precisely detect a soft-open defect unless the resistance variation component is 2% or more. In the present embodiment, the length A of the resistance defect test pattern is set to 280 μm, whereby the resistance variation component is 12.5%. The resistance variation component value being greater than 10% facilitates the defect detection very much.

Now, referring to FIG. 3, how the number of resistance defect test patterns needed in one chip is determined in the present embodiment will be described in detail with respect to a case where a silicide layer on a gate electrode wiring has a line-break defect therein.

Assume that gate electrode wirings are provided as the resistive elements 111 to be assessed in the semiconductor integrated circuit device 110 as illustrated in FIG. 1G, for example. In a recent semiconductor integrated circuit device (ULSI), the gate electrode wirings used in MOS transistors extend over a total length (total extent) on the order of meters (m). Assume that the total line length B of the gate electrode wirings of the semiconductor integrated circuit device 110 (gate electrode wirings made by the minimum rule) to be assessed in the present embodiment is 1 m. Then, the number of resistance defect test patterns needed in one chip is determined as follows. First, the total line length B of the semiconductor integrated circuit device is divided by the length A (=280 μm) of the resistance defect test pattern, yielding 3571 as the value of B/A. As described above, the number of resistance defect test patterns inserted in one chip in the present embodiment is in the range from B/A×1/100 (3571×1/100=36) to B/A×10 (3571×10=35710). Specifically, the number of resistance defect test patterns inserted in one chip in the present embodiment is 1800, i.e., about one half of 3571.

Figure 3:
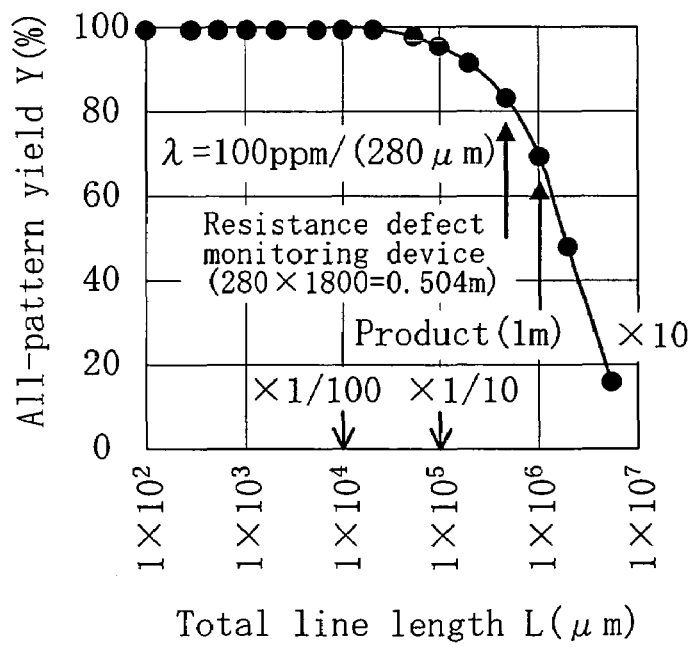
FIG. 3 illustrates how the number of resistance defect test patterns in a one-chip area of the resistance defect monitoring device is determined according to the first embodiment of the present invention.

FIG. 3 shows the relationship between the total line length L (the total extent of the gate electrode wirings provided in the semiconductor integrated circuit device or the total extent of the resistance defect test patterns in the resistance defect monitoring device) and the all-pattern yield (the yield of a one-chip area of the semiconductor integrated circuit device or the resistance defect monitoring device) Y (%). in FIG. 3, the horizontal axis represents the total line length L and the vertical axis represents the all-pattern yield Y. Herein, N=L/A holds true, where L is the total line length in one chip, N is the number of resistance defect test patterns in one chip, and A is the length of the resistance defect test pattern. Moreover, the following expression holds true:

Y=EXP(−λ×N)

where λ is the defect occurrence rate of the resistance defect test pattern having a length of 280 μm, and Y is the all-pattern yield in the resistance defect monitoring device in a one-chip area. FIG. 3 shows the all-pattern yields Y calculated for various total line lengths L for a case where the defect occurrence rate λ of a resistance defect test pattern having a length of 280 μm is 100 ppm using the expression for calculating the all-pattern yield Y.

FIG. 3 indicates that where the total line length L of a semiconductor integrated circuit device to be produced is 1 m (1.0×10$^6$ μm), the yield of the product is about 70%. Thus, where the total line length L of the resistance defect monitoring device is 1 m as is that of the product, the same yield is obtained. Therefore, by using the results, it is possible to assess the yield of the product. In this case, the number N of resistance defect test patterns needs to be 3571 as described above. In contrast, N=1800 in the present embodiment, whereby the total line length L of the resistance defect monitoring device is 280 μm×1800=0.504 m, and the all-pattern yield Y is about 84% as shown in FIG. 3. This value is sufficient for performing the product yield assessment (yield estimation) using the yield conversion expression.

Thus, if the number of resistance defect test patterns needed to be inserted in one chip is set to be in the range from B/A×1/100 to B/A×10 (where A is the length of the resistance defect test pattern, and B is the total extent of the resistive elements to be assessed in the integrated circuit device), it is possible to assess the product yield based on the yield obtained for the resistance defect monitoring device.

If the number of resistance defect test patterns needed to be inserted in one chip is set to be in the range from B/A×1/10 to B/A×10, it is possible to more accurately assess the product yield based on the yield obtained for the resistance defect monitoring device. In other words, if the number of resistance defect test patterns needed to be inserted in one chip is set to be smaller than B/A×1/10, the precision of the product yield estimation is slightly decreased.

As described above, in the resistance defect monitoring device of the first embodiment, the resistance defect test pattern 102 has such a length that a resistance variation component to be a soft-open defect can be measured, whereby it is possible to accurately assess the resistance increase defect (soft-open defect) in the resistive element to be assessed in the semiconductor integrated circuit device. Moreover, since the number of resistance defect test patterns 102 provided on each chip 101 in the wafer 100 is such that it is possible to assess the yield of the resistive element, it is possible to measure the resistance of each resistance defect test pattern 102 on each chip 101 and detect the number of soft-open defects based on the measurement results, thus assessing the yield of the resistive element. Therefore, it is possible to assess the yield of the product (semiconductor integrated circuit device) taking soft-open defects into consideration, i.e., to assess the influence of soft-open defects on the product yield.

Figure 4:
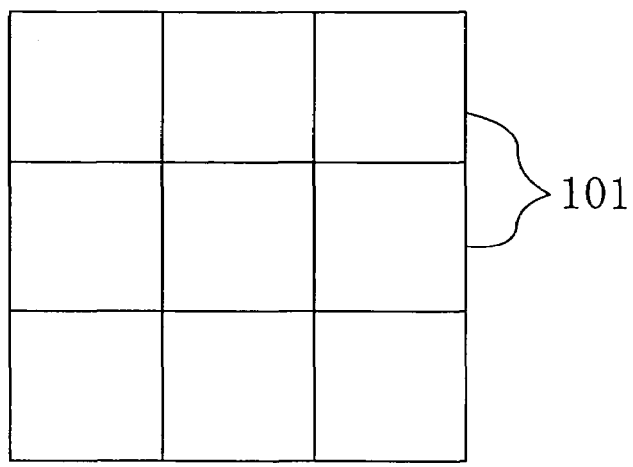
FIG. 4 illustrates a shot area of the resistance defect monitoring device according to the first embodiment of the present invention.

Note that in the first embodiment, the resistance defect monitoring devices are provided on a wafer, one for each one-chip area (the chip 101) corresponding to a semiconductor integrated circuit device. Alternatively, the resistance defect monitoring devices may be provided on a wafer, one for each one-shot area, which is the area to be exposed to light in a single shot in the photolithography process. An one-shot area 101A may include a plurality of chips 101 as illustrated in FIG. 4. In such a case, the one-shot area 101A may include an area where the resistance defect test pattern is not provided. Similarly, in the present embodiment, the chip 101 may include an area where the resistance defect test pattern is not provided.

Moreover, while the range where it is possible to measure a resistance variation component to be a defect is set to be:

$(RB-RA)/RA \times 100 \geq 2\%$ (where RA is the resistance value of a normal gate electrode wiring, and RB is the resistance value of a gate electrode wiring having a defect at one position) in the first embodiment, it is understood that the present invention is not limited to this range.

Moreover, while it is assumed in the first embodiment that a resistance variation defect occurs at one position in a resistance defect test pattern, it is understood that the present embodiment can be used in cases where a resistance variation defect occurs at two or more positions in a resistance defect test pattern.

Moreover, the first embodiment is directed to a case where the resistive element to be assessed is the gate electrode wiring of a MOS transistor. However, the present embodiment is not limited to this, and any other suitable resistive element may alternatively be assessed, including a MOS transistor assembly ("transistor assembly" as used herein refers to the whole of a transistor structure), a bipolar transistor assembly, a pn-junction diode, a source/drain impurity layer of a MOS transistor, a metal wiring, a contact connecting an impurity layer with a wiring layer, a via connecting wiring layers with each other, etc.

Second Embodiment

A resistance defect assessment device (resistance defect monitoring device) according to the second embodiment of the present invention will now be described with reference to the drawings. Specifically, the device of the present embodiment is an assessment device provided on a wafer (test wafer) for assessing a resistance variation defect in a resistive element provided in a semiconductor integrated circuit device.

Figure 5A:
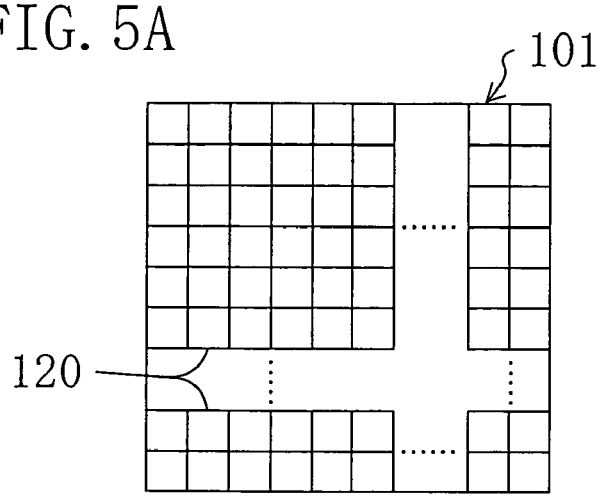
FIG. 5A is a plan view illustrating a one-chip area of a resistance defect monitoring device according to the second embodiment of the present invention.

FIG. 5A is a plan view illustrating a one-clip area (or one-slot area) of a resistance defect monitoring device of the present embodiment. Referring to FIG. 5A, the chip area 101 (hereinafter referred to simply as the "chip 101") is divided into a plurality of blocks 120.

Figure 5B:
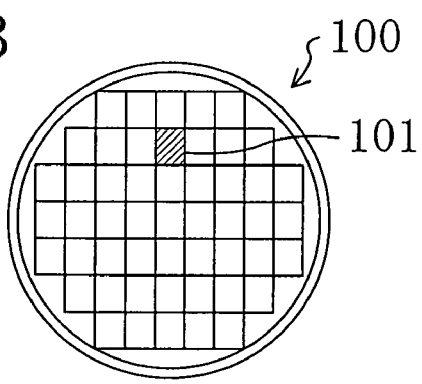
FIG. 5B illustrates the resistance defect monitoring devices of FIG. 5A being regularly arranged across the surface of a wafer.

FIG. 5B illustrates the resistance defect monitoring devices (one-chip areas) of the present embodiment illustrated in FIG. 5A being regularly arranged across the surface of the wafer 100. Referring to FIG. 5B, the chips 101 are provided at 51 positions on the principal plane of the wafer 100 in the present embodiment.

Figure 5C:
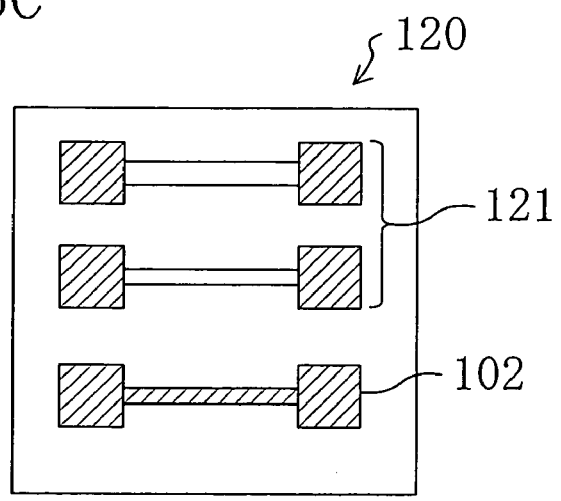
FIG. 5C illustrates a single block of the resistance defect monitoring device of FIG. 5A.

FIG. 5C illustrates a single block of the resistance defect monitoring device of FIG. 5A. A feature of the present embodiment is as follows. Referring to FIG. 5C, each block 120 on the chip 101 includes the resistance defect test pattern 102 and a calibration pattern 121. The resistance defect test pattern 102 (see the first embodiment for details) has such a size (length or width) that a resistance variation component to be a soft-open defect can be detected and has substantially the same structure as that of a resistive element to be assessed. The calibration pattern 121 (specifically, a set of two different calibration patterns whose line portions substantially being resistors have different widths) is used for calibrating at least one of the dimension, the thickness, the resistivity, etc., of the resistance defect test pattern 102, which dictate the resistance value thereof. Thus, with the calibration pattern 121, it is possible to adjust the resistance value variations among the resistance defect test patterns 102. It is preferred that the calibration pattern 121 in each block 120 is provided in the vicinity of the resistance defect test pattern 102, e.g., within 500 μm of the resistance defect test pattern 102.

Thus, in the resistance defect monitoring device of the present embodiment, the resistance defect test pattern 102 and the calibration pattern 121 together form one block 120, and a plurality of blocks 120 are regularly arranged across each one-chip area (or one-shot area), with the chip areas (the chips 100) being regularly arranged across the principal plane of the wafer 100.

The resistance defect monitoring device of the second embodiment provides the following advantage in addition to those obtained in the first embodiment. That is, by using the calibration pattern 121, the measured resistance values of the resistance defect test patterns 102 to be assessed can be adjusted within the wafer surface or a chip area (or shot area). Specifically, a variation in the dimension, the thickness or the resistivity of the resistance defect test pattern 102 in the wafer surface or a chip area (or shot area) can be adjusted at each point within the wafer surface or the chip area (or shot area), whereby it is possible to more precisely assess the resistance of the resistance defect test pattern 102. Thus, it is possible to more precisely detect soft-open defects.

Figure 6A:
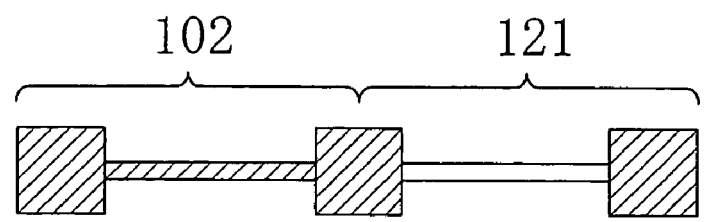
FIG. 6A and FIG. 6B illustrate a case where a common probing pad is provided for a resistance defect test pattern and calibration patterns in the resistance defect monitoring device according to the second embodiment of the present invention.
Figure 6B:
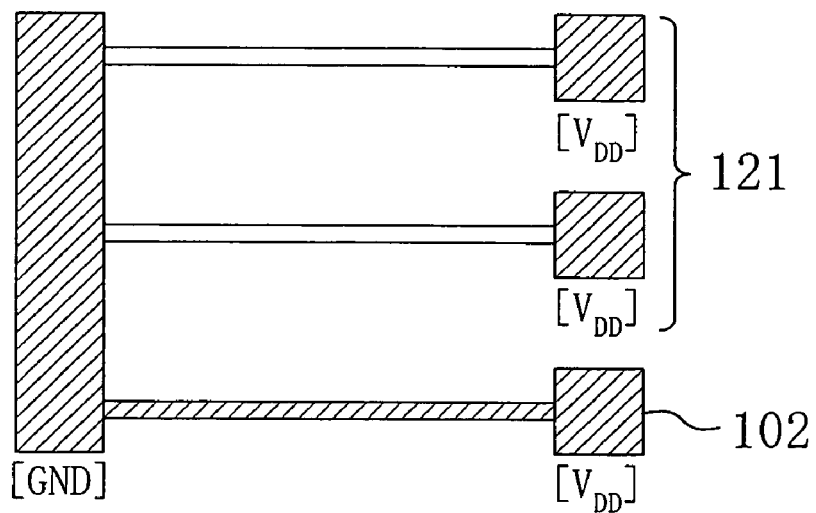

Note that in the second embodiment, a separate probing pad (terminal) is provided for each of the resistance defect test pattern 102 and the calibration pattern 121 as illustrated in FIG. 5C. This advantageously improves the precision in measuring the resistance value of the resistance defect test pattern 102 and the resistance value of the calibration pattern 121. However, it is understood that a common probing pad may alternatively be provided for the resistance defect test pattern 102 and the calibration pattern 121, as illustrated in FIG. 6A or FIG. 6B.

Third Embodiment

A resistance defect assessment device (resistance defect monitoring device) according to the third embodiment of the present invention will now be described with reference to the drawings. Specifically, the device of the present embodiment is an assessment device provided on a wafer (test wafer) for assessing a resistance variation defect in a resistive element provided in a semiconductor integrated, circuit device.

A first feature of the resistance defect monitoring device of the present embodiment is that, as in the first embodiment, a number of resistance defect test patterns each having such a size (length or width) that a resistance variation component to be a soft-open defect can be detected and each having substantially the same structure as that of a resistive element to be assessed are provided within a one-chip area (or one-shot area), and the number is such that it is possible to assess the yield of a semiconductor integrated circuit device.

A second feature of the resistance defect monitoring device of the present embodiment is that, as in the second embodiment, a chip area (or shot area) is divided into a plurality of blocks, each including a resistance defect test pattern and a calibration pattern (a set of calibration patterns). Therefore, it is possible to precisely calibrate the measured resistance value of the resistance defect test pattern.

Thus, the resistance defect monitoring device of the present embodiment is a combination of the first embodiment and the second embodiment.

Therefore, the number of resistance defect test patterns needed to be inserted in a chip area (or shot area) in the resistance defect monitoring device of the present embodiment is in the range from B/A×1/100 to B/A×10, where A is the length of the resistance defect test pattern, and B is the total length (total extent) of the resistive elements to be assessed in the semiconductor integrated circuit device.

Moreover, the length A of the resistance defect test pattern is determined so as to satisfy the following expression:

(RB−RA)/RA×100≧2% where RA is the resistance value of the resistance defect test pattern 102 having the length A and including no resistance variation defect (i.e., a normal pattern), and RB is the resistance value of the resistance defect test pattern having the length A and including at least one resistance variation defect. In other words, the length A of the resistance defect test pattern is determined so that the magnitude (proportion) of the resistance variation component to be a resistance variation defect is 2% or more.

Figure 7A:
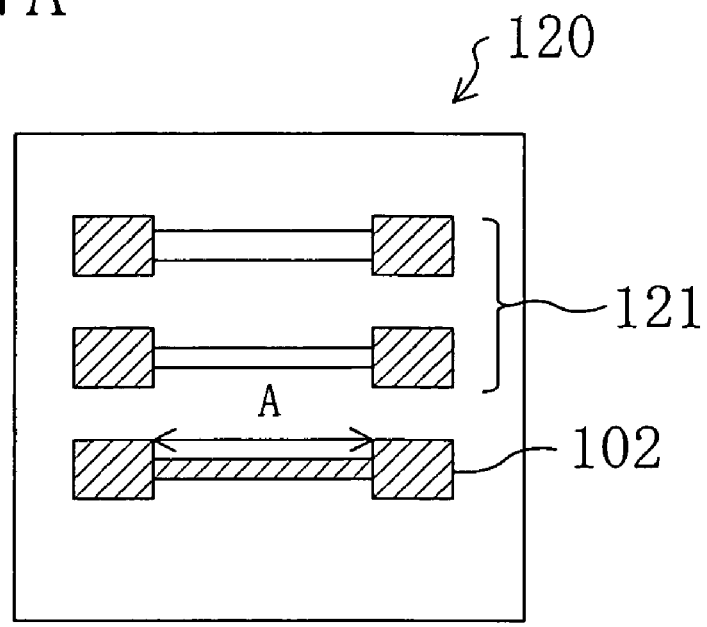
FIG. 7A and FIG. 7B each illustrate a single block of a resistance defect monitoring device according to the third embodiment of the present invention.

When inserting a required number of resistance defect test patterns in a chip area (or shot area), a corresponding number of blocks 120, each including the resistance defect test pattern 102 and the calibration pattern (a set of calibration patterns) 121, may be regularly arranged across a one-chip area (or one-shot area) as illustrated in FIG. 7A. The required number of resistance defect test patterns for a one-chip area (or one-shot area) is equal to the number of blocks arranged in a one-chip area (or one-shot area).

Figure 7B:
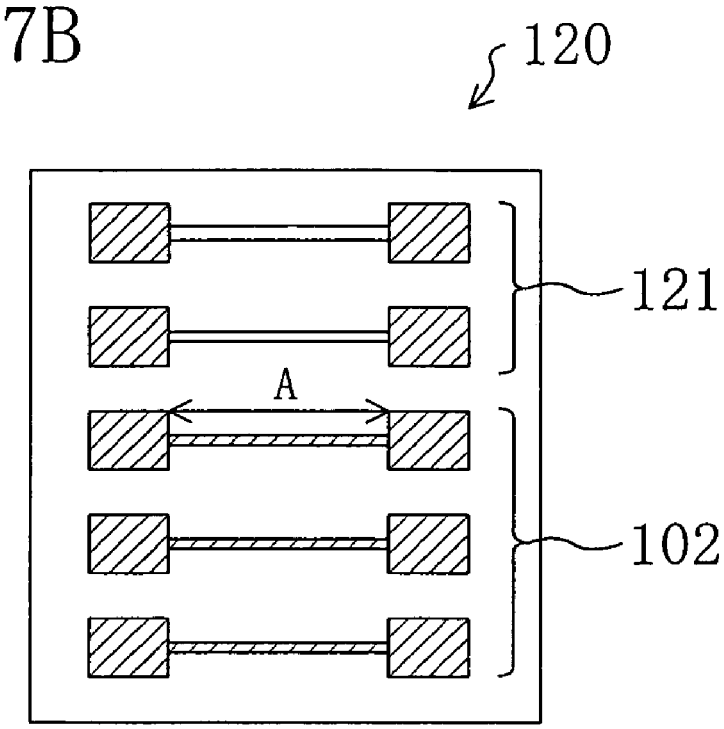

Alternatively, when inserting a required number of resistance defect test patterns in a chip area (or shot area), the number of resistance defect test patterns 102 to be arranged in each block 120 may be increased as illustrated in FIG. 7B. In such a case, the required number of resistance defect test patterns for a one-chip area (or one-shot area) is equal to the number of blocks to be arranged in a one-chip area (or one-shot area) multiplied by the number of resistance defect test patterns to be arranged in each block.

The resistance defect monitoring device of the third embodiment provides an advantage similar to that of the second embodiment, in addition to an advantage similar to that of the first embodiment. Specifically, the measured resistance values of the resistance defect test patterns 102 to be assessed can be adjusted within the wafer surface or a chip area (or shot area) by using the calibration pattern 121. Therefore, it is possible to precisely assess the resistance of the resistance defect test pattern, and thus to more precisely detect a soft-open defect.

Moreover, with the resistance defect monitoring device of the third embodiment, the number of resistance defect test patterns 102 to be arranged in a one-chip area (or one-shot area) corresponds to the total length (total extent) of the resistive elements in the semiconductor integrated circuit device, whereby it is possible to assess the influence of soft-open defects on the yield of the product (semiconductor integrated circuit device).

Note that in the second or third embodiment, the type of the resistive element to be assessed is not limited to any particular type, but may be, for example, a MOS transistor assembly, a bipolar transistor assembly, a pn-junction diode, a gate electrode wiring or a source/drain impurity layer of a MOS transistor, a metal wiring, a contact connecting an impurity layer with a wiring layer, a via connecting wiring layers with each other, etc.

Fourth Embodiment

A resistance defect assessment device (resistance defect monitoring device) according to the fourth embodiment of the-present invention will now be described with reference to the drawings. Specifically, the device of the present embodiment is an assessment device provided on a wafer (test wafer) for assessing a resistance variation defect in a resistive element provided in a semiconductor integrated circuit device. Note that the resistance defect monitoring device of the fourth embodiment assesses a soft-open defect due to a line-break defect in a silicide layer in a layered structure of a polysilicon electrode and the silicide layer formed thereon, which is used in the gate electrode wiring of the semiconductor-integrated circuit device.

Figure 8A:
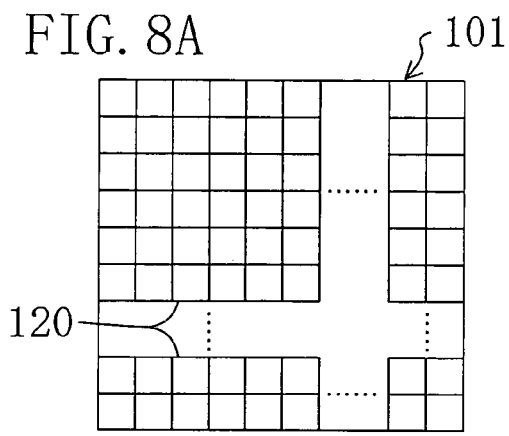
FIG. 8A is a plan view illustrating a one-chip area of a resistance defect monitoring device according to the fourth embodiment of the present invention.

FIG. 8A is a plan view illustrating a one-chip area (or one-shot area) of a resistance defect monitoring device of the present embodiment. Referring to FIG. 8A, the chip area 101 (hereinafter referred to simply as the "chip 101") is divided into a plurality of blocks 120.

Figure 8C:
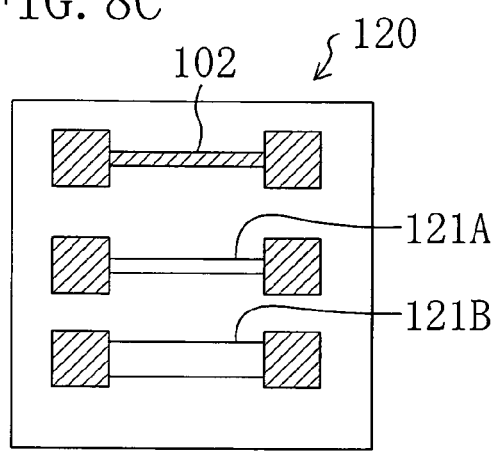
FIG. 8C illustrates a single block of the resistance defect monitoring device of FIG. 8A, FIG. 8D and FIG. 8E are a plan view and a cross-sectional view, respectively, illustrating a resistance defect test pattern in the resistance defect monitoring device of FIG. 8A, FIG. 8F and FIG. 8G are a plan view and a cross-sectional view, respectively, illustrating a first calibration pattern in the resistance defect monitoring device of FIG. 8A, and FIG. 8H and FIG. 8I are a plan view and a cross-sectional view, respectively, illustrating a second calibration pattern in the resistance defect monitoring device of FIG. 8A.
Figure 8B:
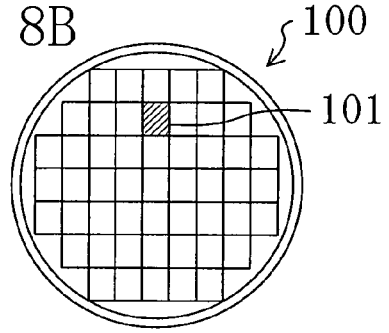
FIG. 8B illustrates the resistance defect monitoring devices of FIG. 8A being regularly arranged across the surface of a wafer.

FIG. 8B illustrates the resistance defect monitoring devices of the present embodiment illustrated in FIG. 8A (one-chip areas) being regularly arranged across the surface of the wafer 100. Referring to FIG. 8B, the chips 101 are provided at 51 positions on the principal plane of the wafer 100 in the present embodiment.

FIG. 8C illustrates a single block of the resistance defect monitoring device of FIG. 8A. A feature of the present embodiment is as follows. Referring to FIG. 8C, each block 120 on the chip 101 includes the resistance defect test pattern 102, a first calibration pattern 121A and a second calibration pattern 121B. The resistance defect test pattern 102 (see the first embodiment for details) has such a size (length or width) that a resistance variation component to be a soft-open defect can be detected and has substantially the same structure as that of a resistive element to be assessed. The calibration patterns 121A and 121B are used for calibrating at least one of the dimension, the thickness, the resistivity, etc., of the resistance defect test pattern 102, which dictate the resistance value thereof. Thus, with the calibration patterns 121A and 121B, it is possible to adjust variations in the resistance value among the resistance defect test patterns 102. It is preferred that the calibration patterns 121A and 121B in each block 120 are provided in the vicinity of the resistance defect test pattern 102, e.g., within 500 μm of the resistance defect test pattern 102.

Note that the number of resistance defect test patterns 102 needed to be inserted in a chip area (or shot area) in the resistance defect monitoring device of the present embodiment is in the range from B/A×1/100 to B/A×10 (more preferably in the range from B/A×1/10 to B/A×10), where A is the length of the resistance defect test pattern 102, and B is the total length (total extent) of the resistive elements to be assessed in the semiconductor integrated circuit device.

Moreover, the length A of the resistance defect test pattern is determined so as to satisfy the following expression, for example:

$$(RB-RA)/RA \times 100 \geq 2\%$$

where RA is the resistance value of the resistance defect test pattern 102 having the length A and including no resistance variation defect (i.e., a normal pattern), and RB is the resistance value of the resistance defect test pattern having the length A and including at least one resistance variation defect. In other words, the length A is determined so that the value (RB−RA) of the resistance variation component to be a resistance variation defect is 2% or more of the resistance value RA of a normal resistance defect test pattern.

Figure 8D:
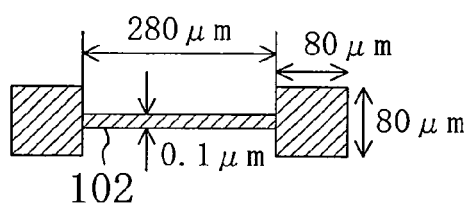
Figure 8E:
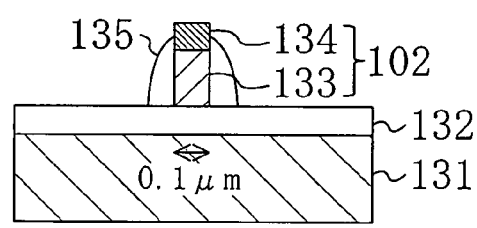

The resistance defect test pattern 102, the first calibration pattern 121A and the second calibration pattern 121B will now be described in detail with reference to the drawings. FIG. 8D and FIG. 8E are a plan view and a cross-sectional view, respectively, illustrating the resistance defect test pattern 102, FIG. 8F and FIG. 8G are a plan view and a cross-sectional view, respectively, illustrating the first calibration pattern 121A, and FIG. 8H and FIG. 8I are a plan view and a cross-sectional view, respectively, illustrating the second calibration pattern 121B.

Referring to FIG. 8D, the resistance defect test pattern 102 is a pattern corresponding to a resistive element to be assessed with the same width (0.1 μm) as that of the resistive element, and the length A (the length of the line portion substantially being a resistor) is set to 280 μm. A probing pad having a size of 80 μm×80 μm is provided at each end of the resistance defect test pattern 102 for 2-terminal resistance measurement. Although not shown in FIG. 8D, referring to FIG. 8E, the resistance defect test pattern 102 is formed on an insulating film 132 on a silicon substrate 131, and has a layered structure of a polysilicon electrode 133 and a silicide layer 134 thereon. Moreover, a side wall insulating film 135 is formed on each side of the polysilicon electrode 133. The silicide layer 134 is formed by a salicide process to silicify an upper portion of a silicon layer of the polysilicon electrode 133. Note that the resistance defect test pattern 102 is used to detect a line-break defect in the silicide layer 134 on the polysilicon electrode 133 and a resistance increase defect (soft-open defect) caused thereby.

Figure 8F:
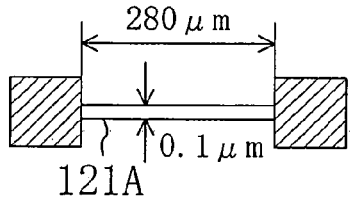
Figure 8G:
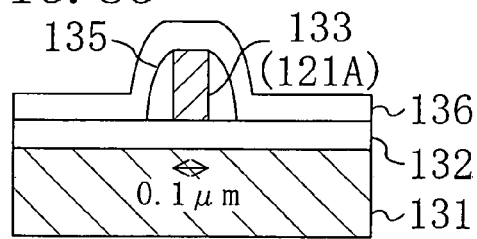

Referring now to FIG. 8F, the first calibration pattern 121A is a pattern for calibrating the resistance value of the resistance defect test pattern 102, and has the same gate width and the same length (0.1 μm and 280 μm, respectively, in the present embodiment) as those of the resistance defect test pattern 102. As with the resistance defect test pattern 102, a probing pad having a size of 80 μm×80 μm is provided at each end of the first calibration pattern 121A for 2-terminal resistance measurement. Although not shown in FIG. 8F, referring to FIG. 8G, the first calibration pattern 121A is also formed on the insulating film 132 on the silicon substrate 131, which is made of a wafer, as with the resistance defect test pattern 102. Note however that unlike the resistance defect test pattern 102, the first calibration pattern 121A has a single-layer structure of the polysilicon electrode 133. In other words, an upper portion of the polysilicon electrode 133 is not silicified. Specifically, in the first calibration pattern 121A, a silicification-preventing insulating film 136 is provided on the polysilicon electrode 133 as illustrated in FIG. 8G to prevent the silicification. Note however that the surface of each probing pad is silicified.

Figure 8H:
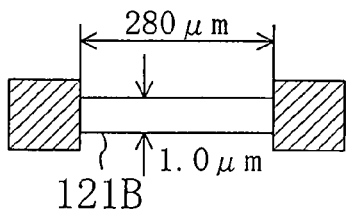
Figure 8I:
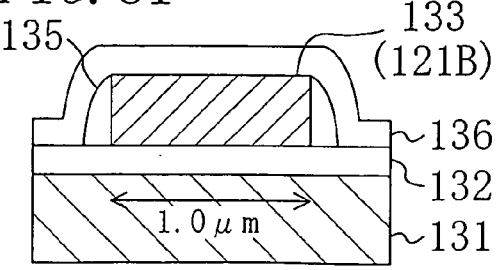

Referring now to FIG. 8H, the second calibration pattern 121B is a pattern for calibrating the resistance value of the resistance defect test pattern 102, and has the same length (280 μm in the present embodiment) as that of the resistance defect test pattern 102. Note however that the second calibration pattern 121B has a larger gate width of 1.0 μm than that (0.1 μm) of the first calibration pattern 121A. As with the resistance defect test pattern 102, a probing pad having a size of 80 μm×80 μm is provided at each end of the second calibration pattern 121B for 2-terminal resistance measurement. Although not shown in FIG. 8H, referring to FIG. 8I, the second calibration pattern 121B is also formed on the insulating film 132 on the silicon substrate 131, which is made of a wafer, as with the resistance defect test pattern 102. Note however that unlike the resistance defect test pattern 102, the second calibration pattern 121B has a single-layer structure of the polysilicon electrode 133. In other words, an upper portion of the polysilicon electrode 133 is not silicified in the second calibration pattern 121B, as in the first calibration pattern 121A. Specifically, in the second calibration pattern 121B, the silicification-preventing insulating film 136 is provided on the polysilicon electrode 133 as illustrated in FIG. 8I to prevent the silicification. Note however that the surface of each probing pad is silicified. Since the second calibration pattern 121B has a large gate width of 1.0 μm, it is not substantially influenced by the dimensional variations in the wafer surface or in each chip area (or shot area) in the photolithography process.

With the resistance defect monitoring device of the fourth embodiment as described above, it is possible to assess the dimensional variations among the resistance defect test patterns 102 in the wafer surface or in each chip area (or shot area) by comparing the measured resistance value of the first calibration pattern 121A with that of the second calibration pattern 121B. In other words, by using the first calibration pattern 121A and the second calibration pattern 121B, it is possible to extract the electrically-converted dimension (ECD: see the seventh embodiment for details) of the resistance defect test pattern 102 at various points in the wafer surface and in each chip area (or shot area), based on the measured resistance values of the calibration patterns. Thus, the measured resistance value of the resistance defect test pattern 102 at a certain point can be adjusted using the ECD at the point, whereby it is possible to precisely detect a resistance increase defect (soft-open defect) of the resistance defect test pattern 102.

In the fourth embodiment, an electrode of any other suitable silicon-containing layer may be used instead of the polysilicon electrode used in the resistive element to be assessed, the resistance defect test pattern 102, the first calibration pattern 121A and the second calibration pattern 121B.

In the fourth embodiment, the second calibration pattern 121B has a gate width at least five times as large as that of the resistive element to be assessed in order to improve the precision in detecting the resistance increase defect of the resistance defect test pattern 102.

In the fourth embodiment, the resistive element to be assessed is the silicified gate electrode wiring of a MOS transistor. However, it may alternatively be the silicified source/drain impurity layer of a MOS transistor.

Fifth Embodiment

A resistance defect monitoring device according to the fifth embodiment of the present invention will now be described with reference to the drawings.

The resistance defect monitoring device of the fifth embodiment differs from that of the fourth embodiment as follows.

Figure 9:
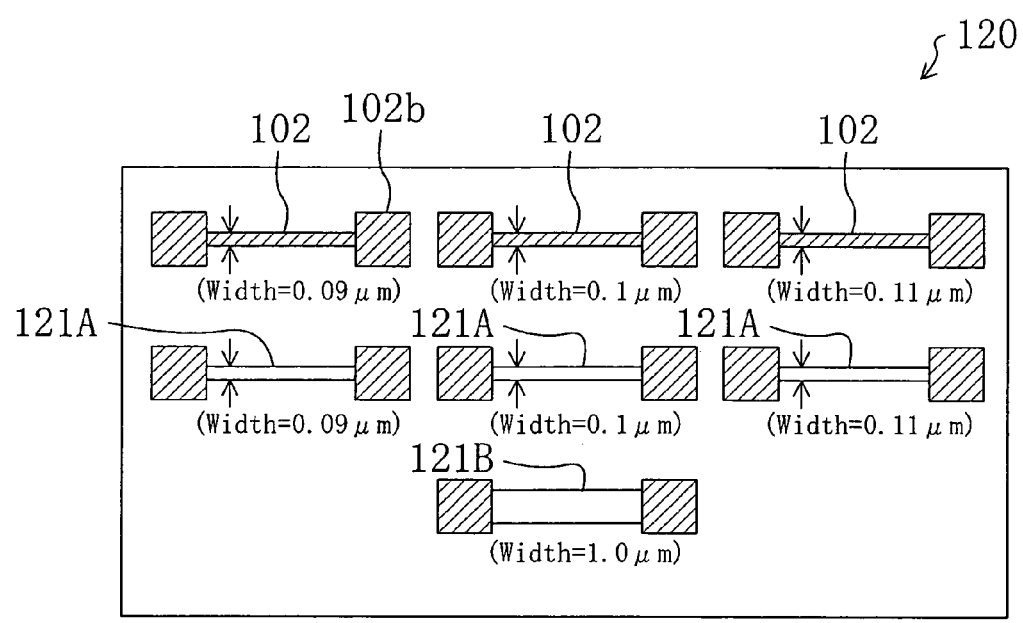
FIG. 9 illustrates a single block of a resistance defect monitoring device according to the fifth embodiment of the present invention.

FIG. 9 illustrates a single block of the resistance defect monitoring device of the present embodiment. Referring to FIG. 9, the first difference between the present embodiment and the fourth embodiment is that additional resistance defect test patterns 102 having at least two gate widths (0.09 μm and 0.11 μm in the present embodiment) different from that (0.1 μm in the present embodiment) of the resistive element to be assessed are provided on each block 120 on the chip 101, in addition to the resistance defect test pattern 102 having the same gate width as that of the resistive element to be assessed. The additional resistance defect test patterns 102 have the same length and the same structure as those of the resistance defect test pattern 102. The second difference between the present embodiment and the fourth embodiment is that additional first calibration patterns 121A having at least two gate widths (0.09 μm and 0.11 μm in the present embodiment) different from that (0.1 μm in the present embodiment) of the resistive element to be assessed, i.e., the same widths as those of the additional resistance defect test patterns 102, are provided in each block 120 on the chip 101, in addition to the first calibration pattern 121A. The additional first calibration patterns 121A have the same length and the same structure as those of the first calibration pattern 121A.

The fifth embodiment provides the following advantage in addition to those obtained in the fourth embodiment. By using the resistance defect test patterns 102 having different widths and the first calibration patterns 121A having different widths, it is possible to more precisely assess the dimension dependency of the resistance increase defect (soft-open defect) in the resistive element to be assessed. In other words, it is possible to adjust the dimensional variations in the measured resistance value among the resistance defect test patterns 102 and to assess the dimension dependency of the measured resistance value of the resistance defect test pattern 102, whereby it is possible to precisely assess the soft-open defect.

Sixth Embodiment

A resistance defect monitoring device according to the sixth embodiment of the present invention will now be described with reference to the drawings.

The resistance defect monitoring device of the sixth embodiment differs from that of the fourth embodiment as follows.

Figure 10:
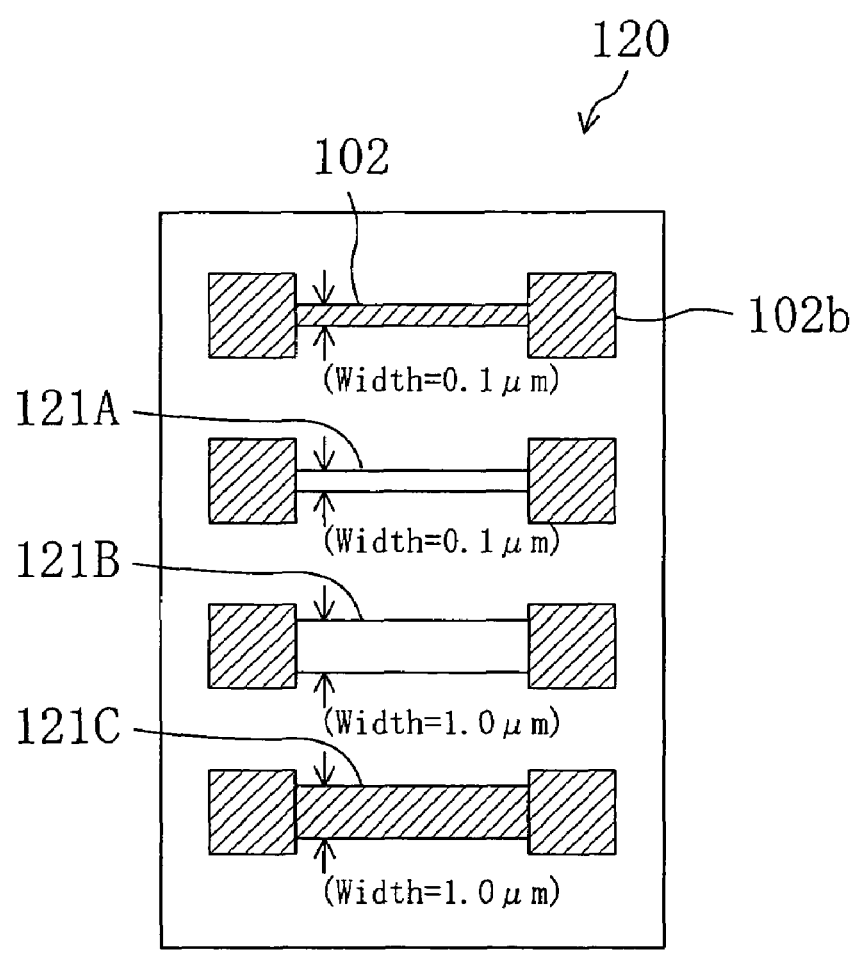
FIG. 10 illustrates a single block of a resistance defect monitoring device according to the sixth embodiment of the present invention.

FIG. 10 illustrates a single block of the resistance defect monitoring device of the present embodiment. Referring to FIG. 10, the present embodiment differs from the fourth embodiment in that a third calibration pattern 121C is provided in each block 120 on the chip 101, in addition to the resistance defect test pattern 102, the first calibration pattern 121A and the second calibration pattern 121B similar to those of the fourth embodiment. Specifically, the third calibration pattern 121C is a pattern for calibrating the resistance value of the resistance defect test pattern 102, and has the same length (280 μm in the present embodiment) as that of the resistance defect test pattern 102. Note however that the third calibration pattern 121C has a larger gate width of 1.0 μm than that (0.1 μm) of the first calibration pattern 121A. As with the resistance defect test pattern 102, a probing pad having a size of 80 μm×80 μm is provided at each end of the third calibration pattern 121C for 2-terminal resistance measurement. Although not shown, the third calibration pattern 121C is also formed on the insulating film on the silicon substrate, which is made of a wafer, as with the resistance defect test pattern 102. Note however that unlike the first and second calibration patterns 121A and 121B, the third calibration pattern 121C has a layered structure of a polysilicon electrode and a silicide layer thereon, as does the resistance defect test pattern 102. In other words, in the third calibration pattern 121C, an upper portion or the polysilicon electrode, including the surface of each probing pad, is silicified.

According to the sixth embodiment, it is possible to assess the resistance value of the silicide layer without being influenced by the dimensional variations by measuring the resistance of the third calibration pattern 121C as described above, i.e., a silicified gate electrode wiring having a large width of 1.0 μm. Since a silicide layer on a polysilicon layer is typically produced by using a salicide process, the resistance of the silicide layer varied depending on the thickness of the refractory metal film (from which the silicide layer is formed) sputtered in the salicide step. Therefore, by using the third calibration pattern 121C, it is possible to assess the sheet resistance variations of the silicide layer (the variations in the sputtering thickness of the refractory metal film) among the resistance defect test patterns 102 in the wafer surface and in a chip area (or shot area). In other words, it is possible to adjust the resistance variation component of the silicide layer of the resistance defect test pattern 102 in the wafer surface and in a chip area (or shot area).

In the sixth embodiment, at least two additional resistance defect test patterns 102 having gate widths different from that of the resistance defect test pattern 102 (which has the same gate width as that of the resistive element to be assessed) may be provided, in addition to the resistance defect test pattern 102, in each block 120 on the chip 101, as in the fifth embodiment. Moreover, at least two additional first calibration patterns 121A having gate widths different from that of the first calibration pattern 121A (which has the same gate width as that of the resistive element to be assessed), i.e., first calibration patterns 121A having the same gate widths as those of the additional resistance defect test patterns 102, may be provided, in addition to the first calibration pattern 121A, in each block 120 on the chip 101.

Seventh Embodiment

A resistance defect assessment method (resistance defect monitoring method) according to the seventh embodiment of the present invention will now be described with reference to the drawings. Specifically, the method of the present embodiment is a method for assessing a resistance variation defect in a resistive element provided in a semiconductor integrated circuit device by using the resistance defect monitoring device of the fourth embodiment. Note that the resistance defect monitoring method of the present embodiment is a resistance defect monitoring method for assessing a soft-open defect due to a line-break defect in a silicide layer in a layered structure of a polysilicon electrode and the silicide layer thereon, which is used in the gate electrode wiring of the semiconductor integrated circuit device.

In the first step, the resistance defect monitoring device of the fourth embodiment illustrated in FIG. 8A to FIG. 8I is used to measure the resistance value of each of the resistance defect test pattern 102, the first calibration pattern 121A and the second calibration pattern 121B in each block 120 at a plurality of positions in the wafer surface and in each chip area (or each shot area). As in the fourth embodiment, the resistance defect test pattern 102 includes a silicide layer and has a width of 0.1 µm and a length of 280 µm, the first calibration pattern 121A does not include a silicide layer and has a width of 0.1 µm and a length of 280 µm, and the second calibration pattern 121B does not include a silicide layer and has a width of 1.0 µm and a length of 280 µm.

Then, in the second step, the electrically-converted dimension (ECD) of the resistance defect test pattern 102 in a block 120 is calculated by Expression 1 below:

$$ECD = DR \times R2/R1 \qquad \text{(Expression 1)}$$

where DR is the design value of the width of the second calibration pattern 121B (1.0 µm in the present embodiment), and R1 and R2 are the resistance values of the first calibration pattern 121A and the second calibration pattern 121B, respectively, in the block 120 measured in the first step.

Figure 11A:
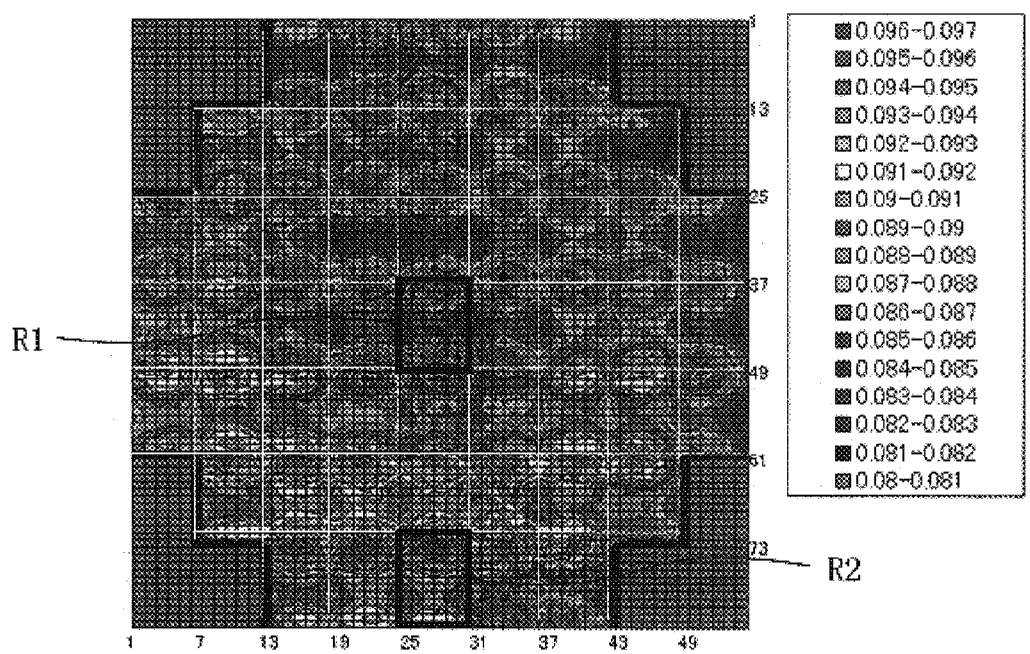
FIG. 11A illustrates the distribution of the electrically-converted dimension (ECD) across the wafer surface as calculated in the second step of a resistance defect monitoring method according to the seventh embodiment of the present invention.
Figure 11B:
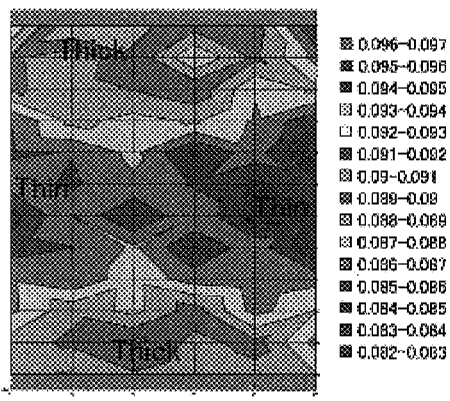
FIG. 11B illustrates the ECD distribution across the surface of a chip at the center of the wafer.
Figure 11C:
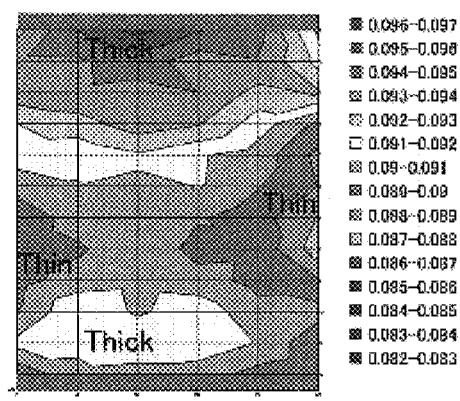
FIG. 11C illustrates the ECD distribution across the surface of another chip close to the wafer notch.

FIG. 11A illustrates the distribution of the electrically-converted dimension (ECD) across the wafer surface as calculated in the second step, FIG. 11B illustrates the ECD distribution across the surface of a chip (R1 in FIG. 11A) at the center of the wafer, and FIG. 11C illustrates the ECD distribution across the surface of another chip (R2 in FIG. 11A) close to the wafer notch. As shown in FIG. 11A to FIG. 11C, the electrically-converted dimension (ECD) varies in the range from 0.082 µm to 0.097 µm in the wafer surface or in a chip area (or shot area). Moreover, as can be seen from FIG. 11B and FIG. 11C, even within a chip area, there is a variation of $3\sigma$=about 6% or (Max−Min)/2Ave=about 4.5%.

Then, in the third step, the electrically-converted dimension (ECD) calculated in the second step and the resistance value R of the resistance defect test pattern 102 measured in the first step are plotted along the X axis and the Y axis, respectively.

Figure 12A:
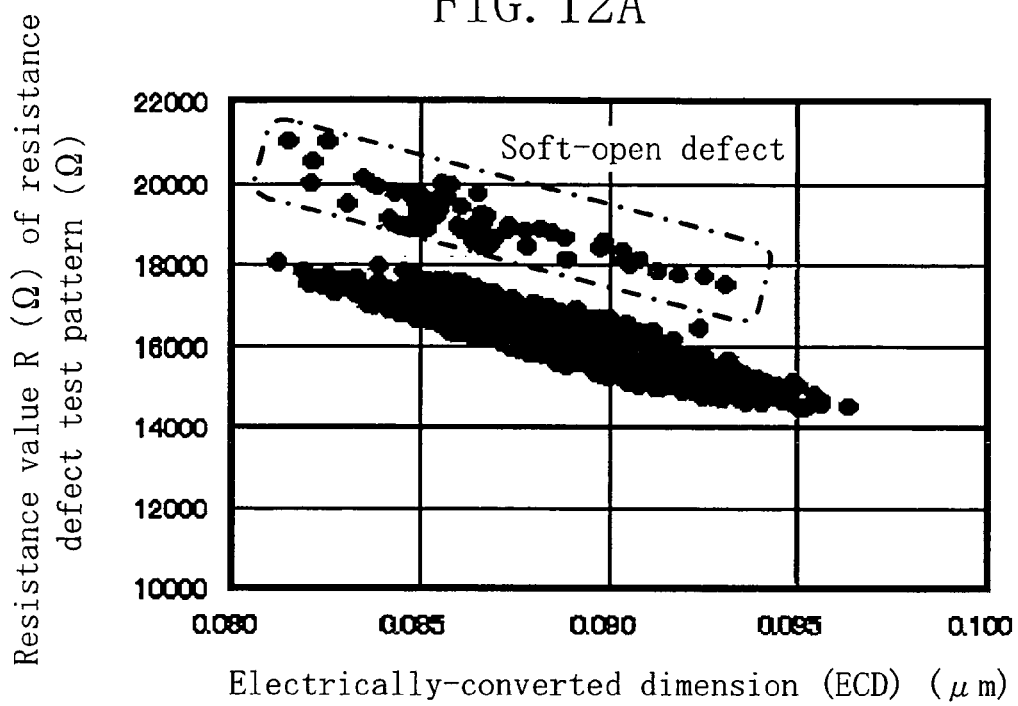
FIG. 12A and FIG. 12B each illustrate a graph obtained by plotting in the third step of the resistance defect monitoring method according to the seventh embodiment of the present invention.

FIG. 12A is a graph obtained by plotting in the third step. As shown in FIG. 12A, the resistance value R of the resistance defect test pattern 102 is strongly dependent on the pattern dimension. Thus, without the dimension extraction (dimension adjustment) of the present embodiment using the first calibration pattern 121A and the second calibration pattern 121B, the resistance increase component due to a resistance variation defect (soft-open defect) will be inconspicuous in the variations in the resistance value R among the resistance defect test patterns 102, thereby failing to accurately assess a soft-open defect.

In contrast, according to the present embodiment, the resistance value (R) of the resistance defect test pattern 102 is plotted with respect to the electrically-converted dimension (ECD) in the third step as shown in FIG. 12A, taking into consideration the influence of the dimensional variations. Then, in the fourth step, each point where the resistance value R of the resistance defect test pattern 102 is increased discretely is extracted based on the graph obtained in the third step, thereby detecting a soft-open defect in the resistance defect test pattern 102. Specifically, in the present embodiment, the value of the resistance variation component due to a resistance variation defect (soft-open defect) is about 2 kΩ.

As described above, according to the seventh embodiment, each point where the resistance value R of the resistance defect test pattern 102 is increased discretely is extracted based on the plot of the resistance value (R) of the resistance defect test pattern with respect to the electrically-converted dimension (ECD), whereby it is possible to accurately detect a defect in the resistance defect test pattern 102, more specifically, a line-break defect (soft-open defect) in the silicide layer. Note that the resistance values R of the resistance defect test patterns 102 measured in the first step can also be made into a wafer map or a chip map (or a shot map) as illustrated in FIG. 11A to FIG. 11C, in which case it is possible to determine the positions of soft-open defects in the wafer surface or the chip area (or the shot area). Thus, it is possible to determine the number of soft-open defects and thus to assess the yield of the integrated circuit device. In other words, it is possible to assess the influence of the soft-open defect on the yield of the integrated circuit device to be produced.

Figure 12B:
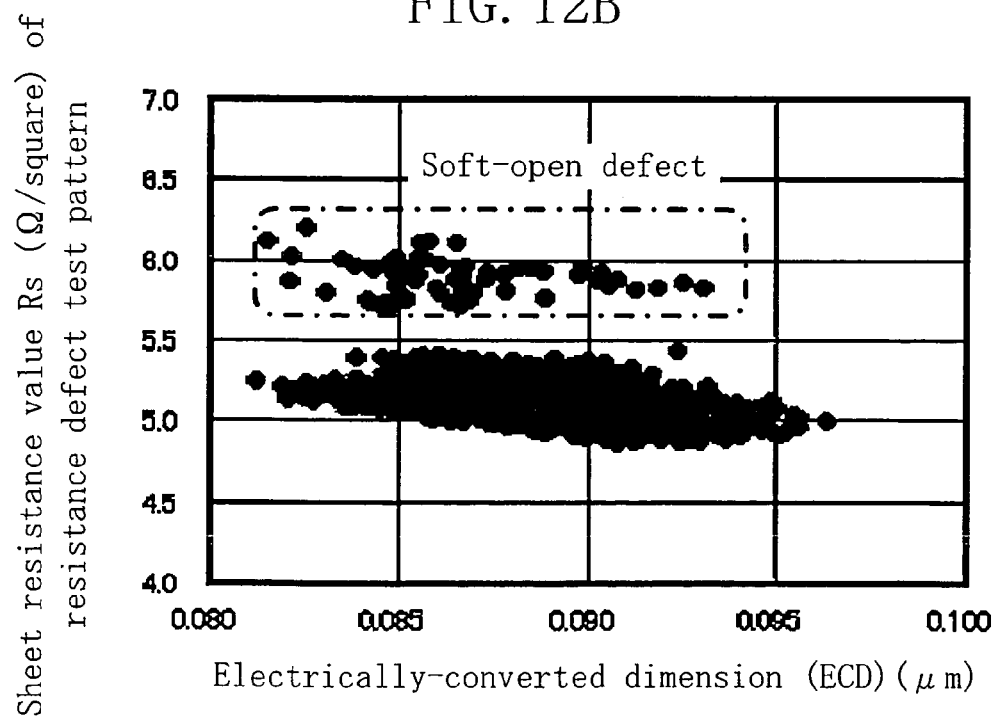

Note that in the seventh embodiment, the following process may be performed instead of plotting the resistance value (R) of the resistance defect test pattern with respect to the electrically-converted dimension (ECD) in the third step. That is, the sheet resistance value Rs of the resistance defect test pattern 102 in each block 120 is calculated by Expression 2 below:

$$Rs = R \times ECD/A \qquad \text{(Expression 2)}$$

where A is the length of the resistance defect test pattern 102, R is the resistance value of the resistance defect test pattern 102 measured for each block 120 in the first step, and ECD is the electrically-converted dimension calculated for each block 120 in the second step. Then, the electrically-converted dimension (ECD) and the calculated sheet resistance value Rs of the resistance defect test pattern 102 are plotted along the X axis and the Y axis, respectively. FIG. 12B is a graph obtained by such a plotting process. As can be seen from FIG. 12B, the soft-open defects can be isolated more easily by converting the resistance values (R) of the resistance defect test patterns 102 into the sheet resistance values (Rs). Specifically, the sheet resistance value (Rs) of the resistance defect test pattern 102 is plotted with respect to the electrically-converted dimension (ECD), and each point where the sheet resistance value (Rs) of the resistance defect test pattern 102 is increased discretely is extracted based on the graph obtained by the plotting, whereby it is possible to detect a soft-open defect in the resistance defect test pattern 102. Thus, it is possible to accurately detect a defect in the resistance defect test pattern 102, more specifically, a line-break defect (soft-open defect) in the silicide layer, also by extracting each point where the sheet resistance value (Rs) of the resistance defect test pattern is increased discretely based on a graph obtained by plotting the sheet resistance value (Rs) of the resistance defect test pattern with respect to the electrically-converted dimension (ECD). Note that the sheet resistance values (Rs) of the resistance defect test patterns 102 can also be made into a wafer map or a chip map (or a shot map) as illustrated in FIG. 11A to FIG. 11C, in which case it is possible to determine the positions of soft-open defects in the wafer surface or the chip area (or the shot area).

Moreover, in the seventh embodiment, the resistance defect monitoring device of the fifth embodiment may be used instead of the resistance defect monitoring device of the fourth embodiment in the first step. Specifically, at least two additional resistance defect test patterns having gate widths different from that of the resistance defect test pattern 102 (which has the same gate width (0.1 μm in the present embodiment) as that of the resistive element to be assessed) may be provided, in addition to the resistance defect test pattern 102, in each resistance defect test pattern 102. The additional resistance defect test patterns have the same length and the same structure as those of the resistance defect test pattern 102. Moreover, at least two additional first calibration patterns having gate widths different from that of the first calibration pattern 121A (which has the same gate width as that of the resistive element to be assessed), i.e., first calibration patterns having the same gate widths as those of the additional resistance defect test patterns, may be provided, in addition to the first calibration pattern 121A, in each block 120. The additional first calibration patterns have the same length and the same structure as those of the first calibration pattern 121A. In a case where the resistance defect monitoring device of the fifth embodiment as described above is used in the present embodiment, the resistance values of the additional resistance defect test patterns and the additional first calibration patterns in each block 120, in addition to those of the resistance defect test pattern 102, the first calibration pattern 121A and the second calibration pattern 121B in each block 120, are measured in the first step at a plurality of positions in the wafer surface and in each chip area (or each shot area). Thus, by using the resistance defect test patterns having different widths and the first calibration patterns having different widths, it is possible to more precisely assess the dimension dependency of the resistance increase defect (soft-open defect) in the resistive element to be assessed. In other words, it is possible to adjust the dimensional variations in the measured resistance value among the resistance defect test patterns and to assess the dimension dependency of the measured resistance value of the resistance defect test pattern, whereby it is possible to precisely assess the soft-open defect.

Eighth Embodiment

A resistance defect assessment method (resistance defect monitoring method) according to the eighth embodiment of the present invention will now be described with reference to the drawings. Specifically, the method of the present embodiment is a method for assessing a resistance variation defect in a resistive element provided in a semiconductor integrated circuit device by using the resistance defect monitoring device of the sixth embodiment. Note that the resistance defect monitoring method of the present embodiment is a resistance defect monitoring method for assessing a soft-open defect due to a line-break defect in a silicide layer in a layered structure of a polysilicon electrode and the silicide layer thereon, which is used in the gate electrode wiring of the semiconductor integrated circuit device.

In the first step, the resistance defect monitoring device of the sixth embodiment illustrated in FIG. 10 is used to measure the resistance value of each of the resistance defect test pattern 102, the first calibration pattern 121A and the third calibration pattern 121C in each block 120 at a plurality of positions in the wafer surface and in each chip area (or each shot area). As in the sixth embodiment, the resistance defect test pattern 102 includes a silicide layer and has a width of 0.1 μm and a length of 280 μm, the first calibration pattern 121A does not include a silicide layer and has a width of 0.1 μm and a length of 280 μm, and the third calibration pattern 121C includes a silicide layer and has a width of 1.0 μm and a length of 280 μm.

Then, in the second step, an adjusted value RR'(1), an adjusted value RR'(2) and an adjusted value RR'(3) of the resistance value RR of the resistance defect test pattern 102 are obtained respectively by Expressions 3 to 5 below:

$$RR'(1)=RR \times r1(Ave)/r1 \quad \text{(Expression 3)}$$

$$RR'(2)=RR \times r3(Ave)/r3 \quad \text{(Expression 4)}$$

$$RR'(3)=RR \times r1(Ave) \times r3(Ave)/(r1 \times r3) \quad \text{(Expression 5)}$$

where RR, r1 and r3 are the resistance values of the resistance defect test pattern 102, the first calibration pattern 121A and the third calibration pattern 121C, respectively, in each block 120 measured in the first step, r1(Ave) is the average resistance value of all the first calibration patterns 121A in the wafer surface measured in the first step, and r3(Ave) is the average resistance value of all the third calibration patterns 121C in the wafer surface measured in the first step.

Note that the adjusted value RR'(1) is a value obtained by making a dimension adjustment to the resistance value RR of the resistance defect test pattern 102, the adjusted value RR'(2) is a value obtained by making a sheet resistance adjustment to the resistance value RR of the resistance defect test pattern 102 (adjustment to the sheet resistance variation component of the silicide layer), and the adjusted value RR'(3) is a value obtained by making a dimension adjustment and a sheet resistance adjustment to the resistance value RR of the resistance defect test pattern 102.

Figure 13A:
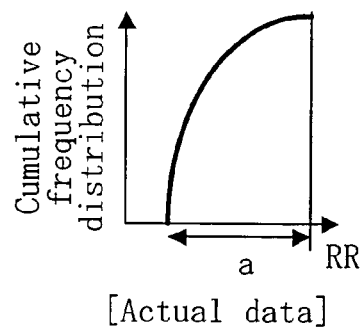
FIG. 13A to FIG. 13E illustrate the concept of an adjustment made to the resistance value of a resistance defect test pattern in a resistance defect monitoring method according to the eighth embodiment of the present invention, also illustrating the difference between the resistance values before and after the adjustment.
Figure 13B:
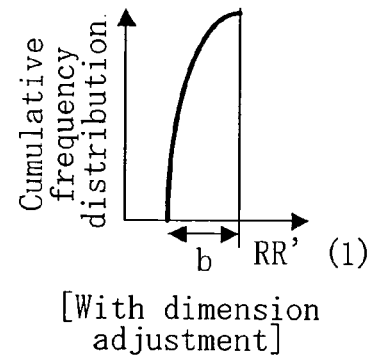
Figure 13C:
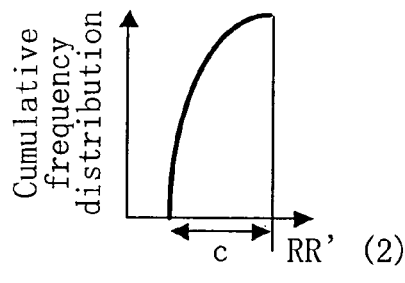
Figure 13D:
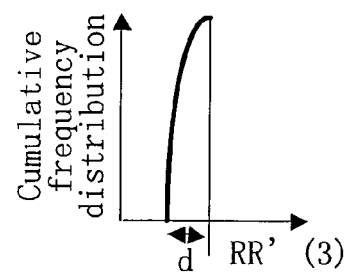
Figure 13E:
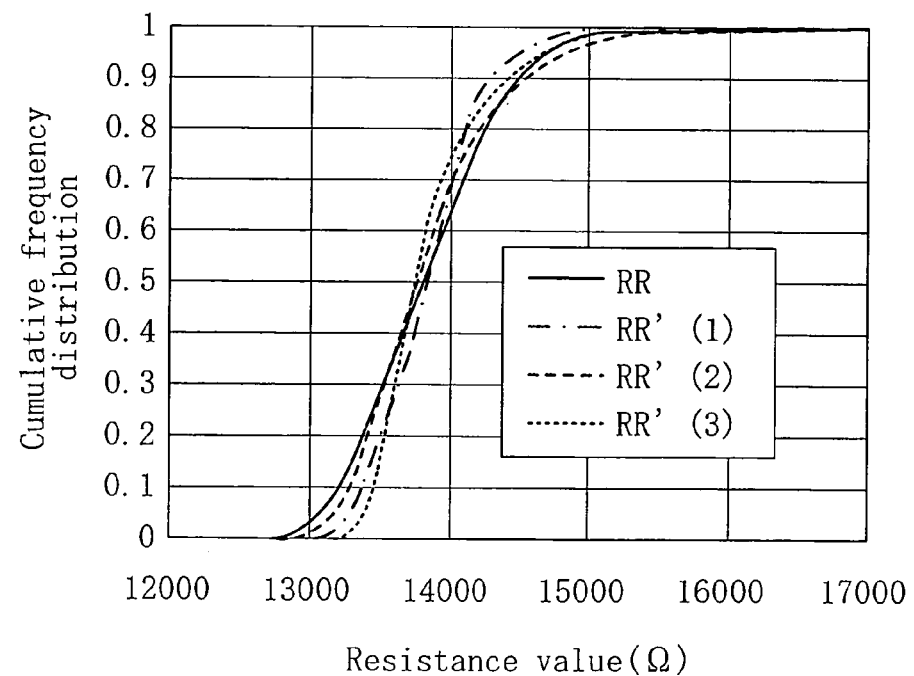

FIG. 13A to FIG. 13E illustrate the concept of an adjustment made to the resistance value RR of the resistance defect test pattern 102, also illustrating the difference between the resistance values before and after the adjustment. Specifically, FIG. 13A to FIG. 13D schematically illustrate variations in the cumulative frequency distributions (resistance value variations) of the resistance value RR of the resistance defect test pattern 102 (raw data), the adjusted value RR'(1) (dimension-adjusted value) thereof, the adjusted value RR'(2) (sheet resistance-adjusted value) thereof and the adjusted value RR'(3) (dimension-adjusted and sheet resistance-adjusted value) thereof, respectively. FIG. 13E shows the variations in the cumulative frequency distributions of the resistance value RR, the adjusted value RR'(1), the adjusted value RR'(2) and the adjusted value RR'(3), superimposed on one another.

In the present embodiment, as shown in FIG. 13A to FIG. 13D, the relationship a>c>b>d holds true, where a is the unadjusted variation in the cumulative frequency distribution, b is the dimension-adjusted variation, c is the sheet resistance-adjusted variation, and d is the dimension-adjusted and sheet resistance-adjusted variation, since the dimensional variations in the wafer surface and in a chip area (or shot area) are greater than the sheet resistance variations of the silicide layer. Thus, it is confirmed that each adjustment makes the cumulative frequency distribution curve sharper than without the adjustment as shown in FIG. 13E. In other words, these adjustments are effective.

Then, in the third step, a wafer-surface distribution map is obtained for each of the adjusted value RR'(1), the adjusted value RR'(2) and the adjusted value RR'(3) calculated in the second step. In this step, a chip-area distribution map or a shot-area distribution map may alternatively be obtained instead of a wafer-surface distribution map. Then, in the fourth step, points where the adjusted value RR'(1), the adjusted value RR'(2) and the adjusted value RR'(3) are increased discretely are extracted based on the distribution maps obtained in the third step so as to detect resistance variation defects in the resistance defect test pattern 102.

Figure 14A:
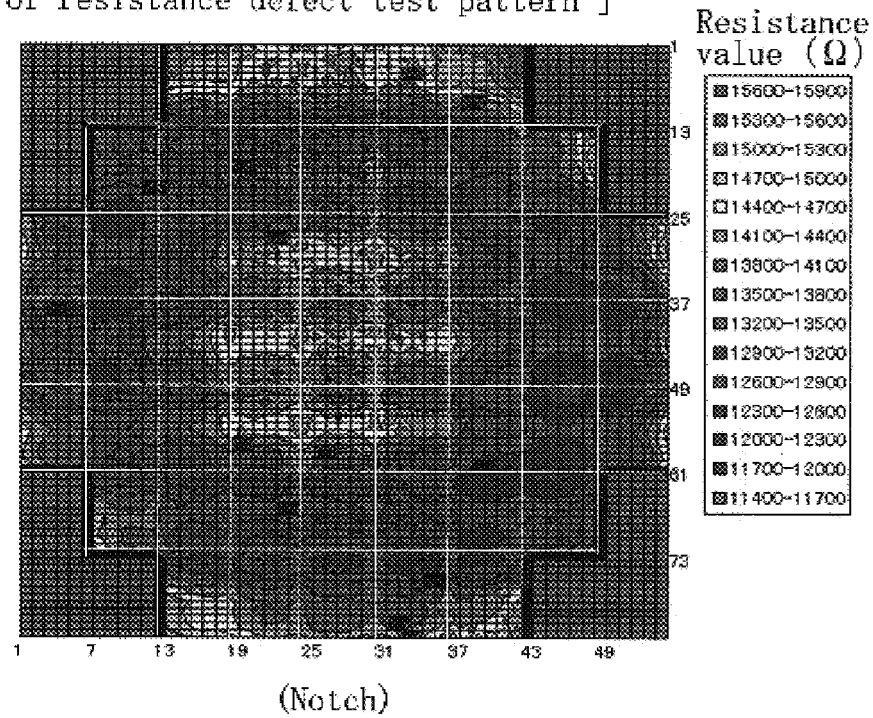
FIG. 14A illustrates the distribution, across the wafer surface, of the (unadjusted) resistance value of a resistance defect test pattern measured in the first step of the resistance defect monitoring method according to the eighth embodiment of the present invention.
Figure 14B:
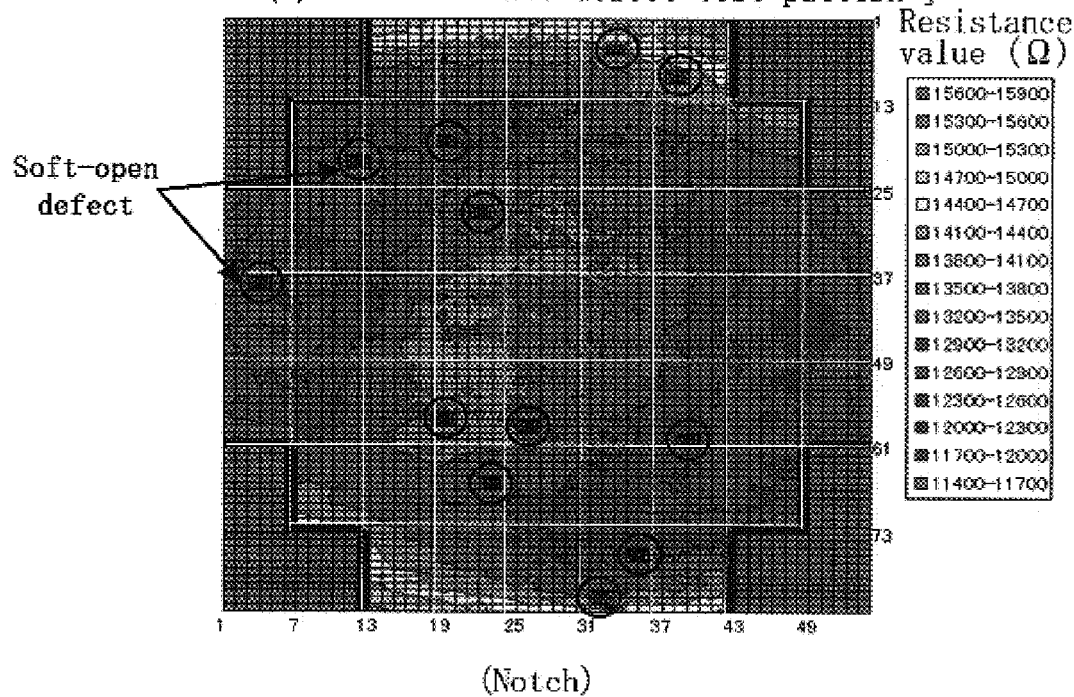
FIG. 14B illustrates the distribution, across the wafer surface, of an adjusted resistance value RR'(1) (dimension-adjusted value) of a resistance defect test pattern as calculated in the second step of the resistance defect monitoring method according to the eighth embodiment of the present invention.

FIG. 14A shows the wafer-surface distribution of the resistance values RR (unadjusted) of the resistance defect test patterns 102 measured in the first step, and FIG. 14B shows the wafer-surface distribution of the adjusted values RR'(1) (dimension-adjusted values) of the resistance values RR of the resistance defect test patterns 102 calculated in the second step. A comparison between FIG. 14A and FIG. 14B indicates that the resistance variations in a chip area (or shot area) as seen in FIG. 14A (before the dimension adjustment) are not seen in FIG. 14B (after the dimension adjustment). Thus, it can be seen that it is possible to more accurately assess the resistance variation defect in the resistance defect test pattern 102 in the wafer surface and in each chip area (or each shot area) by making the dimension adjustment as shown in Expression 3. Note that from the wafer-surface distribution of the adjusted values RR'(1) (dimension-adjusted values) shown in FIG. 14B, it can be seen that there are resistance increase defects (soft-open defects) at 12 positions.

Figure 15A:
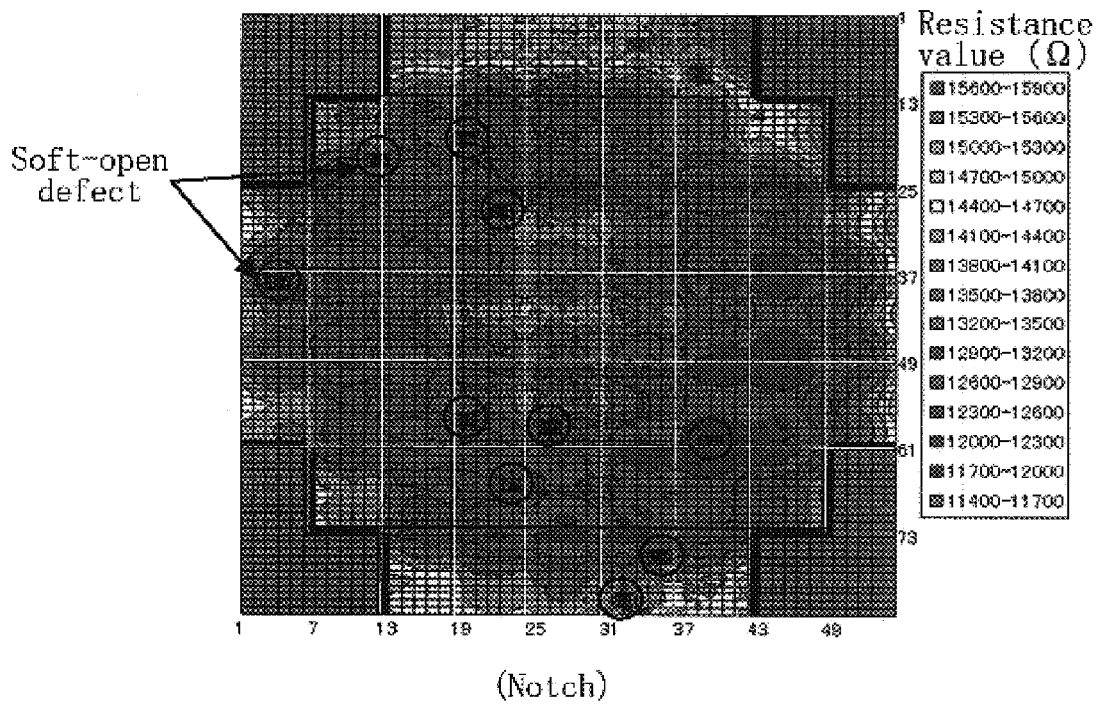
FIG. 15A illustrates the distribution, across the wafer surface, of an adjusted resistance value RR'(2) (sheet resistance-adjusted value) of a resistance defect test pattern as calculated in the second step of the resistance defect monitoring method according to the eighth embodiment of the present invention.
Figure 15B:
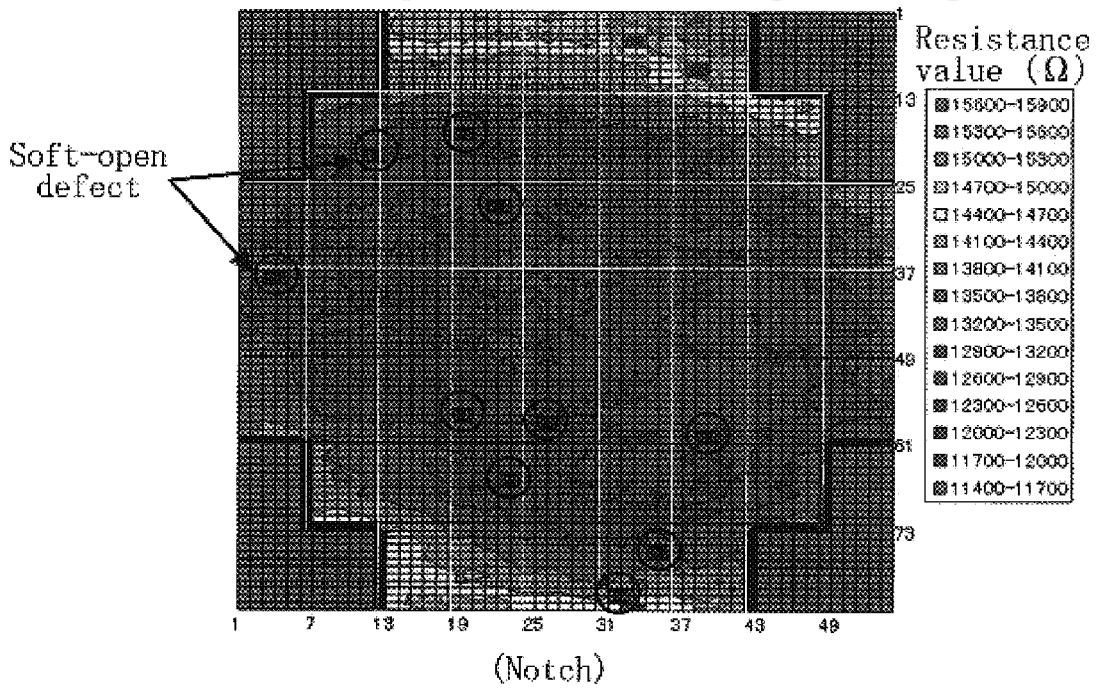
FIG. 15B illustrates the distribution, across the wafer surface, of an adjusted resistance value RR'(3) (obtained through dimension adjustment and sheet resistance adjustment) of a resistance defect test pattern as calculated in the second step of the resistance defect monitoring method according to the eighth embodiment of the present invention.

FIG. 15A shows the wafer-surface distribution of the adjusted values RR'(2) (sheet resistance-adjusted values) of the resistance values RR of the resistance defect test patterns 102 calculated in the second step, and FIG. 15B shows the wafer-surface distribution of the adjusted values RR'(3) (dimension-adjusted and sheet resistance-adjusted values) of the resistance values RR of the resistance defect test patterns 102 calculated in the second step. A comparison between FIG. 14A and FIG. 15A and FIG. 15B indicates that the resistance variations in a chip area (or shot area) as seen in FIG. 14A (before the dimension adjustment) are not seen in FIG. 15A (after the sheet resistance adjustment) or in FIG. 15B (after the dimension adjustment and the sheet resistance adjustment). Thus, it can be seen that it is possible to more accurately assess the resistance variation defect in the resistance defect test pattern 102 in the wafer surface and in each chip area (or each shot area) by making the sheet resistance adjustment as shown in Expression 4 or by making the dimension adjustment and the sheet resistance adjustment as shown in Expression 5. From the wafer-surface distribution of the adjusted values RR'(2) (sheet resistance-adjusted values) shown in FIG. 15A and the wafer-surface distribution of the adjusted values RR'(3) (dimension-adjusted and sheet resistance-adjusted values) shown in FIG. 15B, it can be seen that there are resistance increase defects (soft-open defects) at 12 positions, as in the wafer-surface distribution of the adjusted values RR'(1) shown in FIG. 14B.

As described above, according to the eighth embodiment, it is possible to accurately adjust the measured resistance value RR of the resistance defect test pattern 102 by using the first calibration (dimension-adjusted) pattern 121A and the third calibration (sheet resistance-adjusted) pattern 121C, whereby it is possible to accurately assess a defect in the resistance defect test pattern 102, specifically a line-break defect (soft-open defect) in the silicide layer.

Note that in the second step (particularly, Expression 3 and Expression 5) of the eighth embodiment, the average value r1(Ave) may be replaced by the average resistance value r1 shot(Ave) of all the first calibration patterns 121A in one chip area or one shot area measured in the first step, or by the average resistance value r1block(Ave) of all the first calibration patterns 121A in one block (assuming that a plurality of first calibration patterns 121A are provided in the block) measured in the first step. Similarly, in the second step (particularly, Expression 4 and Expression 5) of the eighth embodiment, the average value r3(Ave) may be replaced by the average resistance value r3shot(Ave) of all the third calibration patterns 121C in one chip area or one shot area measured in the first step, or by the average resistance value r3block(Ave) of all the third calibration patterns 121C in one block (assuming that a plurality of third calibration patterns 121C are provided in the block) measured in the first step.

Moreover, while the resistance value RR of the resistance defect test pattern 102 is adjusted by using both the first calibration pattern 121A and the third calibration pattern 121C in the eighth embodiment, it is understood that the resistance value RR of the resistance defect test pattern 102 may alternatively be adjusted by using only one of the first calibration pattern 121A and the third calibration pattern 121C. Thus, the process may alternatively include the steps of: measuring the resistance value of the resistance defect test pattern 102 and that of the first calibration pattern 121A or the third calibration pattern 121C; calculating the adjusted value RR'(1) or the adjusted value RR'(2); obtaining a distribution map based on the calculation; and detecting a resistance variation defect based on the distribution map.

In the eighth embodiment, the adjustment of the sheet resistance variation of the polysilicon electrode may be made with respect to the resistance value RR of the resistance defect test pattern 102 by using the second calibration pattern 121B in the resistance defect monitoring device (for one block) of the sixth embodiment shown in FIG. 10.

Ninth Embodiment

A method for manufacturing a resistance defect assessment device (resistance defect monitoring device) according to the ninth embodiment of the present invention will now be described with reference to the drawings. Specifically, the method of the present embodiment is a method for forming the resistance defect test pattern 102 and the calibration pattern 121 (at least one of the calibration patterns in a case where there are a plurality of types of calibration patterns) in the resistance defect monitoring device according to one of the second to sixth embodiments. Note that the present embodiment is directed to manufacturing a resistance defect monitoring device for assessing a soft-open defect occurring in a silicified gate electrode wiring of a MOS transistor provided in a semiconductor integrated circuit device.

FIG. 16A to FIG. 16G are cross-sectional views illustrating steps in the method for manufacturing a resistance defect monitoring device of the ninth embodiment.

Figure 16A:
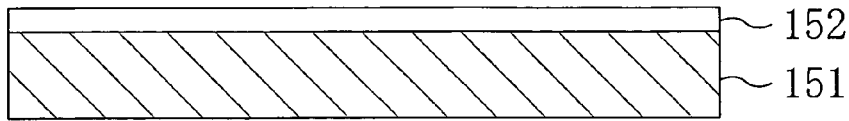
FIG. 16A to FIG. 16G are cross-sectional views illustrating steps in a method for manufacturing a resistance defect monitoring device according to the ninth embodiment of the present invention.
Figure 16B:
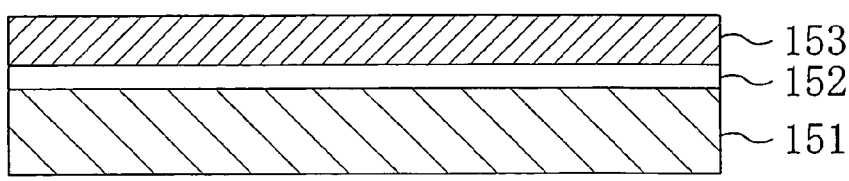

First, a first insulating film 152 is formed on a semiconductor substrate 151 made of a test wafer as illustrated in FIG. 16A, and then a silicon film 153 (e.g., a polysilicon film or an amorphous silicon film) is deposited on the first insulating film 152 as illustrated in FIG. 16B.

Figure 16C:
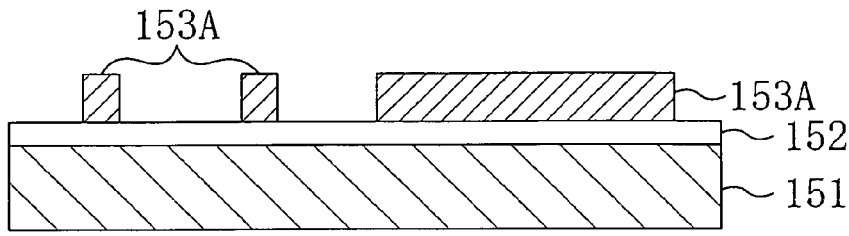

Then, a resist pattern (not shown) is formed by a photolithography process so as to cover the resistance defect test pattern region and the calibration pattern region, and then the silicon film 153 is etched using the resist pattern as a mask so as to pattern the silicon film 153 into a resistance defect test pattern and a calibration pattern, as illustrated in FIG. 16C.

Figure 16D:
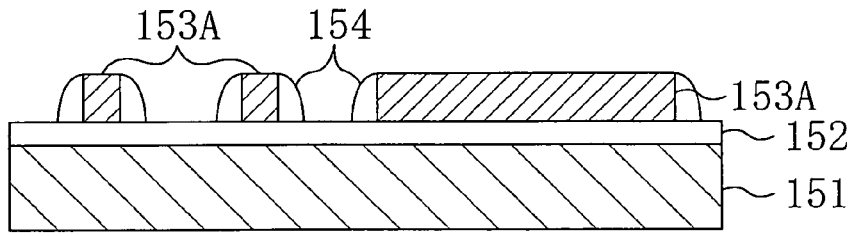
Figure 16E:
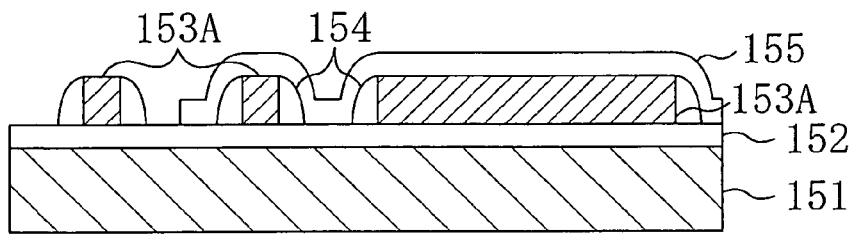

Then, a side wall insulating film 154 is formed on each side of a patterned silicon film 153A, as illustrated in FIG. 16D. Then, as illustrated in FIG. 16E, a silicification-preventing second insulating film 155 is deposited, and a resist pattern (not shown) is formed by a photolithography process so as to cover the non-silicified region, after which the second insulating film 155 is etched using the resist pattern as a mask. As a result, there are a silicified region where the second insulating film 155 has been etched away, and a non-silicified region where the second insulating film 155 is left unremoved.

Figure 16F:
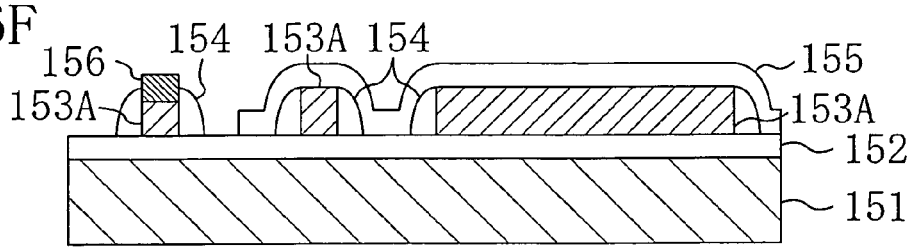

Then, as illustrated in FIG. 16F, a silicide layer 156 is formed in an upper portion of the silicon film 153A in the silicified region by a salicide process, thus obtaining a gate electrode wiring structure. In this step, the second insulating film 155 prevents the formation of the silicide layer 156 in an upper portion of the silicon film 153A in the non-silicified region.

Although not shown, an additional insulating film may be deposited after the formation of the silicide layer 156 and an upper portion thereof above the measurement pad (probing pad) may be removed, in order to prevent a surface leak current from influencing the measurement of the resistance of each of the resistance defect test pattern and the calibration pattern, which is to be performed after the resistance defect monitoring device is manufactured. Moreover, an interlayer film may be formed on the measurement pad with a contact hole formed in the interlayer film, and an additional metal pad may be provided in the contact hole, in order to prevent a leak current from occurring in the measurement pad section when contacted by a probe needle.

Figure 16G:
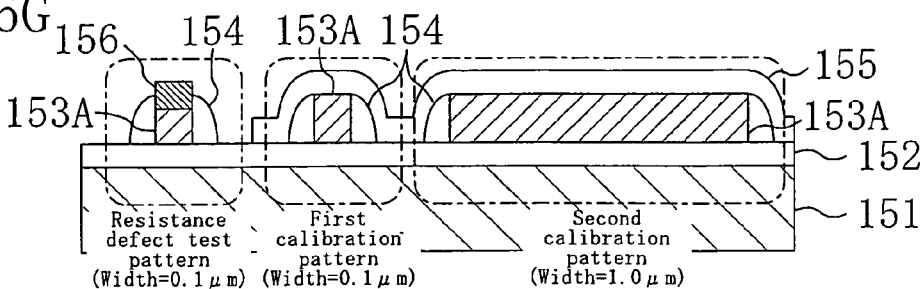

Thus, with the process of the ninth embodiment, it is possible to manufacture a resistance defect monitoring device for detecting a resistance defect in the gate electrode wiring (specifically, a soft-open defect due to a line break in the silicide layer), e.g., a resistance defect monitoring device, as illustrated in FIG. 16G, including a resistance defect test pattern, which includes the silicide layer 156 and has a width of 0.1 µm and a length of 280 µm, a first calibration pattern, which does not include the silicide layer 156 and has a width of 0.1 µm and a length of 280 µm, and a second calibration pattern, which does not include the silicide layer 156 and has a width of 1.0 µm and a length of 280 µm.

Thus, according to the ninth embodiment, the resistance defect monitoring device of one of the second to sixth embodiments can be manufactured in a very short process TAT, as compared with the manufacturing process of a semiconductor integrated circuit device (including the formation of MOS transistors, the formation of contacts, the formation of multi-layer wirings, etc.). Specifically, the resistance defect monitoring device can be manufactured only with two photolithography steps, one in the step of patterning the silicon film 153 and the other in the step of patterning the silicification-preventing second insulating film 155. Thus, since the resistance defect monitoring device of the present invention can be manufactured in a very short process TAT, it is possible to quickly assess a resistance variation defect in the gate electrode wiring (a soft-open defect due to a line break in the silicide layer), whereby the assessment results can be quickly fed back to the process.

Note that while the semiconductor substrate 151 being a test wafer is used in the present embodiment, it is understood that the test wafer is not limited to a semiconductor substrate.

Moreover, while a polysilicon film or an amorphous silicon film is used as the film from which the gate electrode wiring is formed in the present embodiment, it is understood that any other suitable silicon-containing film may be used.

Tenth Embodiment

A method for manufacturing a resistance defect assessment device (resistance defect monitoring device) according to the tenth embodiment of the present invention will now be described with reference to the drawings. Specifically, the method of the present embodiment is a method for forming the resistance defect test pattern 102 and the calibration pattern 121 (at least one of the calibration patterns in a case where there are a plurality of types of calibration patterns) in the resistance defect monitoring device according to one of the second to sixth embodiments. Note that the present embodiment is directed to manufacturing a resistance defect monitoring device for assessing a soft-open defect occurring in a silicified source/drain impurity layer of a MOS transistor provided in a semiconductor integrated circuit device.

FIG. 17A to FIG. 17H are cross-sectional views illustrating steps in the method for manufacturing a resistance defect monitoring device of the tenth embodiment.

Figure 17A:
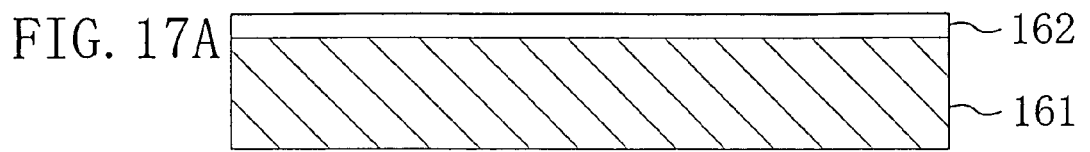
FIG. 17A to FIG. 17H are cross-sectional views illustrating steps in a method for manufacturing a resistance defect monitoring device according to the tenth embodiment of the present invention.
Figure 17B:
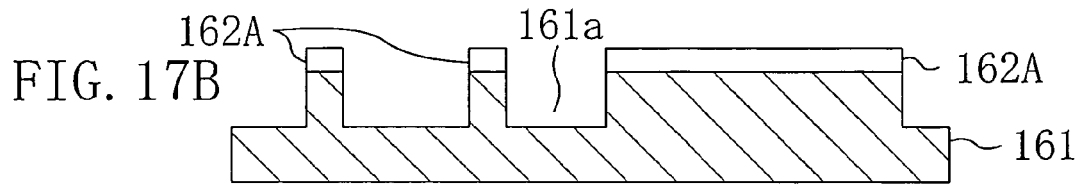

First, a first insulating film 162 is formed on a semiconductor substrate 161 made of a test wafer as illustrated in FIG. 17A, and then a resist pattern (not shown) is formed by a photolithography process so as to cover the resistance defect test pattern region and the calibration pattern region. Then, the first insulating film 162 is etched using the resist pattern as a mask so as to pattern the first insulating film 162 into a resistance defect test pattern and a calibration pattern as illustrated in FIG. 17B. Then, the semiconductor substrate 161 is etched using a patterned first insulating film 162A as a mask so as to form a trench 161a.

Figure 17C:
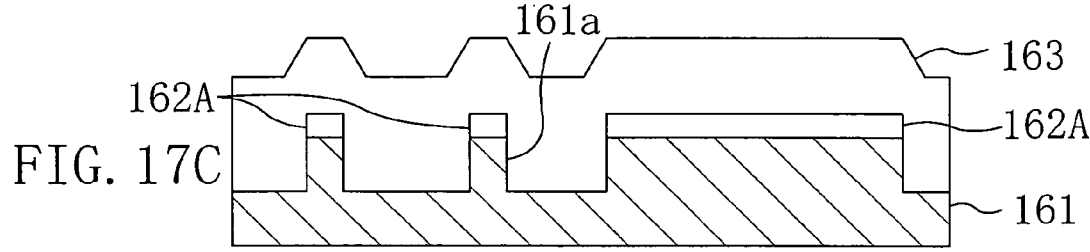
Figure 17D:
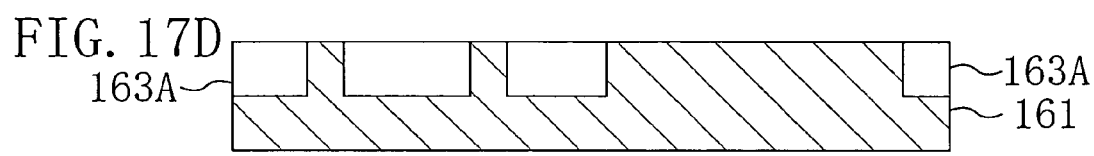
Figure 17E:
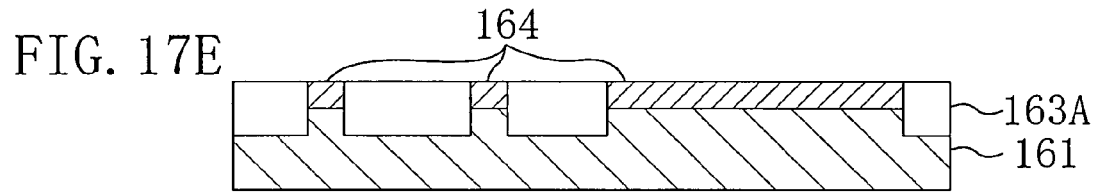

Then, a second insulating film 163 is formed to fill the trench 161a as illustrated in FIG. 17C, and then the second insulating film 163 is flattened by CMP (chemical mechanical polishing), after which the first insulating film 162A is removed to form a trench isolation 163A, as illustrated in FIG. 17D. Then, an exposed surface portion of the semiconductor substrate 161 (where the trench isolation 163A is not formed) is implanted with impurity ion and then subjected to a heat treatment, thereby forming an impurity layer 164 in the exposed surface portion of the semiconductor substrate 161, as illustrated in FIG. 17E.

Figure 17F:
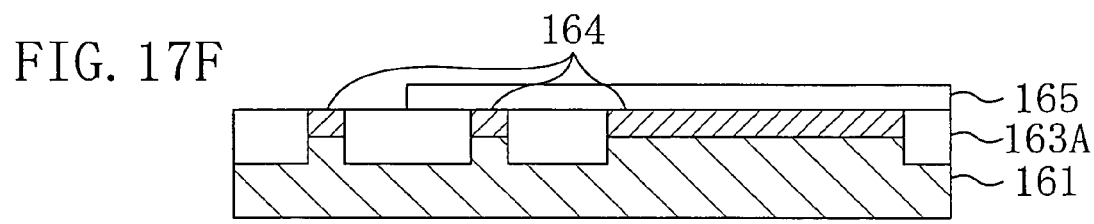

Then, a silicification-preventing third insulating film 165 is deposited on the semiconductor substrate 161, and then a resist pattern (not shown) is formed by a photolithography process so as to cover the non-silicified region, after which the third insulating film 165 is etched using the resist pattern as a mask, as illustrated in FIG. 17F. As a result, there are a silicified region where the third insulating film 165 has been etched away, and a non-silicified region where the third insulating film 165 is left unremoved.

Figure 17G:
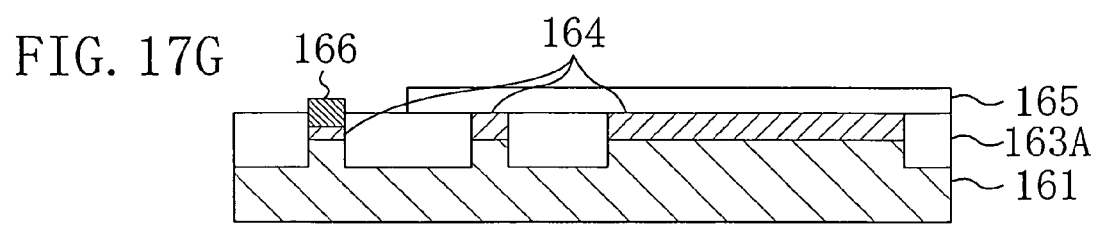

Then, a silicide layer 166 is formed by a salicide process in an upper portion of the impurity layer (silicon layer) 164 in the silicified region, thus obtaining a source/drain impurity layer, as illustrated in FIG. 17G. In this step, the third insulating film 165 prevents the formation of the silicide layer 166 in an upper portion of the impurity layer 164 in the non-silicified region.

Although not shown, an additional insulating film may be deposited after the formation of the silicide layer 166 and an upper portion thereof above the measurement pad (probing pad) may be removed, in order to prevent a surface leak current from influencing the measurement of the resistance of each of the resistance defect test pattern and the calibration pattern, which is to be performed after the resistance defect monitoring device is manufactured. Moreover, an interlayer film may be formed on the measurement pad with a contact hole formed in the interlayer film, and an additional metal pad may be provided in the contact hole, in order to prevent a leak current from occurring in the measurement pad section when contacted by a probe needle.

Figure 17H:
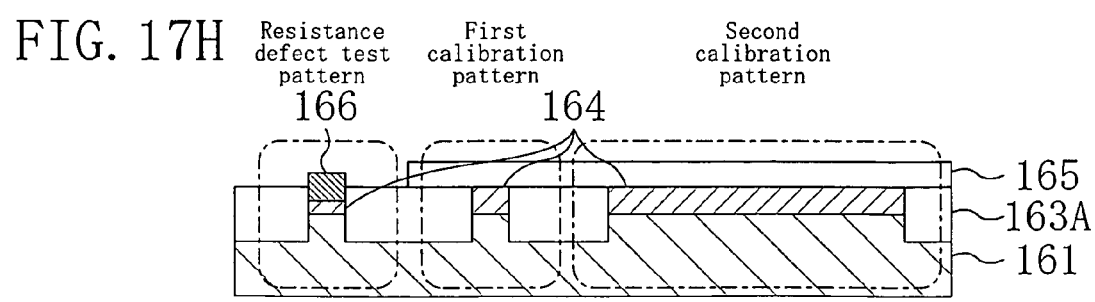

Thus, with the process of the tenth embodiment, it is possible to manufacture a resistance defect monitoring device for detecting a resistance variation defect in the source/drain impurity layer silicified by the salicide process (specifically, a soft-open defect due to a line break in the silicide layer). For example, it is possible to manufacture a resistance defect monitoring device as illustrated in FIG. 17H, including a resistance defect test pattern, which includes the silicide layer 166, a first calibration pattern, which does not include the silicide layer 166 and has the same width as that of the resistance defect test pattern, and a second calibration pattern, which does not include the silicide layer 166 and has a width at least five times as large as that of the resistance defect test pattern.

Thus, according to the tenth embodiment, the resistance defect monitoring device of one of the second to sixth embodiments can be manufactured in a very short process TAT, as compared with the manufacturing process of a semiconductor integrated circuit device (including the formation of MOS transistors, the formation of contacts, the formation of multi-layer wirings, etc.). Specifically, the resistance defect monitoring device can be manufactured only with two photolithography steps, one in the step of patterning the first insulating film 162 for forming the trench isolation 163A and the other in the step of patterning the silicification-preventing third insulating film 165. Thus, since the resistance defect monitoring device of the present invention can be manufactured in a very short process TAT, it is possible to quickly assess a resistance variation defect in the gate electrode wiring (a soft-open defect due to a line break in the silicide layer), whereby the assessment results can be quickly fed back to the process.

Note that it is preferred in the present embodiment that the semiconductor substrate 161 being a test wafer is a silicon-containing substrate (including a substrate in which a silicon-containing layer is formed in the surface thereof) such as, for example, a silicon substrate.

The first to tenth embodiments have been described above mostly with respect to a case where a soft-open defect is a line break in the silicide layer of the gate electrode wiring or the source/drain impurity layer. However, the soft-open defect detection method or the yield assessment method of the present invention is not limited to the assessment of a soft-open defect due to a line break in the silicide layer, but may also be useful in the assessment of a soft-open defect in a metal wiring made of aluminum, copper, or the like. Moreover, the present invention can also be applied to the assessment of a soft-open defect in a contact section, or the like, connecting the impurity layer with the upper wiring layer in a transistor, etc., or to the assessment of a soft-open defect in a via section connecting a metal wiring with another metal wiring. Furthermore, a current value abnormality in a MOS transistor assembly, a bipolar transistor assembly, a pn-junction diode, or the like, may be considered as a resistance increase defect (soft-open defect) in a resistive element as used in its broad sense. Therefore, the soft-open defect detection method or the yield assessment method of the present invention can be used in detecting an abnormality in a transistor, a diode, or the like, in which case the present invention will provide significant advantages.

Eleventh Embodiment

A contact resistance defect assessment device (contact resistance defect monitoring device) according to the eleventh embodiment of the present invention will now be described with reference to the drawings. Specifically, the device of the present embodiment is an assessment device provided on a wafer (test wafer) for assessing a resistance variation defect in a contact provided in a semiconductor integrated circuit device.

Figure 18A:
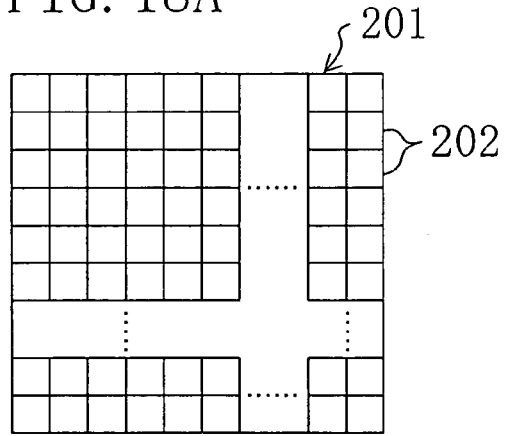
FIG. 18A is a plan view illustrating a one-chip area of a contact resistance defect monitoring device according to the eleventh embodiment of the present invention.

FIG. 18A is a plan view illustrating a one-chip area (or one-shot area) of the contact resistance defect monitoring device of the present embodiment. Referring to FIG. 18A, a chip area 201 (hereinafter referred to simply as the "chip 201") is divided into a plurality of blocks 202 (e.g., 25000 blocks in the present embodiment), and one contact chain resistor pattern as a contact defect test pattern is provided in each block 202. Note that each contact chain resistor pattern of the present embodiment includes a number of contacts such that it is possible to measure a resistance variation component to be a resistance variation defect occurring in a contact to be assessed. In other words, each contact chain resistor pattern of the present embodiment includes a number of contacts (e.g., 198 contacts in the present embodiment) that is predicted by the resistance measurement precision. Moreover, each contact of the contact chain resistor pattern of the present embodiment has substantially the same structure as that of the contact to be assessed.

Figure 18B:
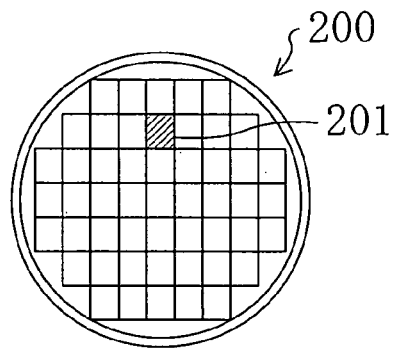
FIG. 18B illustrates the contact resistance defect monitoring devices of FIG. 18A being regularly arranged across the surface of a wafer.

FIG. 18B illustrates the contact resistance defect monitoring devices (each provided in a one-chip area) of the present embodiment shown in FIG. 18A being regularly arranged across the surface of a wafer 200. Referring to FIG. 18B, the chips 201 are provided at 51 positions on the principal plane of the wafer 200 in the present embodiment. Thus, each wafer includes 25000×51=1275000 contact chain resistor patterns. Note that the blocks 202 are regularly arranged in the surface of the wafer 200 or in each chip 201 (or in each shot area).

Figure 18C:
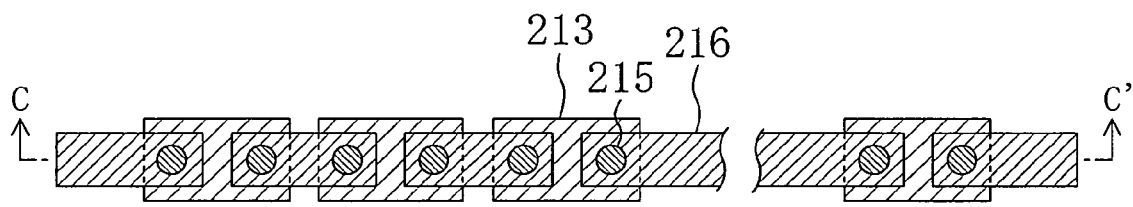
FIG. 18C is a plan view illustrating an example of a contact chain resistor pattern in the resistance defect monitoring device of FIG. 18A.
Figure 18D:
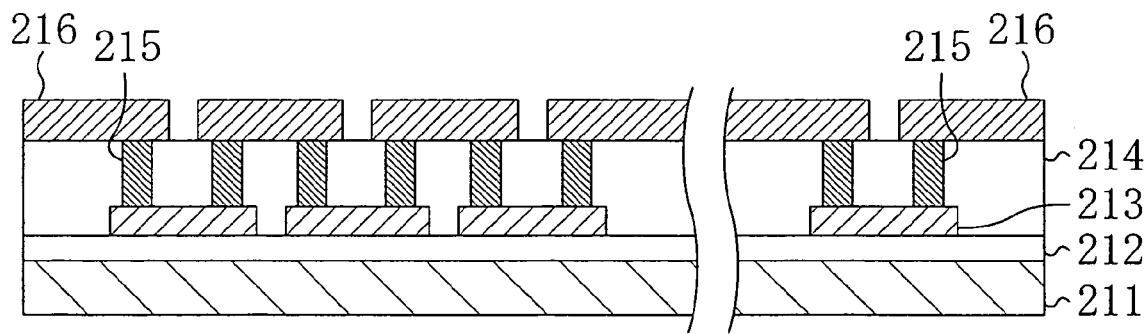
FIG. 18D is a cross-sectional view taken along line c-c' of FIG. 18C.

FIG. 18C is a plan view illustrating an example of the contact chain resistor pattern of the present embodiment, and FIG. 18D is a cross-sectional view taken along line c-c' of FIG. 18C.

Referring to FIG. 18C and FIG. 18D, a plurality of lower-layer wirings 213 formed from a polysilicon layer or an amorphous silicon layer, for example, are provided on an insulating film 212 on a substrate 211 made of silicon, for example. An interlayer insulating film 214 is formed over the insulating film 212 and the lower-layer wirings 213, and a plurality of contact electrodes (contact holes) 215 connected to the lower-layer wirings 213 are formed in the interlayer insulating film 214. Moreover, a plurality of upper-layer metal wirings 216 are formed on the interlayer insulating film 214 so as to be connected to the contact electrodes 215. The lower-layer wirings 213 and the upper-layer metal wirings 216 are connected to each other via the contact electrodes 215 therebetween, thus forming a contact chain resistor pattern as illustrated in FIG. 18C. Note that the silicon substrate 211, the insulating film 212 and the interlayer insulating film 214 are not shown in FIG. 18C for the sake of simplicity. Alternatively, instead of providing the insulating film 212 and the lower-layer wiring 213, a transistor source/drain impurity layer may be formed on the surface of the silicon substrate 211 with contact electrodes being formed so as to connect the source/drain impurity layer with the upper-layer wirings.

How the number n of contacts to be provided in the contact chain resistor pattern of FIG. 18C is determined will now be described with reference to FIG. 19.

Figure 19:
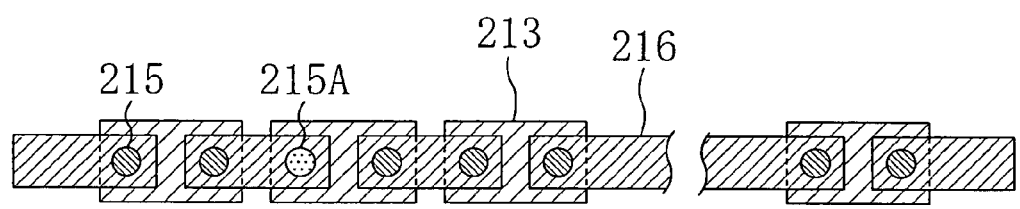
FIG. 19 illustrates how the number of contacts in a contact chain resistor pattern in the contact resistance defect monitoring device is determined according to the eleventh embodiment of the present invention.

Referring to FIG. 19, consider a case where one contact electrode 215A becomes defective in a contact chain resistor pattern in which the lower-layer wirings 213 and the upper-layer metal wirings 216 are connected to one another by the contact electrodes 215. The resistance value Rc of the contact chain resistor pattern is:

$$Rc = n \times rc + \Delta r$$

where rc is the resistance value of one normal contact electrode 215, rc+Δr is the resistance value of the defective contact electrode 215A, and n is the total number of contacts. Therefore, in order to detect, with a precision of 1% or more with respect to the overall resistance Rc of the contact chain resistor pattern, a resistance variation component due to a defect in one contact electrode 215, for example, the following relationship:

$$(\Delta r/Rc) \times 100 = (\Delta r/(n \times rc + \Delta r)) \times 100 \geq 1\%$$

needs to hold true. Thus, the following relationship:

$$n \leq 99 \times \Delta r/rc$$

needs to be satisfied.

Therefore, where the resistance of one normal contact electrode is rc=20 Ω/Co ("/Co" means "per one contact electrode") and the resistance variation component of one defective contact electrode is Δr=40 Ω/Co, in order to detect, with a precision of 1% with respect to the overall resistance of the contact chain resistor pattern, a resistance variation component due to a defect in one contact electrode (i.e., in order to detect the resistance variation even if the ratio of the resistance variation component of one defective contact electrode with respect to the resistance value of one normal contact electrode is Δr/rc=2), the number n of contacts in a contact chain resistor pattern needs to satisfy the following expression.

$$n = 99 \times 40/20 = 198$$

For this reason, each contact chain resistor pattern includes n=198 contacts in the present embodiment.

The number P of contact chain resistor patterns (each including 198 contacts) to be arranged in a one-chip area (or one-shot area) is calculated as follows.

Recently, a semiconductor integrated circuit device uses a very large number of contacts therein. For example, in a 0.13 μm-rule chip having an area of about 40 mm², the number of contacts used for the transistor-wiring layer connection can be as large as about 5,000,000 to about 30,000,000. For example, when assessing contact defects in a semiconductor integrated circuit device A using N=10,000,000 contacts therein, the number P0 of contact chain resistor patterns needed so as to completely accommodate the contact count N=10,000,000 is calculated as follows.

$$P0 = N/n = 1 \times 10^7/198 = 50505$$

In the present embodiment, the number P of contact chain resistor patterns is set in the range from N/n×1/10 to N/n×10. Specifically, P=25000 (the total number of contacts included in 25000 contact chain resistor patterns is 25000×198=about 4,900,000), which is roughly one half of N/n, is selected in the present embodiment. The reason for this is as follows.

Figure 20:
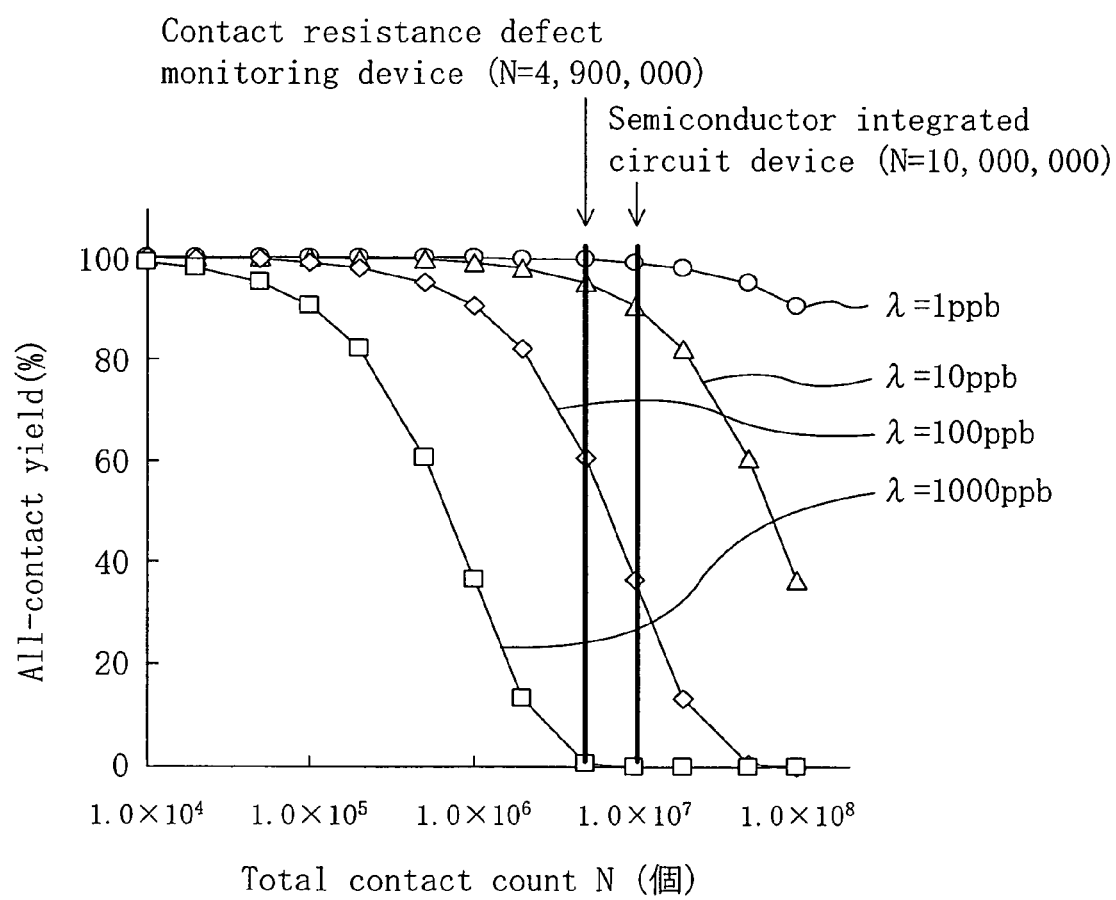
FIG. 20 illustrates how the number of contact chain resistor patterns in a one-chip area of the contact resistance defect monitoring device is determined according to the eleventh embodiment of the present invention.

FIG. 20 illustrates the relationship between the total contact count N (the total number of contacts provided in the semiconductor integrated circuit device or the total number of contacts included in all the contact chain resistor patterns in the contact resistance defect monitoring device) and the all-contact yield (%) (the yield of a one-chip area of the semiconductor integrated circuit device or the contact resistance defect monitoring device). Note that in FIG. 20, the total contact count N is represented along the horizontal axis and the all-contact yield along the vertical axis. The all-contact yield of a one-chip area of the contact resistance defect monitoring device is as follows:

$$\text{Yield} = \text{EXP}(-\lambda \times N)$$

where λ is the 1-contact defect occurrence rate. FIG. 20 shows the results of calculating the all-contact yield using the expression above for various total contact counts N, for each of different 1-contact defect occurrence rates λ of 1 ppb (ppb: parts per billion), 10 ppb, 100 ppb and 1000 ppb.

Referring to FIG. 20, where the total contact count N of the contact resistance defect monitoring device is the same (10,000,000) as that of the product (a semiconductor integrated circuit device), the same yield is obtained, whereby it is possible to assess the yield of the product using the results obtained for the contact resistance defect monitoring device. In this case, the number of contact chain resistor patterns needs to be 50505, as described above. In contrast, N=25000 in the present embodiment. In this case, referring to FIG. 20, the total contact count N of the contact resistance defect monitoring device is 4,900,000, and the all-contact yield is calculated to be higher than the yield of the product. However, the calculated value is sufficient for performing the product yield assessment (yield estimation) using the yield conversion expression.

Thus, if the number of contact chain resistor patterns needed to be inserted in one chip is set in the range from N/n×1/10 to N/n×10, where n is the number of contacts in a contact chain resistor pattern and N is the total number of contacts in an integrated circuit device, it is possible to estimate the yield of the product based on the yield obtained for the contact resistance defect monitoring device.

As described above, in the contact defect monitoring device of the eleventh embodiment, the contact chain resistor pattern has a number of contacts such that it is possible to measure a resistance variation component to be a resistance variation defect. Specifically, the contact chain resistor pattern of the present embodiment has a number of contacts such that it is possible to detect, with a precision of 1% with respect to the overall resistance of the contact chain resistor pattern, the resistance variation component Δr (Δr/rc=2 where rc is the resistance value of one contact) in one contact. Therefore, it is possible to accurately assess a soft-open defect in some of the contacts, e.g., one of a large number of contacts. Moreover, the number of contact chain resistor patterns provided in each chip 201 on the wafer 200 is such that it is possible to perform the yield assessment for all contacts provided in the semiconductor integrated circuit device (e.g., 25000 in the present embodiment). Therefore, it is possible to perform the yield assessment for all contacts provided in the semiconductor integrated circuit device by measuring the resistance of each contact chain resistor pattern in each chip 201 and detecting the number of soft-open defects based on the measurement results. Specifically, it is possible to perform the yield assessment of the product (a semiconductor integrated circuit device) taking into consideration a soft-open defect being a resistance variation defect that is equal to or greater than Δr/rc=2 per contact, i.e., to assess the influence of the soft-open defect on the product yield.

Note that in the eleventh embodiment, the contact defect monitoring devices are provided on a wafer, one for each one-chip area (the chip 201) corresponding to a semiconductor integrated circuit device. Alternatively, the contact defect monitoring devices may be provided on a wafer, one for each one-shot area, which is the area to be exposed to light in a single shot in the photolithography process. An one-shot area may include an area where the contact chain resistor pattern is not provided. Similarly, in the present embodiment, the chip 201 may include an area where the contact chain resistor pattern is not provided.

Moreover, while the range where it is possible to measure a resistance variation component to be a defect is set to be:

(Δr/Rc)×100=(Δr/(n×rc+Δr))×100≧1%

(where Rc is the overall resistance (=n×rc+Δr) of the contact chain resistor pattern, n is the number of contacts in a contact chain resistor pattern, rc is the resistance value of one normal contact electrode, Δr is the resistance variation component occurring in one defective contact electrode) in the eleventh embodiment, it is understood that the present invention is not limited to this range.

Moreover, it is preferred that (Δr/Rc)×100 is 1 (100%). Since a test pattern is typically assessed to be good if the resistance variation thereof is within ±10% of the target value, it is only required that a resistance variation component that is 100% or less can be detected. If a complete line break occurs, the magnitude of the resistance variation component to be detected is infinite (∞%), whereby the resistance defect assessment can be performed by using a conventional large contact chain resistor pattern. Therefore, in order to distinguish the resistance defect assessment of the present invention from that performed by using such a conventional large contact chain resistor pattern, (Δr/Rc)× >100 may be 10000% or less.

Moreover, while it is assumed in the eleventh embodiment that a resistance variation defect occurs at one position in a contact chain resistor pattern, it is understood that the present embodiment can be used in cases where a resistance variation defect occurs at two or more positions in a contact chain resistor pattern.

Moreover, in the eleventh embodiment, the type of the contact to be assessed is not limited to any particular type, but may be, for example, a contact electrode obtained by forming a refractory metal film or a metal film to fill a contact hole. Moreover, the type of the base pattern underlying the contact to be assessed (a conductor electrically connected to a lower portion of the contact) is not limited to any particular type, but may be, for example, a gate electrode wiring layer, a source/drain impurity layer or a lower metal wiring layer.

Twelfth Embodiment

A contact resistance defect assessment device (contact resistance defect monitoring device) according to the twelfth embodiment of the present invention will now be described with reference to the drawings. Specifically, the device of the present embodiment is an assessment device provided on a wafer (test wafer) for assessing a resistance variation defect in a contact provided in a semiconductor integrated circuit device.

Note that in the contact resistance defect monitoring device of the present embodiment, as in the eleventh embodiment (see FIG. 18B), contact chain resistor patterns each having a number of (e.g., 198) contacts such that it is possible to measure a resistance variation component to be a resistance variation defect in the contact to be assessed are provided in each of the chips 201, which are provided at a plurality of (e.g., 51) positions on the wafer 200. A contact chain resistor pattern includes contacts each having substantially the same structure as that of the contact to be assessed. Moreover, as in the eleventh embodiment (see FIG. 18A), each chip 201 is divided into a number of (e.g., 25000) blocks 202 such that it is possible to assess the yield of a semiconductor integrated circuit device, and one contact chain resistor pattern as a contact defect test pattern is provided in each block 202. Therefore, in the present embodiment, the total number of contact chain resistor patterns per wafer is 25000×51=1275000.

Figure 21A:
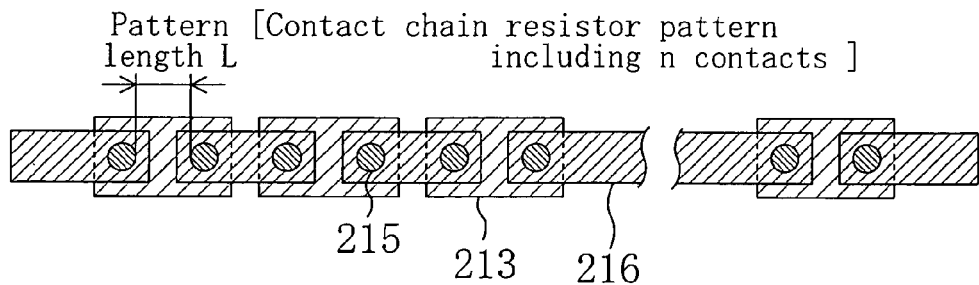
FIG. 21A is a plan view illustrating an example of a contact chain resistor pattern in a contact resistance defect monitoring device according to the twelfth embodiment of the present invention, and FIG. 21B to FIG. 21D each illustrate an example of a first calibration pattern set in the contact resistance defect monitoring device according to the twelfth embodiment of the present invention.

FIG. 21A is a plan view illustrating an example of a contact chain resistor pattern of the present embodiment. Note that in FIG. 21A, the same members as those of the contact chain resistor pattern of the eleventh embodiment illustrated in FIG. 18C are denoted by the same reference numerals and will not be further described below. The number of contacts in the contact chain resistor pattern illustrated in FIG. 21A is n, and the distance between the contact electrodes 215 electrically connected to each other by the lower-layer wiring 213 (base pattern) in the contact chain resistor pattern (hereinafter the distance will be referred to simply as the "pattern length"), i.e., the pattern length of the semiconductor integrated circuit device to be assessed, is L.

Figure 21B:
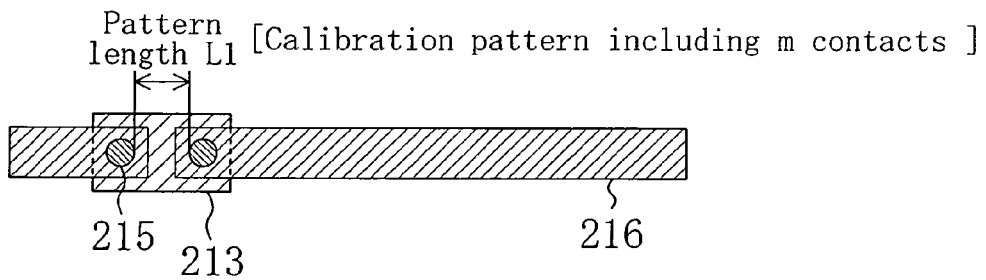
Figure 21C:
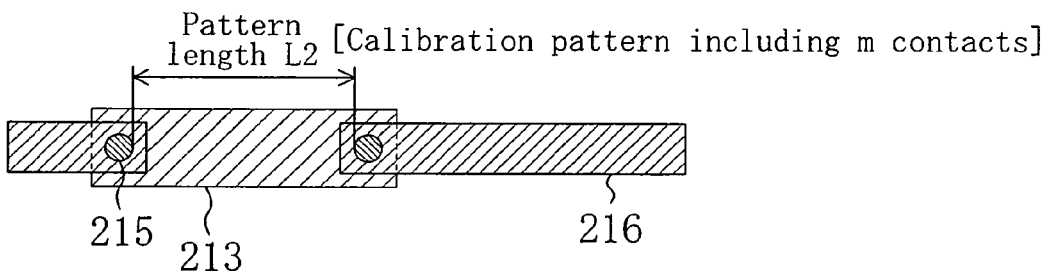
Figure 21D:
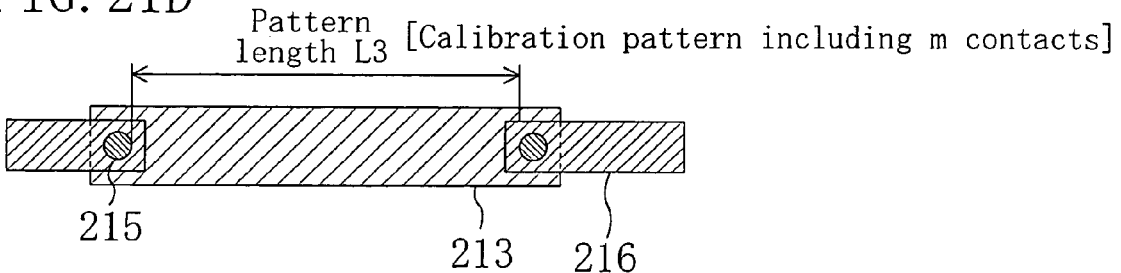

FIG. 21B to FIG. 21D are plan views illustrating an example of a plurality of first calibration patterns provided in the vicinity of the contact chain resistor pattern in each block 202. Each first calibration pattern is used for calibrating the resistance value of the base pattern, which dictates the resistance value of the contact chain resistor pattern. Note that in FIG. 21B to FIG. 21D, the same members as those of the contact chain resistor pattern of the eleventh embodiment illustrated in FIG. 18C are denoted by the same reference numerals and will not be further described below. The first calibration pattern illustrated in FIG. 21B has a pattern length L1 substantially equal to the pattern length L of the pattern to be assessed, the first calibration pattern illustrated in FIG. 21C has a pattern length L2 greater than the pattern length L1, and the first calibration pattern illustrated in FIG. 21D has a pattern length L3 greater than the pattern length L2. Each of the first calibration patterns includes a number m of contacts.

The twelfth embodiment as described above provides the following advantage in addition to those obtained in the eleventh embodiment. That is, three calibration patterns having different pattern lengths of L1, L2 and L3 are provided in the same block 202 in addition to one contact chain resistor pattern, whereby it is possible to calibrate the variations in the resistance value among the base patterns (e.g., the polysilicon electrode wiring layers or the source/drain impurity layers), which may influence the resistance value of the contact chain resistor pattern. Thus, it is possible to precisely assess the resistance of the contact chain resistor pattern, whereby it is possible to more precisely detect a soft-open defect.

Note that in the twelfth embodiment, the type of the base pattern of the contact chain resistor pattern or the calibration pattern, i.e., the base pattern of the contact to be assessed, is not limited to any particular type, but may be, for example, a gate electrode wiring layer, a source/drain impurity layer or a lower metal wiring layer.

Moreover, while a set of first calibration patterns having three different pattern lengths, including one being equal to the pattern length L of the pattern to be assessed, in the twelfth embodiment, the number of pattern lengths to be used in the first calibration pattern set and the value of each pattern length are not limited to those described above.

Thirteenth Embodiment

A contact resistance defect assessment device (contact resistance defect monitoring device) according to the thirteenth embodiment of the present invention will now be described with reference to the drawings. Specifically, the device of the present embodiment is an assessment device provided on a wafer (test wafer) for assessing a resistance variation defect in a contact provided in a semiconductor integrated circuit device.

Note that in the contact resistance defect monitoring device of the present embodiment, as in the twelfth embodiment, contact chain resistor patterns each having a number of (e.g., 198) contacts such that it is possible to measure a resistance variation component to be a resistance variation defect in the contact to be assessed are provided in each of the chips 201, which are provided at a plurality of (e.g., 51) positions on the wafer 200. A contact chain resistor pattern includes contacts each having substantially the same structure as that of the contact to be assessed. Moreover, each chip 201 is divided into a number of (e.g., 25000) blocks 202 such that it is possible to assess the yield of a semiconductor integrated circuit device, and one contact chain resistor pattern as a contact defect test pattern is provided in each block 202. Therefore, in the present embodiment, the total number of contact chain resistor patterns per wafer is 25000×51=1275000.

Figure 22A:
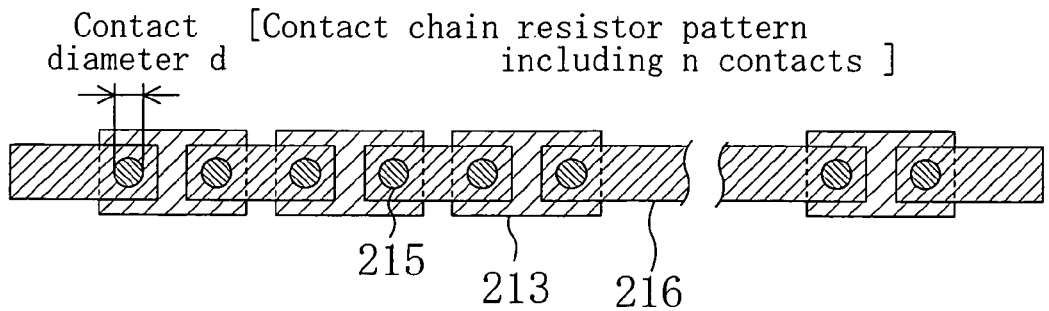
FIG. 22A is a plan view illustrating an example of a contact chain resistor pattern in a contact resistance defect monitoring device according to the thirteenth embodiment of the present invention, and FIG. 22B to FIG. 22D each illustrate an example of a second calibration pattern set in the contact resistance defect monitoring device according to the thirteenth embodiment of the present invention.

FIG. 22A is a plan view illustrating an example of a contact chain resistor pattern of the present embodiment. Note that in FIG. 22A, the same members as those of the contact chain resistor pattern of the eleventh embodiment illustrated in FIG. 18C are denoted by the same reference numerals and will not be further described below. The number of contacts in the contact chain resistor pattern illustrated in FIG. 22A is n, and the diameter of each contact electrode 215 in the contact chain resistor pattern, i.e., the contact diameter of the semiconductor integrated circuit device to be assessed, is d.

Figure 22B:
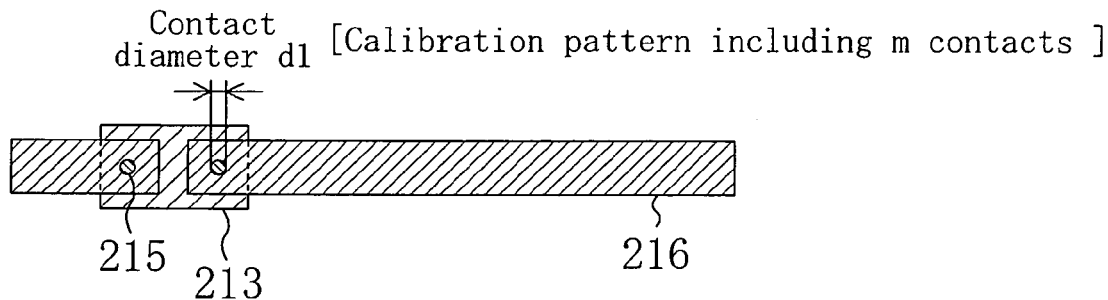
Figure 22C:
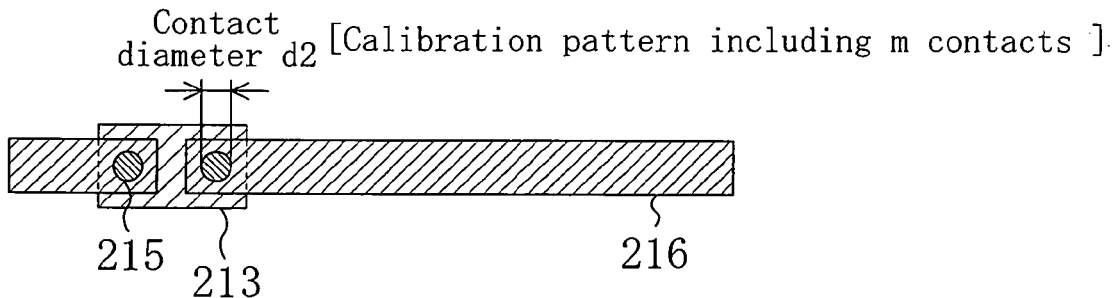
Figure 22D:
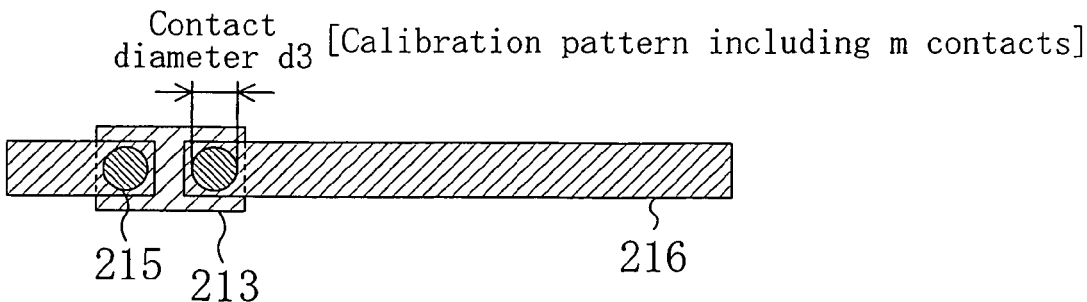

FIG. 22B to FIG. 22D are plan views illustrating an example of a plurality of second calibration patterns provided in the vicinity of the contact chain resistor pattern in each block 202. Each second calibration pattern is used for assessing the dependency of the contact chain resistor pattern on the contact diameter. Note that in FIG. 22B to FIG. 22D, the same members as those of the contact chain resistor pattern of the eleventh embodiment illustrated in FIG. 18C are denoted by the same reference numerals and will not be further described below. The second calibration pattern illustrated in FIG. 22B has a contact diameter d1 smaller than a contact diameter d of the contact to be assessed, the second calibration pattern illustrated in FIG. 22C has a contact diameter d2 substantially the same as the contact diameter d, and the second calibration pattern illustrated in FIG. 22D has a contact diameter d3 larger than the contact diameter d. Each of the second calibration patterns includes a number m of contacts.

The thirteenth embodiment as described above provides the following advantage in addition to those obtained in the eleventh embodiment. That is, three calibration patterns having different contact diameters of d1, d2 and d3 are provided in the same block 202 in addition to one contact chain resistor pattern, whereby it is possible to calibrate the influence of the contact dimension variations on the resistance value of the contact chain resistor pattern in the wafer surface and in a chip area or a shot area by measuring the resistance value of each calibration pattern. Moreover, it is possible to assess the margin of the contact dimension.

Note that in the thirteenth embodiment, the type of the base pattern of the contact chain resistor pattern or the calibration pattern, i.e., the base pattern of the contact to be assessed, is not limited to any particular type, but may be, for example, a gate electrode wiring layer, a source/drain impurity layer or a lower metal wiring layer.

Moreover, while a set of second calibration patterns having three different contact diameters, including one being equal to the contact diameter d of the pattern to be assessed, in the thirteenth embodiment, the number of contact diameters to be used in the second calibration pattern set and the value of each contact diameter are not limited to those described above.

Moreover, in the thirteenth embodiment, a set of first calibration patterns of the twelfth embodiment may be provided in the block 202 in addition to one contact chain resistor pattern and a set of second calibration patterns.

Fourteenth Embodiment

A contact resistance defect assessment method (contact resistance defect monitoring method) according to the fourteenth embodiment of the present invention will now be described with reference to the drawings. Specifically, the method of the present embodiment is a method for assessing a resistance variation defect (soft-open defect) in a contact provided in a semiconductor integrated circuit device by using the contact resistance defect monitoring device of the twelfth embodiment. The contact resistance defect monitoring device of the twelfth embodiment includes, in each block, a set of first calibration patterns having three different pattern lengths of L1 (=the pattern length L of the pattern to be assessed), L2 and L3 for calibrating the resistance value of the base pattern (e.g., a gate electrode wiring layer or a source/drain impurity layer), which dictates the resistance value of the contact chain resistor pattern, in addition to one contact chain resistor pattern.

In the first step, the contact resistance defect monitoring device of the twelfth embodiment illustrated in FIG. 21A to FIG. 21D is used to measure the resistance value of each of the contact chain resistor pattern and the first calibration patterns in each of the blocks, which are regularly arranged in the wafer surface and in a chip area or a shot area, at a plurality of positions in the wafer surface and in each chip area (or each shot area).

Then, in the second step, the pattern lengths L1, L2 and L3 and the resistance values r1, r2 and r3 of the first calibration patterns having the pattern lengths L1, L2 and L3, respectively, in each block measured in the first step are plotted along the X axis and the Y axis, respectively, to obtain a graph. FIG. 23A illustrates an example of the obtained graph. Then, the per-contact resistance value rc in the contact chain resistor pattern in the block is calculated by the following expression:

$$rc = Rr/m$$

where Rr is the value of the Y-intercept in the obtained graph. Note that m is the number of contacts in each first calibration pattern, and m=2 in the present embodiment. In the calculation of the per-contact resistance value rc, the resistance value of the upper pattern for connecting the contacts to each other (e.g., the upper-layer metal wiring 216 illustrated in FIG. 21A to FIG. 21D) is negligible.

Then, in the third step, the per-contact resistance value rc calculated in the second step and the resistance value Rc of the contact chain resistor pattern in each block measured in the first step are plotted along the X axis and the Y axis, respectively. FIG. 23B illustrates an example of the obtained graph. As can be seen from FIG. 23B, the per-contact resistance value rc varies due to variations in the contact diameter among the contact chain resistor patterns in the wafer surface and in a chip area or a shot area, or the like. Therefore, by plotting the resistance value Rc of the contact chain resistor pattern with respect to various values of rc, it is possible to extract, from the measurement results, a contact chain resistor pattern whose resistance value Rc is increased discretely. In other words, where the resistance value of one contact in the contact chain resistor pattern is increased to cause a resistance increase defect (soft-open defect), it is possible to extract the contact chain resistor pattern where the resistance increase defect has occurred.

In the fourth step, following the third step, each point where the resistance value Rc of the contact chain resistor pattern is increased discretely is extracted based on the graph obtained in the third step, thus detecting a soft-open defect in the contact chain resistor pattern.

As described above, the fourteenth embodiment employs the calibration patterns of the twelfth embodiment, thereby obtaining advantages similar to those of the twelfth embodiment. Specifically, by using the calibration patterns of the twelfth embodiment having different pattern lengths, it is possible to remove the base pattern (e.g., a polysilicon electrode wiring layer or a source/drain impurity layer) resistance component and thus to precisely obtain the value Rr (the value of the Y-intercept) or rc (the per-contact resistance value) in the measurement point (block). As a result, it is possible to eliminate the influence of the variations in the contact diameter, or the like, on the resistance value of the contact chain resistor pattern in the wafer surface and in a chip area or a shot area. Therefore, it is possible to plot the resistance values of the contact chain resistor patterns taking into consideration the contact diameter dependency, whereby it is possible to detect a soft-open defect in the contact chain resistor pattern. Moreover, by detecting the number of soft-open defects, it is possible to assess the yield of the semiconductor integrated circuit device. In other words, it is possible to assess the influence of the soft-open defect on the yield of the semiconductor integrated circuit device to be produced.

Note that in the fourteenth embodiment, the following process may be performed instead of plotting the resistance value Rc of the contact chain resistor pattern with respect to the per-contact resistance value rc in the third step. That is, using the per-contact resistance value rc calculated in the second step and the per-unit-area contact resistance value (predetermined value) ρc, the electrically-converted contact diameter d in each block is calculated by Expression 6 below:

$$d = (\rho c/(\pi \times rc))^{1/2} \quad \text{(Expression 6)}$$

Then, the calculated electrically-converted contact diameter d or the inverse thereof and the resistance value Rc of the contact chain resistor pattern in each block measured in the first step are plotted along the X axis and the Y axis, respectively, to obtain a graph. FIG. 23C illustrates an example of the obtained graph. Note that in FIG. 23C, the inverse 1/d of the electrically-converted contact diameter d and the resistance value Rc of the contact chain resistor pattern are plotted along the X axis and the Y axis, respectively. In the fourth step, each point where the resistance value Rc of the contact chain resistor pattern is increased discretely is extracted based on the graph obtained in the third step. Also in this way, a soft-open defect in the contact chain resistor pattern can be detected.

Fifteenth Embodiment

A contact resistance defect assessment method (contact resistance defect monitoring method) according to the fifteenth embodiment of the present invention will now be described with reference to the drawings. Specifically, the method of the present embodiment is a method for assessing a resistance variation defect (soft-open defect) in a contact provided in a semiconductor integrated circuit device by using the contact resistance defect monitoring device of the twelfth embodiment. The contact resistance defect monitoring device of the twelfth embodiment includes, in each block, a set of first calibration patterns having three different pattern lengths of L1 (=the pattern length L of the pattern to be assessed), L2 and L3 for calibrating the resistance value of the base pattern (e.g., a gate electrode wiring layer or a source/drain impurity layer), which dictates the resistance value of the contact chain resistor pattern, in addition to one contact chain resistor pattern.

As in the fourteenth embodiment, in the first step, the contact resistance defect monitoring device of the twelfth embodiment illustrated in FIG. 21A to FIG. 21D is used to measure the resistance value of each of the contact chain resistor pattern and the first calibration patterns in each of the blocks, which are regularly arranged in the wafer surface and in a chip area or a shot area, at a plurality of positions in the wafer surface and in each chip area (or each shot area).

Then, in the second step, the pattern lengths L1, L2 and L3 and the resistance values r1, r2 and r3 of the first calibration patterns having the pattern lengths L1, L2 and L3, respectively, in each block measured in the first step are plotted along the X axis and the Y axis, respectively, to obtain a graph. The obtained graph is similar to that of the fourteenth embodiment illustrated in FIG. 23A. Then, the per-unit-length resistance value of the base pattern of the contact chain resistor pattern in the block is calculated based on the gradient of the obtained graph. In the calculation of the per-unit-length resistance value of the base pattern, the resistance value of the upper pattern for connecting the contacts to each other (e.g., the upper-layer metal wiring 216 illustrated in FIG. 21A to FIG. 21D) is negligible. In other words, the gradient of the obtained graph represents the resistance value (per-unit-length resistance value) of the base pattern excluding the contact resistance and the upper pattern resistance, e.g., the per-unit-length resistance value Rg of the gate electrode wiring layer or the per-unit-length resistance value Rd of the source/drain impurity layer.

Then, in the third step, the adjusted value Rc' of the resistance value Rc of the contact chain resistor pattern is calculated by Expression 7 below:

$$Rc' = Rc \times Ru(Ave)/Ru \quad \text{(Expression 7)}$$

where Rc is the resistance value of the contact chain resistor pattern in each block measured in the first step, and Ru(Ave) is the average value of the per-unit-length resistance values Ru of the base patterns of all the contact chain resistor patterns on the wafer surface as calculated in the second step. Specifically, where the base pattern is a gate electrode wiring layer, the adjusted value Rc' of the resistance value Rc of the contact chain resistor pattern is calculated by Expression 8 below:

$$Rc' = Rc \times Rg(Ave)/Rg \quad \text{(Expression 8)}$$

where Ru=Rg and Ru(Ave)=Rg(Ave). Where the base pattern is a source/drain impurity layer, the adjusted value Rc' of the resistance value Rc of the contact chain resistor pattern is calculated by Expression 9 below:

$$Rc' = Rc \times Rd(Ave)/Rd \quad \text{(Expression 9)}$$

where Ru=Rd and Ru(Ave)=Rd(Ave).

Then, in the fourth step, a wafer-surface distribution map (or a chip-area or shot-area distribution map) of the adjusted value Rc' calculated in the third step is obtained.

Then, in the fifth step, each point where the adjusted value Rc' is increased discretely is extracted based on the distribution map obtained in the fourth step, thus detecting a resistance variation defect in the contact chain resistor pattern.

As described above, the fifteenth embodiment employs the calibration patterns of the twelfth embodiment, as does the fourteenth embodiment, thereby obtaining advantages similar to those of the twelfth embodiment. Specifically, by using the calibration patterns of the twelfth embodiment having different pattern lengths, it is possible to precisely obtain Ru (the per-unit-length resistance value of the base pattern) in the measurement point (block). As a result, it is possible to eliminate the influence of the variations in the resistance value of the base pattern, or the like, on the resistance value of the contact chain resistor pattern in the wafer surface and in a chip area or a shot area. Thus, it is possible to accurately adjust the resistance value Rc of the contact chain resistor pattern, whereby it is possible to detect a soft-open defect in the contact chain resistor pattern. Moreover, by detecting the number of soft-open defects, it is possible to assess the yield of the semiconductor integrated circuit device. In other words, it is possible to assess the influence of the soft-open defect on the yield of the semiconductor integrated circuit device to be produced.

Note that in the third step (particularly, Expressions 7 to 9) of the fifteenth embodiment, the average value Ru(Ave) (or Rg(Ave) or Rd(Ave)) corresponding to the average value Ru(Ave)) may be replaced by the average value Rushot(Ave) (or Rgshot(Ave) or Rdshot(Ave)) corresponding to the average value Rushot(Ave)) of the per-unit-length resistance values Ru of the base patterns of all the contact chain resistor patterns in one chip area or one shot area as calculated in the second step, or by the average value Rublock(Ave) (or Rgblock(Ave) or Rdblock(Ave)) corresponding to the average value Rublock(Ave)) of the per-unit-length resistance values Ru of the base patterns of all the contact chain resistor patterns in one of the blocks as calculated in the second step.

Sixteenth Embodiment

A method for manufacturing a contact resistance defect assessment device (contact resistance defect monitoring device) according to the sixteenth embodiment of the present invention will now be described with reference to the drawings. Specifically, the method of the present embodiment is a method for forming the contact chain resistor patterns and the calibration patterns (at least one of the calibration patterns in a case where there are a plurality of types of calibration patterns) in the contact resistance defect monitoring device according to the twelfth or thirteenth embodiment.

FIG. 24A to FIG. 24E are cross-sectional views illustrating steps in the method for manufacturing a contact resistance defect monitoring device of the sixteenth embodiment.

Figure 24A:
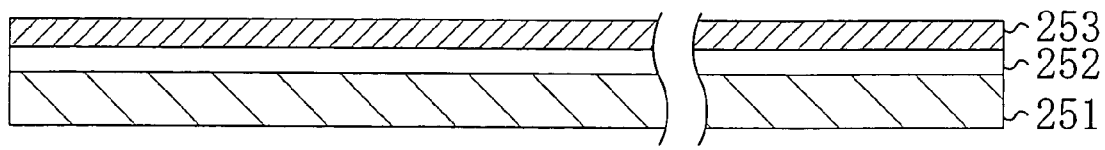

First, an insulating film 252 is formed on a silicon substrate 251 made of a test wafer, and then a first conductive film 253 (e.g., a polysilicon film or an amorphous silicon film) is deposited on the insulating film 252, as illustrated in FIG. 24A.

Figure 24B:
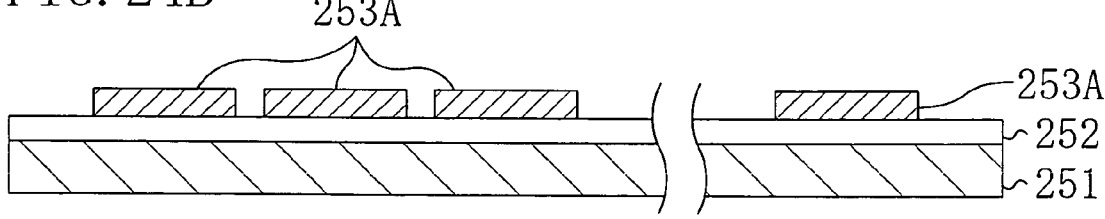

Then, a resist pattern (not shown) is formed by a photolithography process so as to cover the contact chain resistor pattern region and the calibration pattern region, and then the first conductive film 253 is etched using the resist pattern as a mask, thereby forming base patterns 253A for the contact chain resistor pattern and the calibration pattern, as illustrated in FIG. 24B. Although not shown, the method may include the step of forming a side wall insulating film on each side of the base pattern 253A or the step of silicifying an upper portion of the base pattern 253A, as necessary.

Figure 24C:
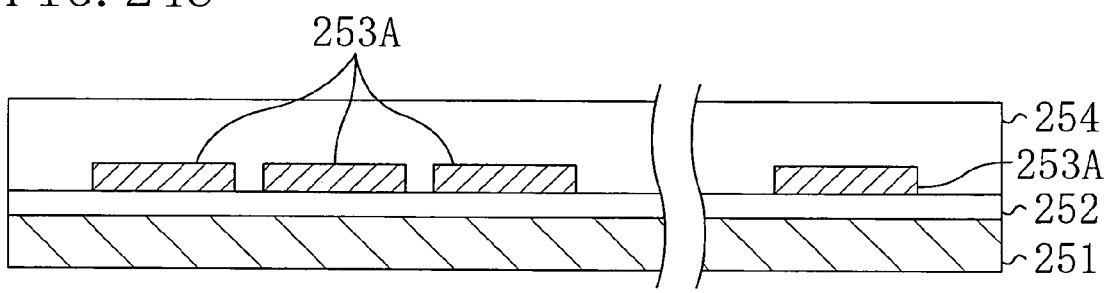

Then, an interlayer insulating film 254 is deposited on the silicon substrate 251, on which the base patterns 253A have been formed, as illustrated in FIG. 24C.

Figure 24D:
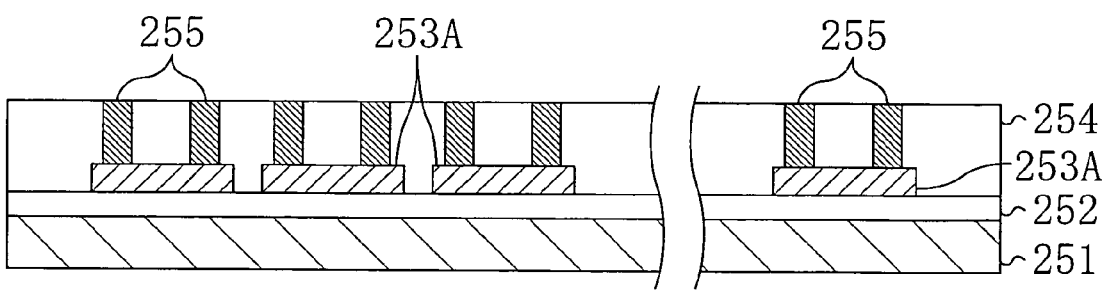

Then, a resist pattern (not shown) is formed by a photolithography process so as to cover the contact region, and then the interlayer insulating film 254 is dry-etched using the resist pattern as a mask, thereby forming a plurality of contact holes reaching the base patterns 253A, as illustrated in FIG. 24D. Then, a second conductive film made of a refractory metal, for example, is formed to fill each contact hole, and then portions of the second conductive film outside the contact holes, i.e., above the interlayer insulating film 254, are removed by CMP so as to leave the other portions of the second conductive film inside the contact holes, thereby forming a plurality of contact electrodes 255.

Figure 24E:
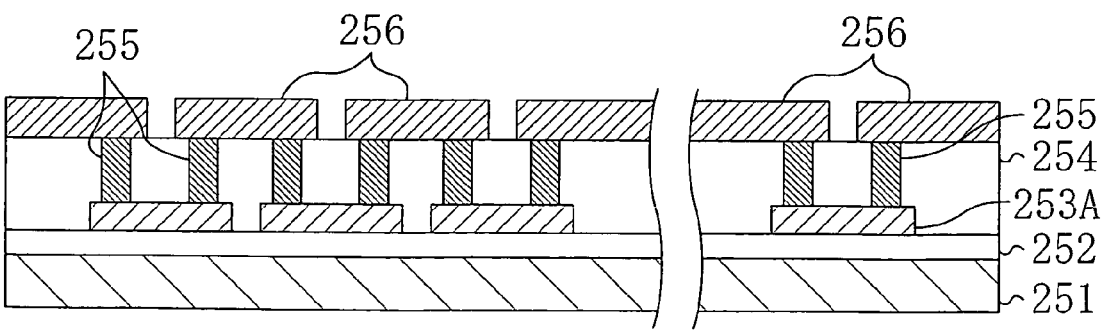

Finally, a third conductive film (a metal film from which lines are formed) is deposited over the contact electrodes 255 and the interlayer insulating film 254, and then a resist pattern (not shown) is formed by a photolithography process so as to cover the line region. Then, the third conductive film is dry-etched using the resist pattern as a mask, thereby forming a plurality of upper-layer metal wirings 256 electrically connected to the contact electrodes 255, as illustrated in FIG. 24E. Thus, the contact chain resistor pattern and the calibration pattern are obtained, in which the base patterns 253A and the upper-layer metal wirings 256 are connected to each other by the contact electrodes 255.

Thus, according to the sixteenth embodiment, the contact resistance defect monitoring device of the twelfth or thirteenth embodiment can be manufactured in a very short process TAT, as compared with the manufacturing process of a semiconductor integrated circuit device (including the formation of MOS transistors, the formation of contacts, the formation of multi-layer wirings, etc.). Specifically, the contact resistance defect monitoring device can be manufactured only with three photolithography steps, one in the step of patterning the first conductive film 253 to form the base patterns 253A, one in the step of patterning the interlayer insulating film 254 to form the contact holes, and another one in the step of patterning the third conductive film to form the upper-layer metal wirings 256. Thus, since the contact resistance defect monitoring device of the present invention can be manufactured in a very short process TAT, it is possible to quickly and easily assess a resistance variation defect (soft-open defect) in the contact, whereby it is possible to quickly assess the influence of the soft-open defect on the yield of the semiconductor integrated circuit device. Thus, the soft-open defect assessment results can be quickly and timely fed back to the process.

Note that while the semiconductor substrate 251 being a test wafer is used in the present embodiment, it is understood that the test wafer is not limited to a semiconductor substrate.

Moreover, while a refractory metal film is formed to fill the contact holes to form the contact electrodes 255 as the contacts in the present embodiment, the type of the contact is not limited to any particular type, and the contact electrodes 255 may be replaced by contact electrodes that are obtained by forming a metal film of copper, for example, to fill the contact holes. Moreover, the type of the base pattern 253A is not limited to any particular type, and the gate electrode wiring layer being a polysilicon layer or an amorphous silicon layer may be replaced by, for example, a source/drain impurity layer or a lower metal wiring layer made of aluminum, copper, or the like.

What is claimed is:

1. A resistance defect assessment device provided on a wafer for assessing a resistance variation defect in a component of an integrated circuit device, the resistance defect assessment device comprising test patterns capable of measuring a resistance variation component to be the resistance variation defect in each chip area or each shot area of the wafer, wherein the number of test patterns included in one chip area or one shot area is set so that it is possible to estimate a yield of the integrated circuit device taking soft-open defects into consideration.

2. A resistance defect assessment device provided on a wafer for assessing a resistance variation defect in a resistive element provided in a semiconductor integrated circuit device, the resistance defect assessment device comprising a resistance defect test pattern having such a length that a resistance variation component to be the resistance variation defect can be measured in each chip area or each shot area of the wafer, wherein the number of resistance defect test patterns included in one chip area or one shot area is in a range from $B/A \times 1/100$ to $B/A \times 10$, where A is the length of the resistance defect test pattern, and B is a total length of the resistive elements provided in the semiconductor integrated circuit device.

3. The resistance defect assessment device of claim 2, wherein the length A of the resistance defect test pattern is set so that a resistance variation component, which is a difference between a first resistance value of a resistance defect test pattern where there is a resistance variation defect at at least one position and a second resistance value of another resistance defect test pattern where there is no resistance variation defect, is 2% or more with respect to the second resistance value.

4. The resistance defect assessment device of claim 2, wherein the resistive element is a MOS transistor assembly, a bipolar transistor assembly, a pn-junction diode, a gate electrode wiring or a source/drain impurity layer of a MOS transistor, a metal wiring, a contact connecting an impurity layer with a wiring layer, or a via connecting wiring layers with each other.

5. A resistance defect assessment device provided on a wafer for assessing a resistance variation defect in a resistive element provided in a semiconductor integrated circuit device, the resistance defect assessment device comprising, in each of a plurality of blocks into which each chip area or each shot area of the wafer is divided, a resistance defect test pattern having such a length that a resistance variation component to be the resistance variation defect can be measured and a calibration pattern used for calibrating at least one of a dimension, a thickness and a resistivity of the resistance defect test pattern, which dictate a resistance value of the resistance defect test pattern, wherein the blocks are regularly arranged in the wafer surface and in each chip area or each shot area.

6. The resistance defect assessment device of claim 5, wherein the number of resistance defect test patterns included in one chip area or one shot area is in a range from $B/A \times 1/100$ to $B/A \times 10$, where A is the length of the resistance defect test pattern, and B is a total length of the resistive elements provided in the semiconductor integrated circuit device.

7. The resistance defect assessment device of claim 5, wherein probing pads are provided separately for the resistance defect test pattern and for the calibration pattern.

8. A resistance defect assessment device provided on a wafer for assessing a resistance variation defect in a resistive element made of a silicon-containing layer and a silicide layer formed on the silicon-containing layer, the resistive element being at least one of a gate electrode wiring and a source/drain impurity layer of a MOS transistor provided in a semiconductor integrated circuit device, the resistance defect assessment device comprising, in each of a plurality of blocks into which each chip area or each shot area of the wafer is divided, a resistance defect test pattern having such a length that a resistance variation component to be the resistance variation defect due to a line break in the silicide layer can be measured and being made of the silicon-containing layer and the silicide layer having the same width as that of the resistive element, and a first calibration pattern having the same length as that of the resistance defect test pattern and being made of the silicon-containing layer having the same width as that of the resistive element, wherein the blocks are regularly arranged in the wafer surface and in each chip area or each shot area.

9. The resistance defect assessment device of claim 8, wherein:

the length A of the resistance defect test pattern is set so that a resistance variation component, which is a difference between a first resistance value of a resistance defect test pattern where there is a resistance variation defect at at least one position and a second resistance value of another resistance defect test pattern where there is no resistance variation defect, is 2% or more with respect to the second resistance value; and the number of resistance defect test patterns included in one chip area or one shot area is in a range from $B/A \times 1/10$ to $B/A \times 10$, where B is a total length of the resistive elements provided in the semiconductor integrated circuit device.

10. A resistance defect assessment device provided on a wafer for assessing a resistance variation defect in a resistive element made of a silicon-containing layer and a silicide layer formed on the silicon-containing layer, the resistive element being at least one of a gate electrode wiring and a source/drain impurity layer of a MOS transistor provided in a semiconductor integrated circuit device, the resistance defect assessment device comprising, in each of a plurality of blocks into which each chip area or each shot area of the wafer is divided, a resistance defect test pattern having such a length that a resistance variation component to be the resistance variation defect due to a line break in the silicide layer can be measured and being made of the silicon-containing layer and the silicide layer having the same width as that of the resistive element, and a second calibration pattern having the same length as that of the resistance defect test pattern and being made of the silicon-containing layer having a width at least five times as large as that of the resistive element, wherein the blocks are regularly arranged in the wafer surface and in each chip area or each shot area.

11. A resistance defect assessment device provided on a wafer for assessing a resistance variation defect in a resistive element made of a silicon-containing layer and a silicide layer formed on the silicon-containing layer, the resistive element being at least one of a gate electrode wiring and a source/drain impurity layer of a MOS transistor provided in a semiconductor integrated circuit device, the resistance defect assessment device comprising, in each of a plurality of blocks into which each chip area or each shot area of the wafer is divided, a resistance defect test pattern having such a length that a resistance variation component to be the resistance variation defect due to a line break in the silicide layer can be measured and being made of the silicon-containing layer and the silicide layer having the same width as that of the resistive element, and a third calibration pattern having the same length as that of the resistance defect test pattern and being made of the silicon-containing layer and the silicide layer having a width at least five times as large as that of the resistive element, wherein the blocks are regularly arranged in the wafer surface and in each chip area or each shot area.

12. A resistance defect assessment device provided on a wafer for assessing a resistance variation defect in a resistive element made of a silicon-containing layer and a silicide layer formed on the silicon-containing layer, the resistive element being at least one of a gate electrode wiring and a source/drain impurity layer of a MOS transistor provided in a semiconductor integrated circuit device, the resistance defect assessment device comprising, in each of a plurality of blocks into which each chip area or each shot area of the wafer is divided, a resistance defect test pattern having such a length that a resistance variation component to be the resistance variation defect due to a line break in the silicide layer can be measured and being made of the silicon-containing layer and the silicide layer having the same width as that of the resistive element, a first calibration pattern having the same length as that of the resistance defect test pattern and being made of the silicon-containing layer having the same width as that of the resistive element, and a second calibration pattern having the same length as that of the resistance defect test pattern and being made of the silicon-containing layer having a width at least five times as large as that of the resistive element, wherein the blocks are regularly arranged in the wafer surface and in each chip area or each shot area.

13. The resistance defect assessment device of claim 12, further comprising, in each block, a plurality of additional resistance defect test patterns having the same length as that of the resistance defect test pattern and being made of the silicon-containing layer and the silicide layer having two or more widths different from that of the resistance defect test pattern, and a plurality of additional first calibration patterns having the same length as that of the first calibration pattern and being made of the silicon-containing layer having two or more widths different from that of the first calibration pattern.

14. The resistance defect assessment device of claim 12, further comprising, in each block, a third calibration pattern having the same length as that of the resistance defect test pattern and being made of the silicon-containing layer and the silicide layer having a width at least five times as large as that of the resistive element.

15. A resistance defect assessment device provided on a wafer for assessing a resistance variation defect in a resistive element made of a silicon-containing layer and a silicide layer formed on the silicon-containing layer, the resistive element being at least one of a gate electrode wiring and a source/drain impurity layer of a MOS transistor provided in a semiconductor integrated circuit device, the resistance defect assessment device comprising, in each of a plurality of blocks into which each chip area or each shot area of the wafer is divided, a resistance defect test pattern having such a length that a resistance variation component to be the resistance variation defect due to a line break in the silicide layer can be measured and being made of the silicon-containing layer and the silicide layer having the same width as that of the resistive element, a first calibration pattern having the same length as that of the resistance defect test pattern and being made of the silicon-containing layer having the same width as that of the resistive element, and a third calibration pattern having the same length as that of the resistance defect test pattern and being made of the silicon-containing layer and the silicide layer having a width at least five times as large as that of the resistive element, wherein the blocks are regularly arranged in the wafer surface and in each chip area or each shot area.

16. A contact defect assessment device provided on a wafer for assessing a resistance variation defect in a contact provided in a semiconductor integrated circuit device, the contact defect assessment device comprising a contact chain resistor pattern having such a number of contacts that a resistance variation component to be the resistance variation defect can be measured in each chip area or each shot area of the wafer, wherein the number of contact chain resistor patterns included in one chip area or one shot area is in a range from $N/n \times 1/10$ to $N/n \times 10$, where n is the number of contacts in one contact chain resistor pattern, and N is the total number of contacts provided in the semiconductor integrated circuit device.

17. The contact defect assessment device of claim 16, wherein:

the contact chain resistor pattern is provided in each of a plurality of blocks into which each chip area or each shot area of the wafer is divided;

a plurality of first calibration patterns are provided in the vicinity of the contact chain resistor pattern in each block for calibrating a resistance value of a base pattern, which dictates a resistance value of the contact chain resistor pattern, the plurality of first calibration patterns having different inter-contact pattern lengths L1, L2 and L3, L1 being substantially equal to an inter-contact pattern length L of a pattern to be assessed, L2 being greater than L1, and L3 being greater than L2; and the blocks are regularly arranged in the wafer surface and in each chip area or each shot area.

18. The contact defect assessment device of claim 16, wherein:
the contact chain resistor pattern is provided in each of a plurality of blocks into which each chip area or each shot area of the wafer is divided;
a plurality of second calibration patterns are provided in the vicinity of the contact chain resistor pattern in each block, the plurality of second calibration patterns having different contact diameters d1, d2 and d3, d1 being smaller than a contact diameter d of a pattern to be assessed, d2 being substantially equal to d, and d3 being larger than d3; and
the blocks are regularly arranged in the wafer surface and in each chip area or each shot area.

19. The contact defect assessment device of claim 16, wherein the contact count n of the contact chain resistor pattern is set so that a resistance variation component, which is a difference between a first resistance value of a contact chain resistor pattern where there is a resistance variation defect at at least one position and a second resistance value of another contact chain resistor pattern where there is no resistance variation defect, is 1% or more with respect to the first resistance value.

20. The contact defect assessment device of claim 16, wherein the contact is a contact electrode obtained by forming a refractory metal film or a metal film to fill a contact hole.

21. The contact defect assessment device of claim 16, wherein a base pattern of the contact is a gate electrode wiring layer, a source/drain impurity layer or a lower metal wiring layer.

* * * * *